(12) United States Patent
Araki et al.

(10) Patent No.: US 12,156,483 B2
(45) Date of Patent: *Nov. 26, 2024

(54) OXIDE SUPERCONDUCTOR AND METHOD FOR MANUFACTURING SAME

(71) Applicant: KABUSHIKI KAISHA TOSHIBA, Tokyo (JP)

(72) Inventors: Takeshi Araki, Koto Tokyo (JP); Mariko Hayashi, Shinagawa Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 939 days.

This patent is subject to a terminal disclaimer.

(21) Appl. No.: 17/191,599

(22) Filed: Mar. 3, 2021

(65) Prior Publication Data
US 2022/0085269 A1  Mar. 17, 2022

(30) Foreign Application Priority Data

Sep. 15, 2020 (JP) .................. 2020-154920

(51) Int. Cl.
*H10N 60/85* (2023.01)
*C04B 35/45* (2006.01)
(Continued)

(52) U.S. Cl.
CPC ....... *H10N 60/855* (2023.02); *C04B 35/4504* (2013.01); *C04B 35/62222* (2013.01);
(Continued)

(58) Field of Classification Search
CPC .... H10N 60/855; H10N 60/01; H10N 60/858; C04B 35/4504; C04B 35/62222; H01F 6/06
See application file for complete search history.

(56) References Cited

U.S. PATENT DOCUMENTS 10,541,073 B2 * 1/2020 Araki .................. H01F 6/06
11,417,820 B2 * 8/2022 Araki .................. H10N 60/0324
(Continued)

FOREIGN PATENT DOCUMENTS

JP H4-192381 A 7/1992
JP H4-357889 A 12/1992
(Continued)

OTHER PUBLICATIONS

T. Araki, et al., "Review of a chemical approach to YBa2Cu3O7-x-coated superconductors-metalorganic deposition using trifluorocetates," Superconductor Science and Technology, vol. 16, pp. R71-R94 (2003).

(Continued)

*Primary Examiner* — Paul A Wartalowicz
(74) *Attorney, Agent, or Firm* — Finnegan, Henderson, Farabow, Garrett & Dunner, LLP

(57) ABSTRACT

An oxide superconductor of an embodiment includes an oxide superconducting layer including at least one superconducting region containing barium (Ba), copper (Cu) and a first rare earth element, having a continuous perovskite structure, and having a size of 100 nm×100 nm×100 nm or more, and a non-superconducting region in contact with the at least one superconducting region, containing praseodymium (Pr), barium (Ba), copper (Cu), and a second rare earth element, having a ratio of a number of atoms of the praseodymium (Pr) to a sum of a number of atoms of the second rare earth element and the number of atoms of the praseodymium (Pr) being 20% or more, having a continuous perovskite structure continuous with the continuous perovskite structure of the superconducting region, and having a size of 100 nm×100 nm×100 nm or more.

9 Claims, 23 Drawing Sheets

(51) Int. Cl.
  *C04B 35/622* (2006.01)
  *C04B 35/624* (2006.01)
  *C04B 35/64* (2006.01)
  *H10N 60/01* (2023.01)

(52) U.S. Cl.
  CPC ............ *C04B 35/624* (2013.01); *C04B 35/64* (2013.01); *H10N 60/01* (2023.02); *C04B 2235/3282* (2013.01); *C04B 2235/656* (2013.01); *C04B 2235/661* (2013.01); *C04B 2235/768* (2013.01); *C04B 2235/85* (2013.01)

(56) References Cited

U.S. PATENT DOCUMENTS

| | | |
|---|---|---|
| 2006/0040829 A1 | 2/2006 | Rupich et al. |
| 2007/0145100 A1 | 6/2007 | Suzuki et al. |
| 2011/0319271 A1 | 12/2011 | Selvamanickam et al. |
| 2016/0359097 A1 | 12/2016 | Kurihara |
| 2017/0309805 A1 | 10/2017 | Araki et al. |
| 2018/0061537 A1 | 3/2018 | Araki et al. |
| 2018/0061541 A1 | 3/2018 | Araki et al. |
| 2018/0197659 A1 | 7/2018 | Hayashi et al. |
| 2022/0085270 A1* | 3/2022 | Araki .................. H10N 60/858 |

FOREIGN PATENT DOCUMENTS

| | | |
|---|---|---|
| JP | H10-316421 A | 12/1998 |
| JP | 4777749 B2 | 9/2011 |
| JP | 2018-41715 A | 3/2018 |
| JP | 6374365 B2 | 8/2018 |
| JP | 6479251 B2 | 3/2019 |
| JP | 6556769 B2 | 8/2019 |

OTHER PUBLICATIONS

M. Hayashi, et al., "Atom-replaced pins in a Y-based superconductor single-crystalline perovskite structure including both PrBa2Cu3O7-x and YBa2Cu3O7-y," Superconductor Science and Technology, vol. 31, No. 5, 055013, 7 pages (2018).

T. Araki, et al., "Clustered atom-replaced structure in single-crystal-like metal oxide," Superconductor Science and Technology, vol. 31, No. 6, 065008, 9 pages (2018).

* cited by examiner

FIG.13A

2F-Pr$_{0.00}$Y$_{1.00}$BCO-1

| | | | | |
|---|---|---|---|---|
| -.-- | -.-- | -.-- | -.-- | -.-- |
| -.-- | 6.66 | 6.67 | 6.57 | -.-- |
| -.-- | -.-- | 6.46 | 6.29 | -.-- |
| -.-- | -.-- | -.-- | -.-- | -.-- |
| -.-- | -.-- | -.-- | -.-- | -.-- |

FIG.13B

2F-Pr$_{0.00}$Y$_{1.00}$BCO-2

| | | | | |
|---|---|---|---|---|
| -.-- | -.-- | -.-- | -.-- | -.-- |
| -.-- | 6.43 | 6.65 | 6.55 | -.-- |
| -.-- | 6.62 | 6.85 | 6.64 | -.-- |
| -.-- | 6.46 | -.-- | -.-- | -.-- |
| -.-- | -.-- | -.-- | -.-- | -.-- |

FIG.14A $2F-Pr_{0.22}Y_{0.78}BCO-3$

FIG.14B $2F-Pr_{0.22}Y_{0.78}BCO-4$

| | | | | |
|---|---|---|---|---|
| -.-- | -.-- | -.-- | -.-- | -.-- |
| -.-- | -.-- | -.-- | -.-- | -.-- |
| -.-- | -.-- | -.-- | -.-- | -.-- |
| -.-- | -.-- | -.-- | -.-- | -.-- |
| -.-- | -.-- | -.-- | -.-- | -.-- |
| -.-- | -.-- | -.-- | -.-- | -.-- |
| -.-- | -.-- | -.-- | -.-- | -.-- |
| -.-- | -.-- | -.-- | 5.64 | -.-- |
| -.-- | -.-- | 6.54 | 6.72 | -.-- |
| -.-- | -.-- | 5.60 | 5.74 | -.-- |
| -.-- | -.-- | 5.17 | 5.39 | -.-- |
| -.-- | -.-- | 4.86 | 5.07 | -.-- |
| -.-- | -.-- | -.-- | -.-- | -.-- |
| -.-- | -.-- | -.-- | -.-- | -.-- |

NON-SUPERCONDUCTING REGION

BOUNDARY REGION

SUPERCONDUCTING REGION

OXIDE SUPERCONDUCTOR AND METHOD FOR MANUFACTURING SAME

CROSS-REFERENCE TO RELATED APPLICATION

This application is based upon and claims the benefit of priority from Japanese Patent Application No. 2020-154920, filed on Sep. 15, 2020, the entire contents of which are incorporated herein by reference.

FIELD

Embodiments described herein relate generally to an oxide superconductor and a method for manufacturing the same.

BACKGROUND

Superconductivity is a phenomenon in which a resistance value becomes completely zero, which is discovered by using mercury by Kamerring Onnes of the Netherlands who developed a refrigerator. Thereafter, according to the Bardeen Cooper Schrieffer (BCS) theory, an upper limit of a superconducting transition temperature (Tc) is set to 39 K, which is Tc of a first-class superconductor, and is around 39 K at normal pressure.

A copper-based oxide superconductor discovered by Bednorz et al. In 1986 showed results exceeding 39 K, leading to the development of an oxide superconductor that can be used at liquid nitrogen temperature. The oxide superconductor is a second-class superconductor in which superconducting and non-superconducting states are mixed. Today, many high-temperature oxide superconductors that can be used at the liquid nitrogen temperature are sold in a lot having a length of 500 m or more. A superconducting wire is expected to be applied to various large-scale equipment such as a superconducting power transmission cable, a nuclear fusion reactor, a magnetically levitated train, an accelerator, and magnetic resonance imaging (MRI).

Until now, for superconducting applications, a direct current has mainly been applied, and in the superconducting power transmission cable, the magnetically levitated train, a motor, and the like, the current on the superconducting wire side has mainly been applied without changing. For example, in the magnetically levitated train, a normal magnet is used on a ground coil side, and a superconducting magnet generating a strong magnetic field is mounted on a vehicle, and it is possible to operate the magnetically levitated train by controlling the magnetism of the ground coil. The application of superconducting technology, which can move a car body of several tens of tons at a speed of about 600 km/h, is a partial application of characteristics of superconductivity.

On the other hand, in recent years, applications have been studied in which as magnets of both a stator and rotor of a motor, superconducting magnets are employed to generate a tremendous force. One of the applications is a superconducting aircraft, and the superconducting aircraft is trying to make both the stator and rotor of the motor superconducting to use a tremendous force that is incomparable to the application of the magnetically levitated trains. For example, the superconducting aircraft operates by buoyancy in an airflow generated by operating a propulsion device having a diameter of 2 m 7,000 times per minute. It is estimated that a fuel efficiency of the superconducting aircraft will be 70% of the conventional fuel efficiency, and thus the superconducting aircraft has been attracting attention at the international conference in Europe held in 2019.

In order to realize the application to the superconducting aircraft, it is necessary to fluctuate a magnetic field of at least one superconducting coil. That is, an alternating current (AC) inverting a current is used, or a magnetic field is changed by fluctuating a current value without inverting a current and thus a propulsion force is generated by the changed attractive force. When the magnetic field is changed over time by the fluctuation of the current value, a loss of an inductance component is caused. In the conventional superconducting applications, since a superconducting coil is used only on one side and a current value is constant, an energy loss of the inductance component is almost zero.

In the following description, an application in which the current is changed without being inverted and the inductance component becomes a problem is also referred to as an AC application. The loss caused by fluctuating the current value is often referred to as AC loss in the field of superconductivity. In the AC application of the superconductivity, a mechanism for reducing an energy loss due to the inductance component is required.

It is known to reduce the AC loss by dividing the superconducting wire and making the superconducting wire into thin wires. Generally, it is said that the AC loss becomes about 1/n when a superconducting current is divided into n in a direction parallel to a current direction of the superconductor whose film thickness is almost uniform. For example, if a generally used 4 mm wide wire is divided into eight and one wire is 0.5 mm wide, the AC loss becomes ⅛. However, the division requires a non-superconducting region in which the current does not conduct. For example, if a non-superconducting region is provided with a width of 0.1 mm out of a width of 0.5 mm divided into eight, the superconducting current will flow only in a width of 0.4 mm, and thus, the current value is set to be 80% of an initial value.

Even if the current value is 80%, when the AC loss is ⅛, there is an effect of 8 times, so the overall effect is expected to be 6.4 times. Therefore, technologies for reducing the AC loss by making the superconducting wire into thin wires have been actively carried out since around 2000. For example, there is a manufacturing technology for patterning and thinning a superconducting layer by a laser scribing technology. Reducing the AC loss by thinning the wires is also an essential technology for high-power applications that use superconductors on both sides of the superconducting coil. Currently, a typical example of a method in which the superconducting wire is manufactured as a high-temperature Y-based wire and has been successful in large-scale equipment includes a TFA-MOD method. Even in the survey of various research companies, top sales are maintained for a long period of time, and there are various achievements in stable wires and their application coils. However, this method has a weakness, and it is difficult to form an artificial pin that can improve magnetic field characteristics. Therefore, in a region where the magnetic field of 1 to 2 T or less is small, it boasts an overwhelming market share and achievements with its stability as a weapon, but in applications in the magnetic field, a vacuum physical vapor deposition method, which facilitates the formation of the artificial pin, is leading in terms of wire trial production.

There are various methods for the vacuum physical vapor deposition method, but the typical methods are considered to be a MOCVD method and a PLD method. The MOCVD method is the first successful method for manufacturing long wires or forming artificial fins, and the first report of a 1000 m long wire is made in 2007. The MOCVD method has been at the forefront in the achievements of the long wire. However, since the stable production is difficult, and the success rate of 500 m long wires is low and the price is high.

Regarding mass production achievements, the TFA-MOD method has no problem in mass production of 500 m long wires. Mass production of a 500 m lot has been realized since 2009. More than 6000 lots are shipped in 2014, and a stable operation of applied products has been realized.

It is considered that the superconducting wire produced by the PLD method, which is another vacuum physical vapor deposition method described above, can be manufactured more stably than the MOCVD method. However, there is no report that a 500 m wire is produced with a yield of 90% or more, and improvement in non-uniformity, which is an issue of the vacuum physical vapor deposition method, is still considered to be a major development issue.

In order to reduce the AC loss of the obtained wire and perform high power applications, the above-mentioned thinning technology is required. First, the thinning technology that can be used for each manufacturing method will be described. The technology is a laser scribing technology that partially ablates a superconductor using a laser, that is, blows away to eliminate substances, which is the current mainstream. This laser scribing technology can be applied to superconductors manufactured by the MOCVD method, the PLD method, or the TFA-MOD method regardless of the superconductor manufacturing method.

This laser scribing technology is the most actively researched AC loss reduction technology at the present time when considering the number of presentations at the conferences, and the like. The laser scribing technology is considered to be the longest researched technology for reducing the AC loss, including the history of the past. However, the laser scribing technology has many problems.

For example, in the application example of the laser scribing technology to a YBCO superconductor formed by the DID method, the formed void region has a width of about 20 μm, and there is a region in which 40 μm superconductors are non-superconductors on both sides thereof. A total of 100 μm non-superconducting region is formed. It is unknown whether the YBCO superconductor becomes non-superconducting while the perovskite structure being maintained in the adjacent 40 μm wide non-superconductor due to the change in the number of oxygen, or whether the YBCO superconductor is decomposed into another substance and becomes non-superconducting.

When the superconductor changes to another substance, problems such as peeling due to a difference in a coefficient of thermal expansion occur. In the laser scribing method, a width of 20 μm where no substance is present is a region where YBCO itself or substances decomposed into pieces are scattered. Decomposition products such as CuO and $Y_2O_3$ are likely to be present in the vicinity of a 20 μm void to which high energy is applied.

When the decomposition products such as CuO and $Y_2O_3$ are present in the non-superconducting region having a width of 40 μm, the coefficient of thermal expansion of CuO and $Y_2O_3$ is different from that of YBCO. For this reason, the $CeO_2$ and decomposition products, which are the intermediate layers, are likely to peel off due to stress caused by the difference in the coefficient of thermal expansion at cooling from room temperature to extremely low temperature which is a superconducting state or temperature rising during periodic inspections. This is the first problem.

The decomposition products, which may be present in innumerable ablated neighborhoods, are likely to form a starting point of peeling each time the decomposition products are cooled. It seems to be an astronomically small probability to completely eliminate the decomposition products and form the non-superconducting region only with the perovskite structure in which the number of oxygen is changed, which is almost impossible. In the laser scribing method, the formation of the peeled portion and the stretching of the peeled portion are always considered to be problems.

Regarding the ablation of the superconducting layer by the laser scribing technology, there is a concern about the influence on an oxide intermediate layer including several layers formed under the superconducting layer. In most cases, the IRA-MOD method uses a $CeO_2$ layer on an outermost surface of the intermediate layer, and the intermediate layer of 3 layers of $CeO_2$, YSZ, and $Y_2O_3$ layers is lined to a metal substrate.

When the surroundings are heated in a short time by the laser scribing technology, there is a time lag in heating with a layer under the superconducting layer, and a difference in thermal expansion facilitates the occurrence of peeling of the intermediate layer of 3 to 5 layers directly below or a bonded portion with the underlying layer. Heat is also transferred to 40 μm regions on both sides, and there is a possibility that the $CeO_2$ intermediate layer and the YBCO superconducting layer are separate from each other. If the peeling is expanded in a single heat cycle, the peeled region tends to expand in the subsequent heat cycles, which leads to quenching or shortening of the life. This is the second problem. In an IBAD substrate used in the MOCVD method or the RID method, there are five intermediate layers, in which two layers from the bottom are amorphous layers, and therefore, it seems that there is a greater possibility of peeling.

The third problem is an alteration of an underlying metal layer. In the formation of the $CeO_2$ intermediate layer on a metal tape, in order to suppress the metal tape from being deformed, it has been reported that the film is often formed at 800° C. or lower and the film is formed on Hastelloy-C at 650° C. or 700° C. A RABiTS alignment substrate made of Ni—W is provided with an alignment layer by repeatedly rolling and annealing an upper portion of the RABiTS alignment substrate, but when the alignment layer collapses due to heating at a temperature equivalent to 1700° C. at which superconducting oxides can be ablated, or stress is generated due to the difference in thermal expansion, the peeling from the upper oxide layer becomes a problem.

In the case of the TFA-MOD method, the intermediate layer is $CeO_2/YSZ/Y_2O_3$, but the peeling is likely to occur at any interface due to overheating for a short time. There are as many as 5 intermediate layers in the MOCVD method. In addition, the lower two layers are amorphous, and therefore have weak bonds, so there is a concern that the peeling occurs more easily. There is a possibility that the laser scribing technology also causes problems in the intermediate layer and the alignment layer of the underlying metal.

The structure formed by the laser scribing also has a problem. The fourth problem is that a substance called debris is deposited on the upper portion around the ablation portion by the laser scribing. In order to minimize the effect of the AC loss reduction technology by thinning the wire by the laser scribing, it is preferable to achieve the ablation with the minimum energy. However, this means that the ablated substances do not have enough energy to scatter, and a part of the substances is deposited on the upper portion of the surrounding superconducting layer and the unevenness is expanded.

It has been reported that when the wire by the PLD is thinned by the laser scribing technology, the deposition of the substances called debris reaches the same level as an average film thickness of the superconductor. On the other hand, in the portion where the YBCO is lost by the ablation, when a protrusion of debris is 1 times the film thickness because the film thickness of the superconductor is zero, the total unevenness difference will reach twice the film thickness.

A protective layer such as silver or copper is formed on the superconducting portion having a large step to form a wire, but when the protective layer is coiled, the stress becomes large and thus the protective layer is tends to be physically damaged. Moreover, the weak stress of the peripheral portion that has already been ablated in the first to third problems also works negatively.

Regarding the above-mentioned unevenness, the protrusion of the debris will be discussed as the fourth problem, and a recess of the ablation will be discussed as the fifth problem. However, the laser scribing technology is the most researched technology for reducing the AC loss. If there were other better methods, it is believed that the spread of this research will not be done. Therefore, it is considered that the laser scribing technology is the best technology among the AC loss reduction technologies that has been performed to data.

The superconductor is the thinned superconductor formed by the laser scribing technology, but has a weakness that tends to be physically damaged. For example, if a non-superconducting region of 100 μm is formed every 500 μm, the superconductor has a width of about 400 μm and is not reinforced. The sixth problem is that the superconductor tends to be physically damaged.

On the other hand, there is also an AC loss reduction technology unique to the manufacturing method. It is very difficult to form the thinned superconductor by peeling the superconductor off using a mask or the like by the MOCVD method or the PLD method, but the TEA-MOD method is one of chemical solution methods, and a thin structure can be formed by an inkjet printer technology. The report has been mainly made to European conferences. This is a method for forming a superconductor by forming dots that can be formed by an inkjet printer, forming a film only where the superconductor is needed, and then calcining and firing the film A space between parts deposited with the ink becomes void and becomes an insulating layer.

The inkjet printing method also has no reports of good results There is no report at least at the international conference in Europe in 2019 that the AC loss could be reduced by forming the wire by the inkjet printing method to make the coil One of the causes seems to be a short circuit between the dots arranged, but it seems that the uneven formation of unit cells during the firing is also one of the problems.

The TFA-MOD method forms a quasi-liquid phase network model, and it is known that the unit cells are formed by dissipation of hydrogen fluoride gas from a liquid phase surface. When the dots are formed by the inkjet printer or the like, gas is easily released to a lateral portion of the dots, a large number of unit cells are formed, and a central portion indicates that the unit cell formation is delayed. In such a situation, the superconducting unit cell grows sideways, a large number of a/b-axis oriented particles that obstruct a superconducting current are formed, and the superconducting characteristics deteriorate because the current is not conducted in a desired direction.

On the other hand, even if a good superconductor including voids is formed by the inkjet printer, a recess remains in the superconducting layer, and therefore, the fifth problem cannot be solved. Also, if the width of the dot is made narrower, the superconductor tends to be damaged, and therefore, the sixth problem cannot be solved. In addition, the effect on the $CeO_2$ intermediate layer exposed to the humidifying gas during the firing is also considered.

As mentioned above, there are six problems with the laser scribing technology, which is a comparative technology. The first problem is that the heat during the laser ablation causes the intermediate layer such as $CeO_2$ and the YBCO layer on the intermediate layer to peel off. Some researchers speculate that the heat during the ablation is equivalent to 1700° C., but since the YBCO layer breaks up into pieces by the ablation and receives scattered energy, a great effect is likely to occur even if the heat does not reach 1700° C. Since the YBCO layer is partially heated, it seems that the effect is more likely to occur.

The second problem is that a non-perovskite structure is formed around the void part by the scribing. The decomposition products of the YBCO have the coefficient of thermal expansion different from that of the YBCO, and when the cooling to an extremely low temperature at which the superconducting current is expressed and the temperature rising is repeated, the possibility that cracks grows due to the difference in the coefficient of thermal expansion to lead to quench burnout is increased.

The third problem is the problem that the intermediate layer is peeled off due to the heat conduction to the underlying metal layer. The stress occurs in the intermediate layer having multiple layers, including the $CeO_2$ intermediate layer, by the difference in coefficient of thermal expansion due to the high heat during the ablation, and the propagation of the stress may cause peeling between the superconductor and the intermediate layer. It is considered that the difference between the underlayer, which is the metal, easily transfers heat, and the intermediate layer, which does not easily transfer heat, also contributes to the cause of the peeling.

The fourth problem is the problem of debris, which is dust on the superconducting layer around the ablation portion. It is considered that the protective layer is formed on the debris, but even if the protective layer is formed, the step remains, and the protective layer becomes easy to crack when coiled. Moreover, in the laser scribing method, the deposited film thickness of debris around the ablation portion may be larger than that of the superconducting layer.

The fifth problem is the step between the ablated portion and the super conducting layer. In addition, the intermediate layer is exposed by the ablation, and the exposed portion may affect the intermediate layer, which may be a cause of the crack formation.

The sixth problem is that the width of the superconducting wire formed by the laser scribing method is as narrow as a width of about 400 μm, and the superconductor tends to be damaged when coiled. If the width is expanded, cracks can be prevented, but if the width is expanded, the effect of reducing the AC loss is lost. There is a problem that should be solved by the laser scribing method, but is difficult to solve.

Apart from the above, although no successful cases have been reported yet, the above-mentioned fourth and sixth problems exist even in the attempt to combine the TFA-MOD method and the inkjet printer technology.

In the technology of the comparative example, there is a problem that the mechanical strength of the superconducting layer is lowered due to the pattern processing of the superconducting layer or the pattern with the step of the superconducting layer. Therefore, the technology capable of realizing the superconducting layer Pattern having high mechanical strength is required.

BRIEF DESCRIPTION OF THE DRAWINGS

FIGS. 13A and 13B are diagrams illustrating measurement results of superconducting characteristics on maps of oxide thin films 2F-$Pr_{0.00}Y_{1.00}BCO$-1 and 2F-$Pr_{0.00}Y_{1.00}BCO$-2 of Example 2;

FIGS. 14A and 14B are diagrams illustrating measurement results of superconducting characteristics on maps of oxide thin films 2F-$Pr_{0.22}Y_{0.78}BCO$-3 and 2F-$Pr_{0.22}Y_{0.78}BCO$-4 of Example 2;

DETAILED DESCRIPTION

Figure 1:
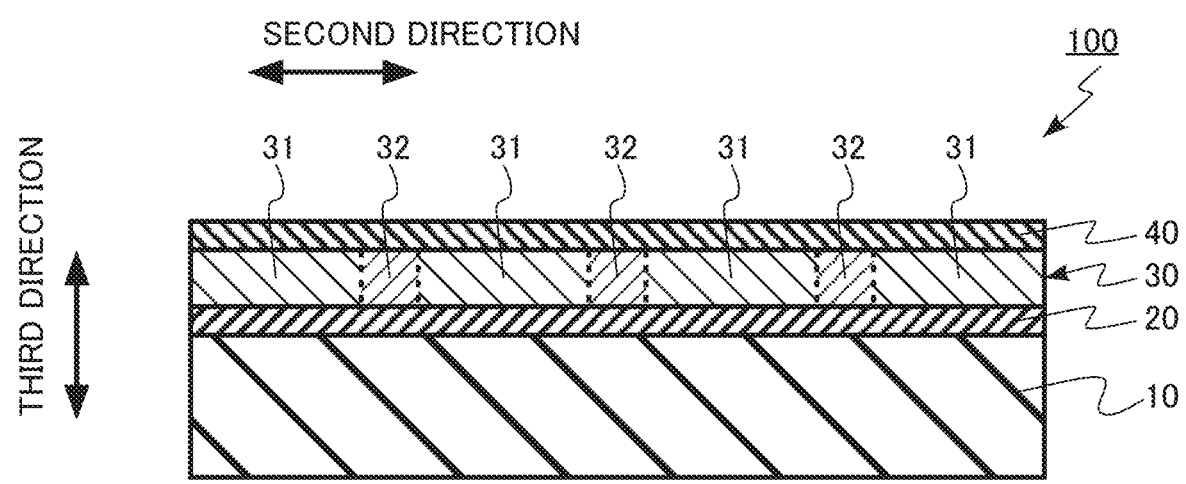
FIG. 1 is a schematic cross-sectional view of an oxide superconductor of a first embodiment.

An oxide superconductor of an embodiment includes an oxide superconducting layer including at least one superconducting region containing barium (Ba), copper (Cu), and at least one first rare earth element selected from the group consisting of yttrium (Y), lantern (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), the at least one superconducting region having a continuous perovskite structure, and the at least one superconducting region having a size of 100 nm×100 nm×100 nm or more, and a non-superconducting region in contact with the at least one superconducting region, the non-superconducting region containing praseodymium (Pr), barium (Ba), copper (Cu), and at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), a ratio of a number of atoms of the praseodymium (Pr) to a sum of a number of atoms of the at least one second rare earth element and the number of atoms of the praseodymium (Pr) in the non-superconducting region being equal to or more than 20%, the non-superconducting region having a continuous perovskite structure continuous with the continuous perovskite structure of the at least one superconducting region, and the non-superconducting region having a size of 100 nm×100 nm×100 nm or more.

In the present specification, the continuous perovskite structure is regarded as "single crystal" or being crystallographically continuous. In addition, a crystal containing a certain low tilt angle grain boundary is regarded as having a continuous perovskite structure. The certain low tilt angle grain boundary may have difference in a c-axis direction on the single crystal 1.0° or less. And, the certain low tilt angle grain boundary may have difference in a c-axis obtained by adding delta φ of an alignment layer of a metal substrate to 1.0° in the case of film formation on a metal substrate. The crystal containing the low tilt angle grain boundary whose difference in the c-axis direction on the single crystal is 1.0° or less, and which is equal to or less than the difference obtained by adding the delta φ of the alignment layer of the metal substrate to 1.0° in the case of the film formation on the metal substrate is also regarded as having "single crystal" or being crystallographically continuous.

In the "single crystal" defined above, Tc hardly decreases, and is considered that a value within 0.3 K of an original value can be obtained. Therefore, in the Tc measurement, if the Tc value is within 0.3 K of a theoretical value, the crystal can be regarded as the "single crystal" or being crystallographically continuous.

Further, in the present specification, a structure in which a superconducting region which is the "single crystal" and in which a superconducting current can be obtained when cooled to liquid nitrogen and a non-superconducting region having a perovskite structure in which a superconducting current cannot be obtained coexist is referred to as a "superconductor". This structure is called a "superconductor" because a superconducting current can be conducted as a whole even if the non-superconducting region is partially formed.

A qualitative analysis and quantitative analysis of a chemical composition of members constituting the oxide superconductor in the present specification can be performed by, for example, secondary ion mass spectroscopy (SIMS). Further, for measuring a width of the members constituting the oxide superconductor, a thickness of the members, a distance between the members, and the like, and identifying the continuity of the crystal structure, for example, a transmission electron microscope (TEM) can be used. Further, for identification of constituent substances of the members constituting the oxide superconductor and identification of an orientation of a crystal axis, for example, X-ray diffraction (XRD) can be used.

Hereinafter, the oxide superconductor of the embodiment will be described with reference to the drawings.

An oxide superconductor of a first embodiment includes an oxide superconducting layer including at least one superconducting region containing barium (Ba), copper (Cu), and at least one first rare earth element selected from the group consisting of yttrium (Y), lantern (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), the at least one superconducting region having a continuous perovskite structure, and the at least one superconducting region having a size of 100 nm×100 nm×100 nm or more, and a non-superconducting region in contact with the at least one superconducting region, the non-superconducting region containing praseodymium (Pr), barium (Ba), copper (Cu), and at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), a ratio of a number of atoms of the praseodymium (Pr) to a sum of a number of atoms of the second rare earth element and the number of atoms of the praseodymium (Pr) in the non-superconducting region being equal to or more than 20%, the non-superconducting region having a continuous perovskite structure continuous with the continuous perovskite structure of the at least one superconducting region, and the non-superconducting region having a size of 100 nm×100 nm×100 nm or more.

Figure 2:
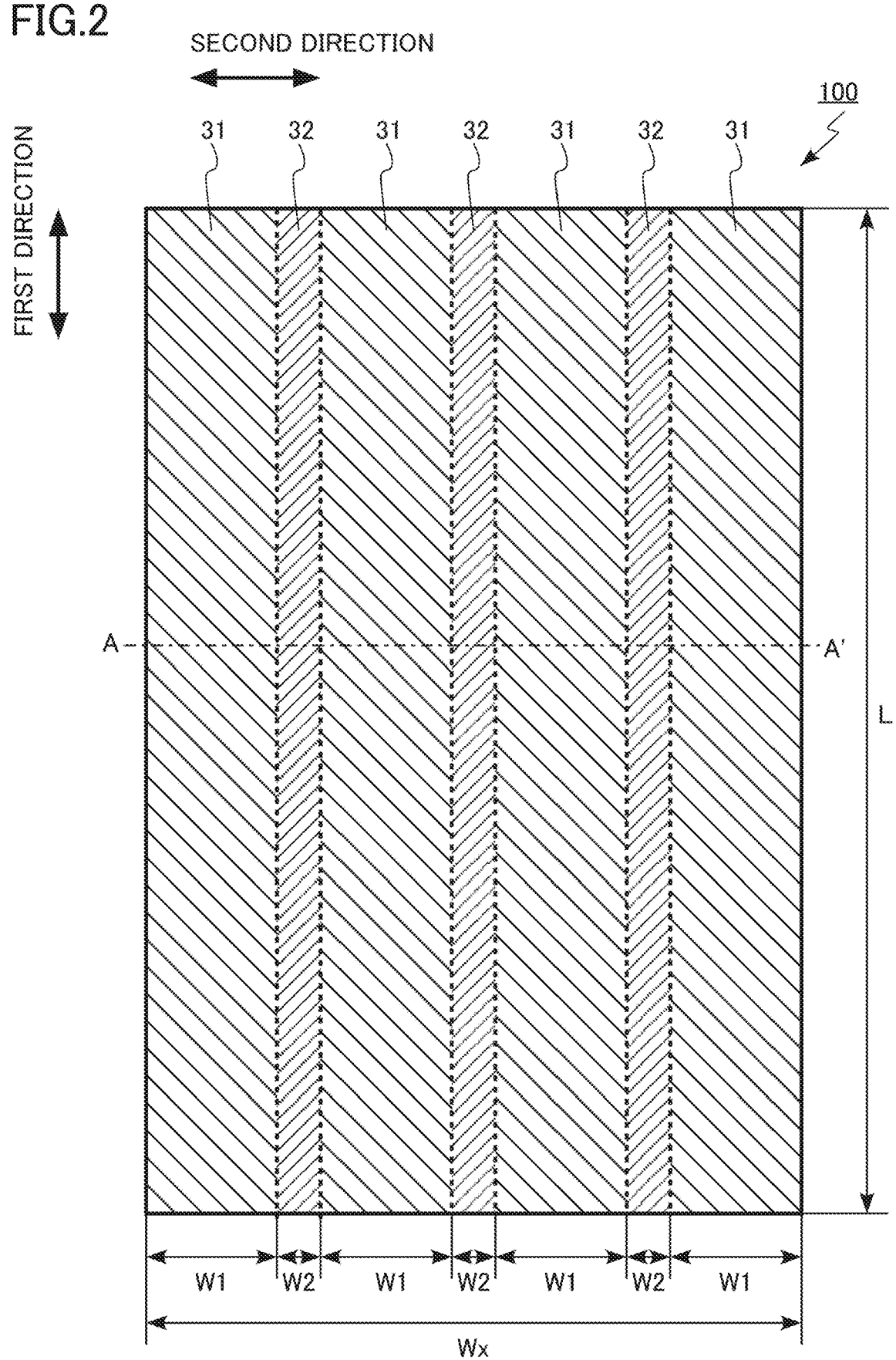
FIG. 2 is a schematic top view of the oxide superconductor of the first embodiment.

FIG. 1 is a schematic cross-sectional view of an oxide superconductor of a first embodiment. FIG. 2 is a schematic top view of the oxide superconductor of the first embodiment. FIG. 2 is a top view of the state in which a metal layer of FIG. 1 is removed. FIG. 1 is a cross-sectional view taken along the line A-A' of FIG. 2.

The oxide superconductor of the first embodiment is a superconducting wire 100.

As illustrated in FIG. 1, the superconducting wire 100 includes a substrate 10, an intermediate layer 20, an oxide superconducting layer 30, and a metal layer 40. The substrate 10 increases a mechanical strength of the oxide superconducting layer 30. The intermediate layer 20 is a so-called alignment intermediate layer. The intermediate layer 20 is provided to align the oxide superconducting layer 30 to form a single crystal when the oxide superconducting layer 30 is formed. The metal layer 40 is a so-called stabilizing layer. The metal layer 40 protects the oxide superconducting layer 30. In addition, the metal layer 40 has a function of bypassing and stabilizing the current even when the superconducting state becomes partially unstable during the actual use of the superconducting wire 100.

The substrate 10 is a metal such as a nickel-tungsten alloy. In addition, the intermediate layer 20 is, for example, yttrium oxide ($Y_2O_3$), yttria-stabilized zirconia (YSZ), and cerium oxide ($CeO_2$) from the substrate 10 side. A layer structure of the substrate 10 and the intermediate layer 20 is, for example, nickel-tungsten alloy/yttrium oxide/yttria-stabilized zirconia/cerium oxide. In this case, the oxide superconducting layer 30 is formed on the cerium oxide.

The substrate 10 may be, for example, a single crystal layer lattice-matched with the oxide superconducting layer 30. The single crystal layer is, for example, lanthanum aluminate ($LaAlO_3$, hereinafter also referred to as LAO). When applying the lanthanum aluminate to the substrate 10, the intermediate layer 20 can be omitted.

Further, as the substrate 10 and the intermediate layer 20, for example, an ion beam assisted deposition (IBAD) substrate can be used. In the case of the IBAD substrate, the substrate 10 is a non-alignment layer. Further, the intermediate layer 20 has, for example, a five-layer structure. For example, two layers from the bottom are a non-alignment layer, and an alignment origin layer produced by the IBAD method is formed on the non-alignment layer, and two metal oxide alignment layers are formed on the alignment origin layer. In this case, the top alignment layer is lattice-matched with the oxide superconducting layer 30. The lattice match generally indicates a lattice mismatch within 7%. It is preferably smaller than 3% in order to improve the superconducting characteristics.

In the metal layer 40, for example, silver (Ag) or copper (Cu) as a metal of a base material is used. The metal layer 40 is, for example, an alloy. The metal layer 40 may contain a small amount of a precious metal such as gold (Au). For example, 1 μm of silver (Ag) and 20 μm of copper (Cu) are formed on the metal layer 40 from the oxide superconducting layer 30 side.

The oxide superconducting layer 30 is provided between the substrate 10 and the metal layer 40. The oxide superconducting layer 30 is provided between the intermediate layer 20 and the metal layer 40. The oxide superconducting layer 30 is provided on the intermediate layer 20 in contact with the intermediate layer 20.

The oxide superconducting layer 30 may include a plurality of superconducting regions 31 and a plurality of non-superconducting regions 32. The superconducting region 31 and the non-superconducting region 32 extend in a first direction.

The non-superconducting region 32 is provided between the superconducting region 31 and the superconducting region 31. The non-superconducting region 32 is in contact with both sides of the superconducting region 31 provided on both sides of the non-superconducting region 32. One of the superconducting regions 31 provided on both sides of the non-superconducting region 32 is an example of the first superconducting region. In addition, the other is an example of the second superconducting region.

A direction perpendicular to the first direction and from the non-superconducting region 32 to the superconducting region 31 is a second direction. A direction perpendicular to the first direction and the second direction is a third direction. The first direction and the second direction are parallel to a surface of the substrate 10. In addition, the third direction is perpendicular to the surface of the substrate 10.

The oxide superconducting layer 30 is divided into a plurality of superconducting regions 31 with a non-superconducting region 32 therebetween. In the case of FIGS. 1 and 2, the oxide superconducting layer 30 is divided into four superconducting regions 31. The oxide superconducting layer 30 may be divided into, for example, five or more regions.

The superconducting region 31 has superconducting characteristics. The superconducting region 32 does not have the superconducting characteristics. The non-superconducting region 32 electrically separates the superconducting regions 31. The non-superconducting region 32 functions as an insulator when a current flows into the superconducting wire 100.

The superconducting region 31 has a size of 100 nm×100 nm×100 nm or more. The non-superconducting region 32 has a size of 100 nm×100 nm×100 nm or more.

A length of the oxide superconducting layer 30 in the first direction (L in FIG. 2) is, for example, 1 μm or more. The length of the superconducting region 31 in the first direction is, for example, 1 μm or more. A length of the non-superconducting region 32 in the first direction is, for example, 1 μm or more.

A length L of the oxide superconducting layer 30 in the first direction is, for example, 1 m or more. The length of the superconducting region 31 in the first direction is, for example, 1 m or more. The length of the non-superconducting region 32 in the first direction is, for example, 1 m or more.

A width (Wx in FIG. 2) of the oxide superconducting layer 30 in the second direction is, for example, 4 mm. A width (W2 in FIG. 2) of the non-superconducting region 32 in the second direction is smaller than, for example, a width (W1 in FIG. 2) of the superconducting region 31 in the second direction.

A width W1 of the superconducting region 31 in the second direction is, for example, 1 μm or more and 80 μm or less. A width W2 of the non-superconducting region 32 in the second direction is, for example, 1 μm or more and 80 μm or less.

The width W1 of the superconducting region 31 in the second direction is, for example, 10 μm or less. The width W2 of the non-superconducting region 32 in the second direction is, for example, 10 μm or less.

The oxide superconducting layer 30 is provided on the substrate 10, and an area of the region of the oxide superconducting layer 30 facing the substrate 10 is, for example, 90% or more of a surface area of the substrate 10.

The oxide superconducting layer 30 is provided, for example, in contact with the intermediate layer 20. The non-superconducting region 32 is lattice-matched to, for example, the intermediate layer 20.

The thickness of the oxide superconducting layer 30 in the third direction is, for example, 0.1 μm or more and 10 μm or less.

The oxide superconducting layer 30 is an oxide containing rare earth elements. The oxide superconducting layer 30 is, for example, a single crystal having a continuous perovskite structure. The oxide containing the rare earth element has, for example, a chemical composition of $REBa_2Cu_3O_{7-y}$ ($-0.2 \leq y \leq 1$) (hereinafter, REBCO). RE is a rare earth site.

The superconducting region 31 contains barium (Ba), copper (Cu), and at least one first rare earth element selected from the group consisting of yttrium (Y), lantern (La), neodymium (Nd), samarium (Sm), europium (Eu), gadolinium (Gd), dysprosium (Dy), holmium (Ho), erbium (Er), thulium (Tm), ytterbium (Yb), and lutetium (Lu). In the superconducting region 31, when the superconducting region 31 contains praseodymium (Pr), a ratio of the number of atoms of the praseodymium (Pr) to a sum of the number of atoms of the at least one first rare earth element and the number of atoms of the praseodymium (Pr) is 15% or less. For example, when the at least one first rare earth element is yttrium (Y), a ratio of the number of atoms of the praseodymium (Pr) to the sum of the number of atoms of the yttrium (Y) and the number of atoms of the praseodymium (Pr) contained in the superconducting region 31 (Pr/(Y+Pr)) is 15% or less.

The superconducting region 31 contains, for example, an oxide having a chemical composition of $REBa_2Cu_3O_{7-y}$ ($-0.2 \leq y \leq 1$) (hereinafter, REBCO).

The superconducting region 31 has a continuous perovskite structure. The superconducting region 31 is, for example, a single crystal having the continuous perovskite structure.

The superconducting region 31 includes, for example, the praseodymium (Pr). In the superconducting region 31, the ratio of the number of atoms of the praseodymium (Pr) to the sum of the number of atoms of the at least one rare earth element and the number of atoms of the praseodymium (Pr) is, for example, 1% or more and 15% or less.

The superconducting region 31 includes, for example, a clustered atomically substituted artificial pin (CARP).

The non-superconducting region 32 contains praseodymium (Pr), barium (Ba), copper (Cu), and at least one second rare earth element selected from the group consisting of yttrium (Y), lantern (La), neodymium (Nd), samarium (Sm), europium (Eu), gadolinium (Gd), dysprosium (Dy), holmium (Ho), erbium (Er), thulium (Tm), ytterbium (Yb), and lutetium (Lu). In the non-superconducting region 32, a ratio of the number of atoms of the praseodymium (Pr) to a sum of the number of atoms of the at least one second rare earth element and the number of atoms of the praseodymium (Pr) is 20% or more. For example, when the at least one second rare earth element is yttrium (Y), a ratio of the number of atoms of the praseodymium (Pr) to the sum of the number of atoms of the yttrium (Y) and the number of atoms of the praseodymium (Pr) contained in the non-superconducting region 32 (Pr/(Y+Pr)) is 20% or more.

The non-superconducting region 32 contains, for example, an oxide having a chemical composition of $REBa_2Cu_3O_{7-y}$ ($-0.2 \leq y \leq 1$) (hereinafter, REBCO).

The non-superconducting region 32 has a continuous perovskite structure. The non-superconducting region 32 is, for example, a single crystal having the continuous perovskite structure.

The perovskite structure included in the superconducting region 31 and the non-superconducting region 32 is described by $REBa_2Cu_3O_{7-y}$ ($-0.2 \leq y \leq 1$). $PrBa_2Cu_3O_{7-y}$ ($-1 \leq z \leq 1$) (hereinafter, PrBCO), which is a unit cell containing the Pr site whose valence has changed, is contained in the superconducting region 31 in a maximum amount of 15%. Therefore, an average number of oxygen can be up to 7.075.

In addition, when $PrBa_2Cu_3O_{7-y}$ ($-1 \leq z \leq 1$) (hereinafter, PrBCO) is contained in the non-superconducting region 32 in an amount of 24%, a maximum average number of oxygen becomes 7.12, and when the amount of praseodymium (Pr) further increases, the average number of oxygen increases in proportion to the amount of praseodymium (Pr).

In the non-superconducting region 32, the ratio of the number of atoms of the praseodymium (Pr) to the sum of the number of atoms of the at least one rare earth element and the number of atoms of the praseodymium (Pr) is, for example, 50% or less.

The first rare earth element contained in the superconducting region 31 and the second rare earth element contained in the non-superconducting region 32 are, for example, the same. For example, the first rare earth element and the second rare earth element are yttrium (Y).

The first rare earth element contained in the superconducting region 31 and the second rare earth element contained in the non-superconducting region 32 are, for example, different from each other. For example, the first rare earth element is yttrium (Y) and the second rare earth element is dysprosium (Dy).

For example, either or both of the first rare earth element and the second rare earth element are two or more kinds of rare earth elements. In addition, for example, either or both of the first rare earth element and the second rare earth element are three or more kinds of rare earth elements.

The perovskite structure of the non-superconducting region 32 is continuous with the perovskite structure of the adjacent superconducting region 31. The non-superconducting region 32 and the superconducting region 31 are crystallographically continuous with each other. The oxide superconducting layer 30 is, for example, a single crystal having a continuous perovskite structure.

An a/b axis orientation ratio in a portion of 100 μm or less on the superconducting region 31 side from the boundary between the non-superconducting region 32 and the superconducting region 31 is, for example, less than 30%. The a/b axis orientation ratio is a ratio of a/b axis oriented particles among crystal particles contained in the superconducting region 31. The a/b axis oriented particles are crystal particles whose a/b axis is oriented in a direction perpendicular to the surface of the substrate.

The oxide superconducting layer 30 contains, for example, fluorine of $2.0 \times 10^{15}$ atoms/cm$^3$ or more and $5.0 \times 10^{19}$ atoms/cm$^3$ or less, and carbon of $1.0 \times 10^{17}$ atoms/cm$^3$ or more and $5.0 \times 10^{20}$ atoms/cm$^3$ or less. The fluorine and carbon contained in the oxide superconducting layer 30 are residual elements resulting from the film formation of the oxide superconducting layer 30 by a TEA-MOD method.

A concentration of fluorine contained in the oxide superconducting layer 30 is, for example, $2.0 \times 10^{16}$ atoms/cm$^3$ or more. In addition, a concentration of carbon contained in the oxide superconducting layer 30 is, for example, $1.0 \times 10^{18}$ atoms/cm$^3$ or more.

A critical temperature of the superconducting region 31 is, for example, equal to or higher than a value obtained by subtracting 0.3 K from a critical temperature of a superconducting region 31 without the non-superconducting region 32.

Next, the method for manufacturing an oxide superconductor of the first embodiment will be described. In a method for manufacturing an oxide superconductor of a first embodiment, preparing a first coating solution containing barium (Ba), copper (Cu), and at least one first rare earth element selected from the group consisting of yttrium (Y), lantern (La), neodymium (Nd), samarium (Sm) europium (Eu), gadolinium (Gd), dysprosium (Dy), holmium (Ho), erbium (Er), thulium (Tm), ytterbium (Yb), and lutetium (Lu); preparing a second coating solution containing praseodymium (Pr), barium (Ba), copper (Cu), at least one second rare earth element selected from the group consisting of yttrium (Y), lantern (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and a ratio of a number of atoms of the praseodymium (Pr) to a sum of a number of atoms of the second rare earth element and the number of atoms of the praseodymium (Pr) being equal to or more than 20%; forming a gel film by applying the first coating solution and the second coating solution on a substrate so that the first coating solution and the second coating solution are in contact with each other; forming a calcining film by performing calcining on the gel film at 400° C. or lower; and forming an oxide superconducting layer by firing and oxygen annealing on the calcining film at 725° C. or higher and 850° C. or lower in a humidified atmosphere. Hereinafter, the case where the first rare earth element and the second rare earth element are the same will be described as an example. In particular, the case where the first rare earth element and the second rare earth element are yttrium (Y) will be described as an example.

Hereinafter, an example of the method for manufacturing a superconducting wire 100 of the first embodiment will be described. In an example of the method for manufacturing a superconducting wire 100 of the first embodiment, a die coating method is used for forming the gel film.

In the method for manufacturing a superconducting wire 100 of the first embodiment, the intermediate layer 20 is formed on the substrate 10, the oxide superconducting layer 30 is formed on the intermediate layer 20, and the metal layer 40 is formed on the oxide superconducting layer 30. The oxide superconducting layer 30 is formed by the TFA-MOD method.

Figure 3:
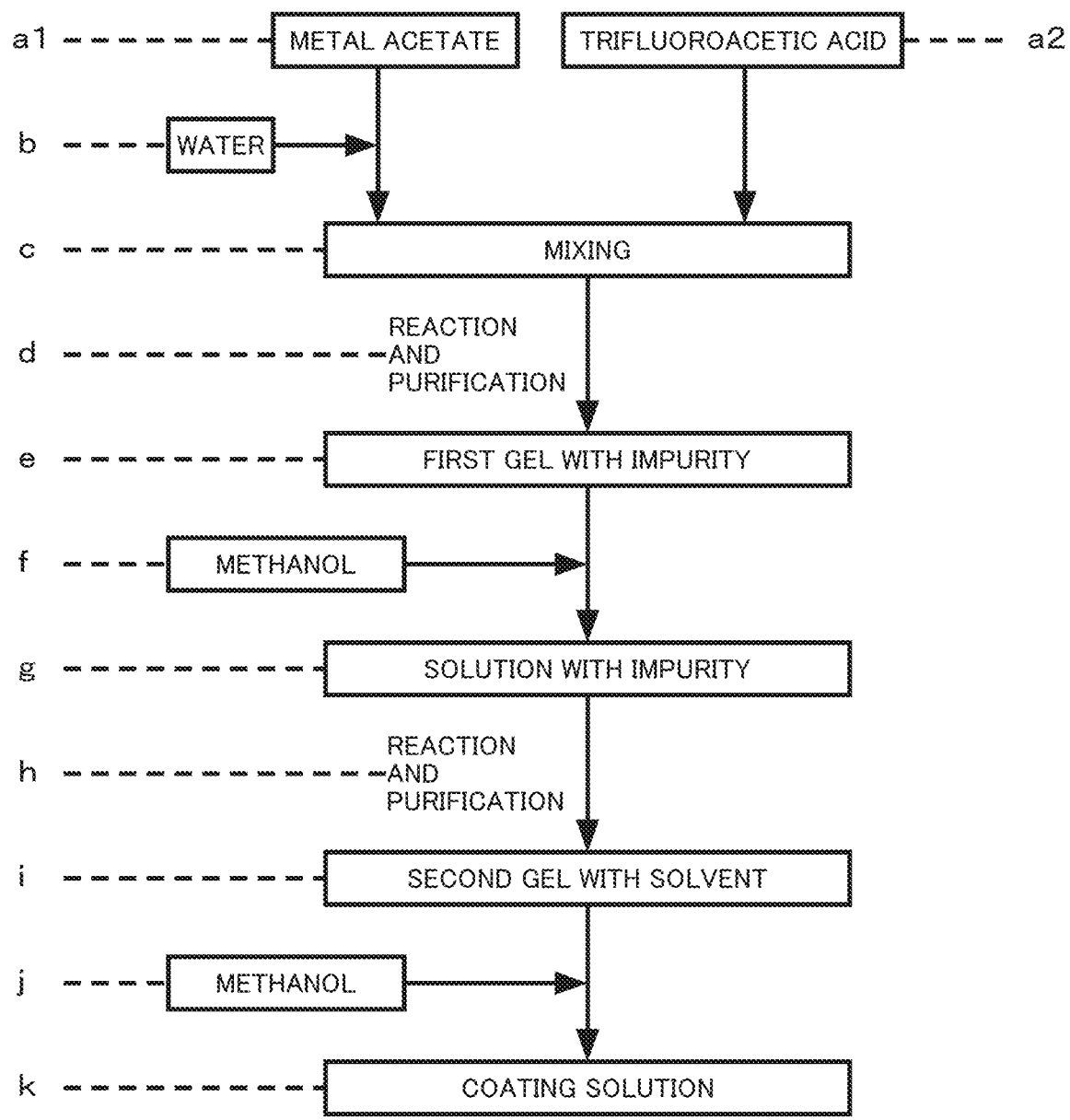
FIG. 3 is a flowchart illustrating an example of preparing a coating solution according to a manufacturing method for the first embodiment.

FIG. 3 is a flowchart illustrating an example of preparing the coating solution according to the manufacturing method of the first embodiment.

First, the preparation of the first coating solution will be described.

As illustrated in FIG. 3, metal acetate of yttrium (Y), barium (Ba), and copper (Cu), respectively, are prepared (a1). Also, trifluoroacetic acid is prepared (a2). Next, the prepared metal acetate is dissolved in water to prepare an aqueous solution (b). The obtained aqueous solution is mixed with the prepared trifluoroacetic acid (c). The obtained solution is reacted and purified (d) to obtain a first gel containing impurities (e). Then, the obtained first gel is dissolved in methanol (f) to prepare a solution containing impurities (g). The obtained solution is reacted and purified to remove impurities (h) and to obtain a second gel containing a solvent (i). Further, the obtained second gel is dissolved in methanol (j) to prepare a coating solution (k). The method for incorporating the solvent illustrated in FIG. 3 into the gel to reduce impurities is referred to as a Solvent-Into-Gel (SIG) method.

The coating solution containing yttrium (Y), barium (Ba), and copper (Cu) becomes the first coating solution. Hereinafter, the first coating solution is referred to as a coating solution for forming a superconducting region.

Next, the preparation of the second coating solution will be described.

As illustrated in FIG. 3, metal acetates of praseodymium (Pr), yttrium, barium (Ba), and copper (Cu) are prepared (a1). Also, trifluoroacetic acid is prepared (a2). Next, the prepared metal acetate is dissolved in water to prepare an aqueous solution (b). The obtained aqueous solution is mixed with the prepared trifluoroacetic acid (c). The obtained solution is reacted and purified (d) to obtain a first gel containing impurities (e). Then, the obtained first gel is dissolved in methanol (f) to prepare a solution containing impurities (g). The obtained solution is reacted and purified to remove impurities (h) and to obtain a second gel containing a solvent (i). Further, the obtained second gel is dissolved in methanol (j) to prepare a coating solution (k).

The coating solution containing praseodymium (Pr), barium (Ba), and copper (Cu) becomes the second coating solution. In the second coating solution, the amount of metal acetates of praseodymium (Pr), yttrium (Y), barium (Ba), and copper (Cu), respectively, is adjusted so that the ratio of the number of atoms of praseodymium (Pr) to the sum of the number of atoms of yttrium and the number of atoms of praseodymium (Pr) is 20% or more. Hereinafter, the second coating solution is referred to as a coating solution for forming a non-superconducting region.

When preparing the coating solution for forming the non-superconducting region, as the metal acetate, metal salts are mixed, for example, at RE site (Y, Pr):Ba:Cu=1:2:3. The mixture is made so that the amount of Pr in the RE site is, for example, 20% or more and 50% or less. After mixing and reaction, the amount of residual water and acetic acid in the coating solution is reduced to 2% by weight or less by a high-purity solution purification process by a stabilized solvent-into-gel (SIG) method. The SIG method of the first embodiment is a method for highly purifying a solution for partial stabilization in order to prevent decomposition of PrBCO, and is a partially stabilized solvent-into-gel (PS-SIG) method.

The purity of praseodymium acetate used to prepare the coating solution for forming a non-superconducting region is, for example, 99% or more.

Figure 4:
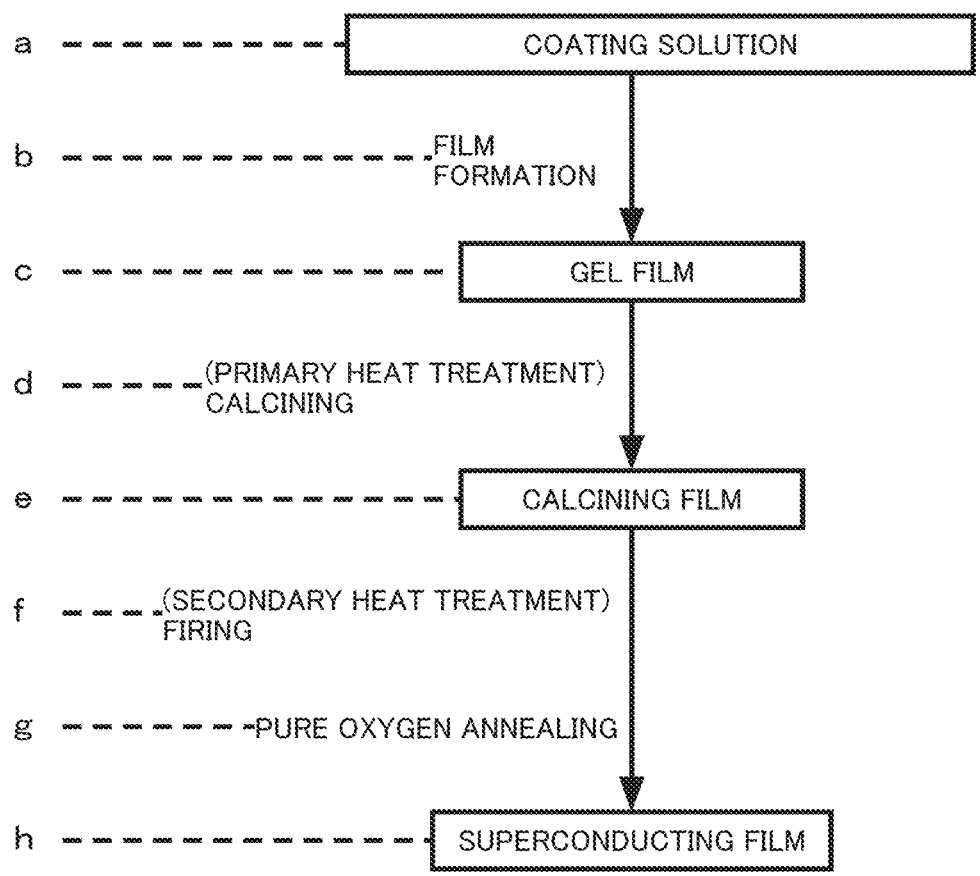
FIG. 4 as a flowchart illustrating an example of a method for forming a superconducting film from the coating solution of the first embodiment.

FIG. 4 is a flowchart illustrating an example of a method for forming a superconducting film from the coating solution of the first embodiment.

As illustrated in FIG. 4, first, the previously prepared coating solution is prepared (a). The coating solution is applied onto the substrate by, for example, a die coating method to form a film (b), thereby obtaining a gel film (c). Then, the obtained gel film is subjected to calcining, which is a primary heat treatment, to decompose organic matters (d), thereby obtaining a calcining film (e). Further, the calcining film is subjected to firing, which is a secondary heat treatment (f), and then is subjected to, for example, pure oxygen annealing (g), thereby obtaining a superconducting film (h).

Figure 5A:
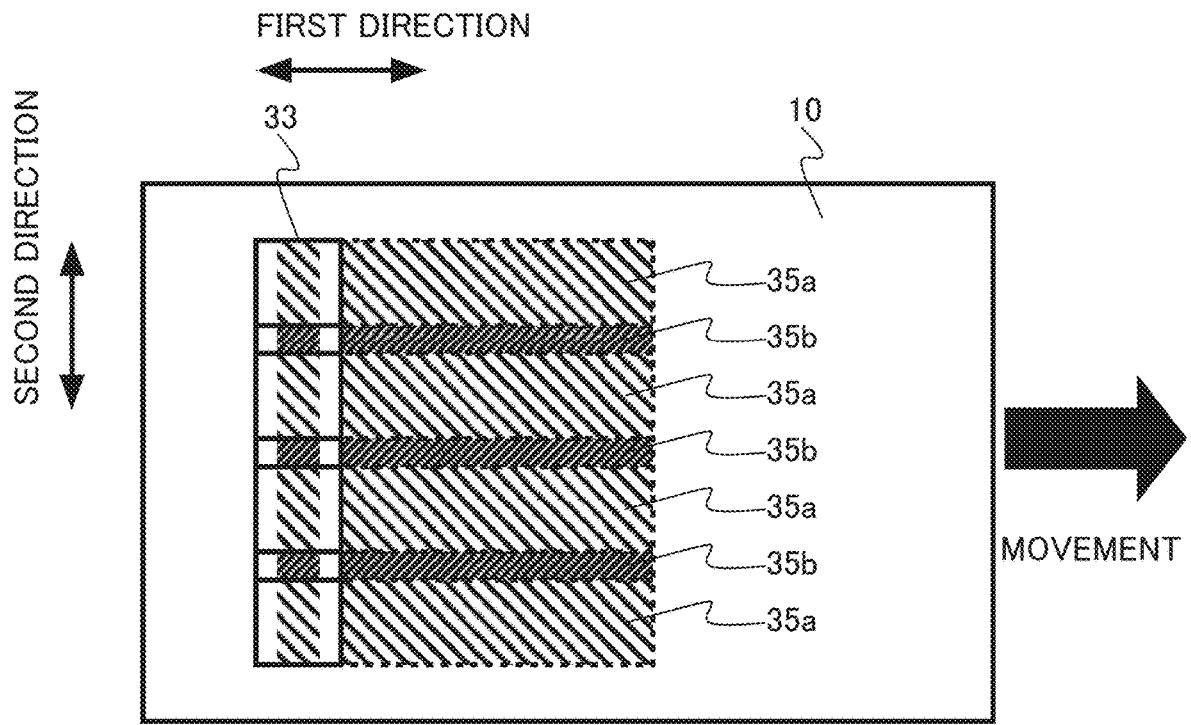
FIGS. 5A and 5B are explanatory diagrams of a formation of a gel film by a die coating method for the first embodiment.
Figure 5B:
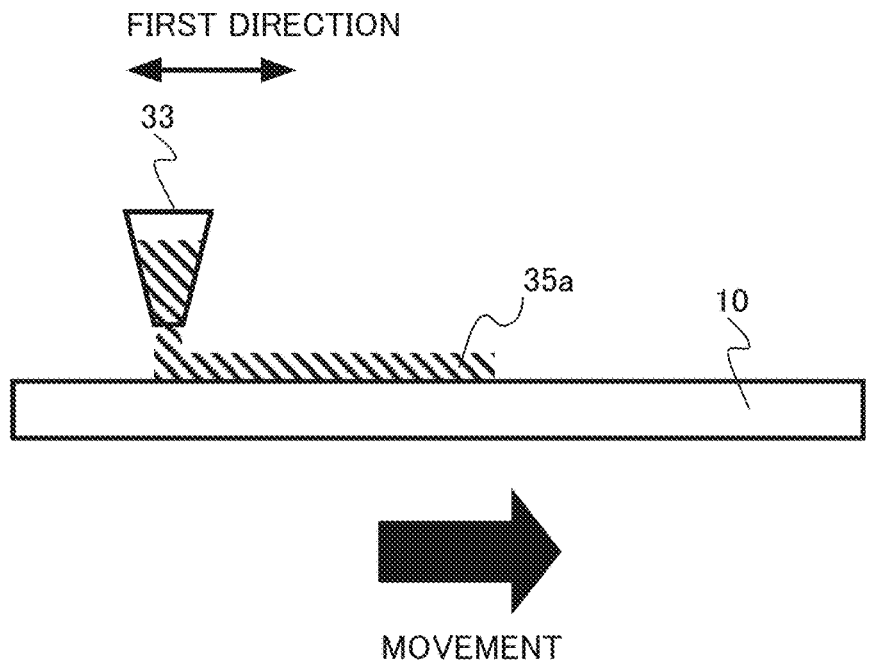

FIGS. 5A and 5B are explanatory diagrams of a formation of a gel film by a die coating method for the first embodiment. FIG. 5A is a diagram viewed from the top of the substrate 10, and FIG. 5B is a diagram viewed from the side of the substrate 10.

As illustrated in FIGS. 5A and 5B, a coating solution 35a for forming a superconducting region and a coating solution 35b for forming a non-superconducting region are simultaneously applied to the substrate 10 from a solution container 33. As illustrated in FIG. 5A, the coating solution 35a for forming a superconducting region and the coating solution 35b for forming a non-superconducting region are applied onto the substrate 10 so that the coating solution 35b for a non-superconducting region is sandwiched between the coating solutions 35a for a superconducting region and the coating solution 35a for forming a superconducting region and the coating solution 35b for forming a non-superconducting region are in contact with each other.

The substrate 10 moves in the first direction with respect to the solution container 33. The coating solution 35a for forming a superconducting region and the coating solution 35b for forming a non-superconducting region applied onto the substrate 10 extend in the first direction.

A distance between the coating solutions 35a for forming a superconducting region applied onto the substrate 10 and adjacent to each other in the second direction is, for example, 80 μm or less. In other words, the width of the coating solution 35b for forming a non-superconducting region applied onto the substrate 10 in the second direction is, for example, 80 μm or less.

The coating solution 35a for forming a superconducting region and the coating solution 35b for forming a non-superconducting region that are applied onto the substrate 10 are dried to form a gel film. The time required from the application of the coating solution 35a for forming a superconducting region and the coating solution 35b for forming a non-superconducting region onto the substrate 10 to the formation of the gel film is, for example, around 3 seconds.

Figure 6:
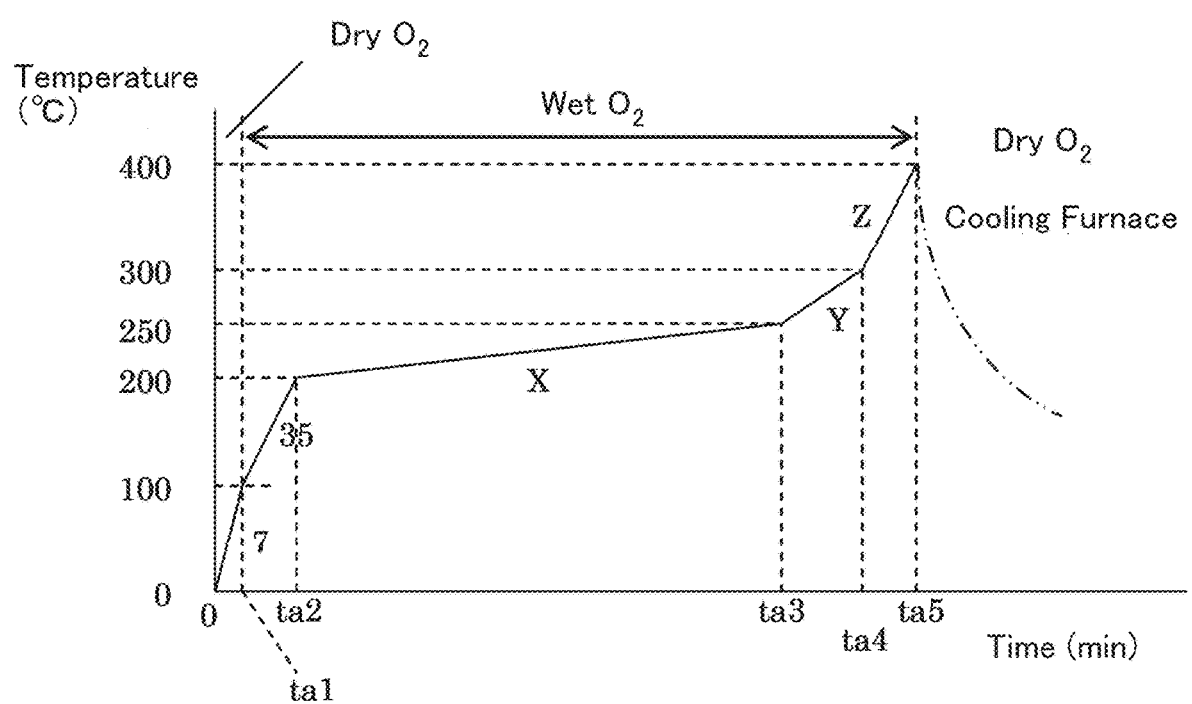
FIG. 6 is a diagram illustrating a typical calcining profile of the first embodiment.

FIG. 6 is a diagram illustrating a typical calcining profile of the first embodiment. In the calcining under normal pressure, trifluoroacetic acid salt is mainly decomposed at 200° C. or higher and 250° C. or lower. A temperature rise rate is reduced near 200° C. to prevent the rush into the temperature range. When the temperature is gradually raised to 250° C., the substance decomposed from trifluoroacetic acid salt contains fluorine and oxygen, and fluorine and oxygen tend to remain in the film due to hydrogen bonds. The temperature is raised to 400° C. to remove the substance. The final temperature is generally 350 to 450° C. In this way, a translucent brown calcining film made of oxides and fluorides is obtained.

Figure 7:
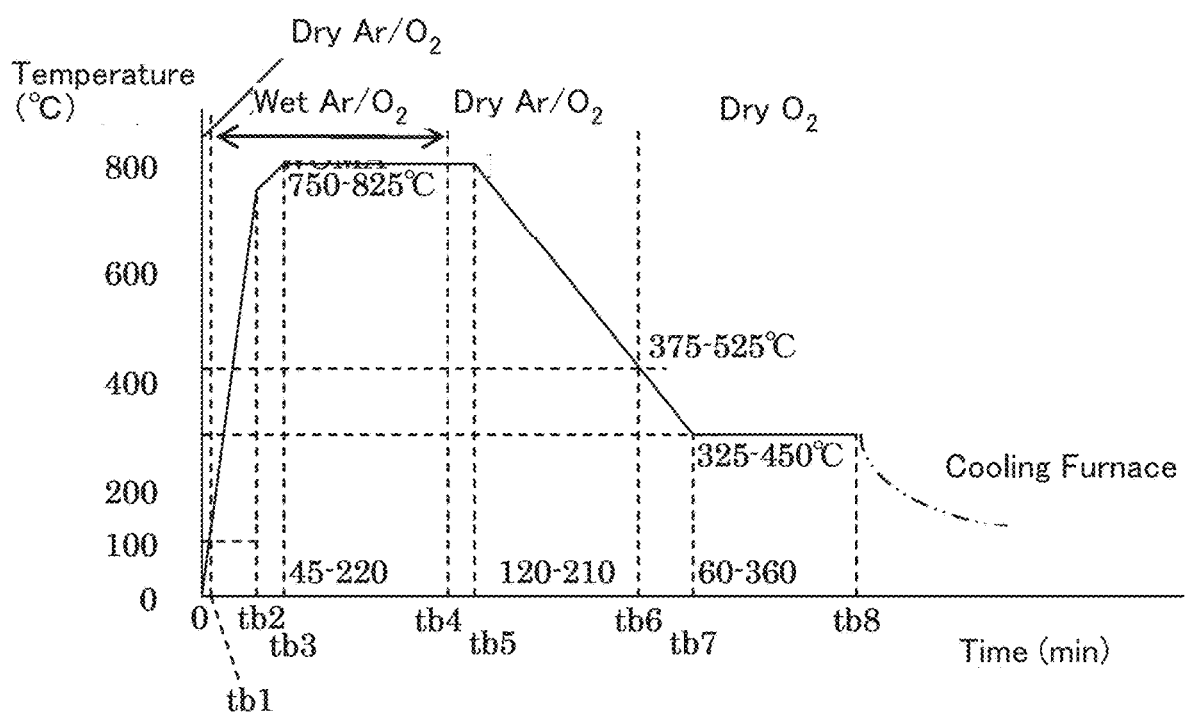
FIG. 7 is a diagram illustrating a typical firing profile of the first embodiment.

FIG. 7 is a diagram illustrating a typical firing profile of the first embodiment. A mixed gas is dried Up to tb1 at 100° C., but humidification is performed. A humidification start temperature may be 100° C. or higher and 400° C. or lower it seems that the formation of the Quasi-liquid layer starts from around 550° C., and the humidification is performed at a temperature lower than that so that the humidifying gas spreads inside the film and the quasi-liquid layer is uniformly formed.

FIG. 7 illustrates a typical temperature profile of firing at 800° C., but the temperature rise profile is gentle at 775° C. or higher and 800° C. or lower so that there is no temperature overshoot at tb3. However, an overshoot at 800° C. can remain at 2 to 3° C., which is not particularly a problem. An oxygen partial pressure at the highest temperature depends on the matrix phase. In the case of YBCO superconductor firing, the partial pressure is 1000 ppm at 800° C., and the optimum oxygen partial pressure is halved every time the temperature drops by 25° C. That is, the partial pressure is 500 ppm at 775° C. and 250 ppm at 750° C. In the case of the YBCO system, $YBa_2Cu_3O_6$ is formed in this firing. At this point, no superconductor exists.

For example, the highest temperature of firing may be 750° C. In this case, for example, the same temperature rise rate as in FIG. 7 is performed to a temperature 25° C. lower than the highest temperature, and the temperature rise rate reduced to raise the temperature to the highest temperature.

At the firing at the highest temperature, dry gas flows at tb4 before the temperature starts to drop after the firing is completed. Since the humidifying gas decomposes the superconductor at 700° C. or lower and becomes an oxide, oxygen annealing is performed at tb6 to change the number of oxygen of the superconductor from 6.00 to 6.93. The superconductor is achieved at the number of oxygen. However, although only the PrBCO has a perovskite structure, the superconductor is not achieved. Also, since the valence of Pr is unknown, the number of oxygen of the unit cell is also unknown, but it seems that the number of oxygen is many. This is because the valence of Pr is a value between 3 and 4, and the number of oxygen increases in the unit cell accordingly. The starting temperature of oxygen annealing is 375° C. or higher and 525° C. or lower. After the temperature retention ends, the furnace is cooled from tb8.

After forming the oxide superconducting layer 30, the metal layer 40 is formed on the oxide superconducting layer 30. The metal layer 40 is formed by, for example, a sputtering method.

By the above manufacturing method, the superconducting wire 100 of the first embodiment including the oxide superconducting layer 30 is manufactured.

Next, the function and effect of the oxide superconductor and the method for manufacturing an oxide superconductor of the first embodiment will be described.

Figure 8:
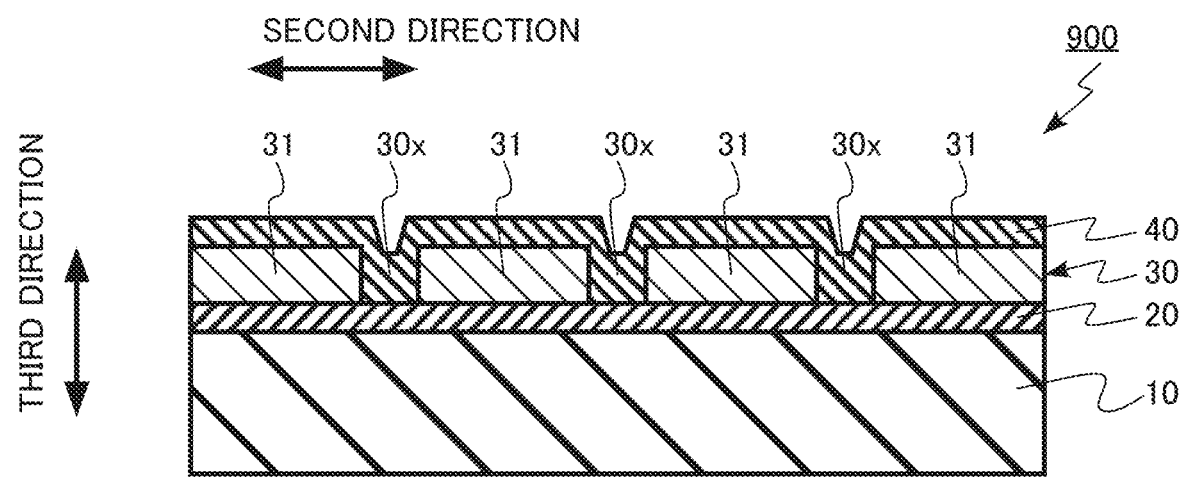
FIG. 8 is a schematic cross-sectional view of an oxide superconductor of a comparative example of the first embodiment.
Figure 9:
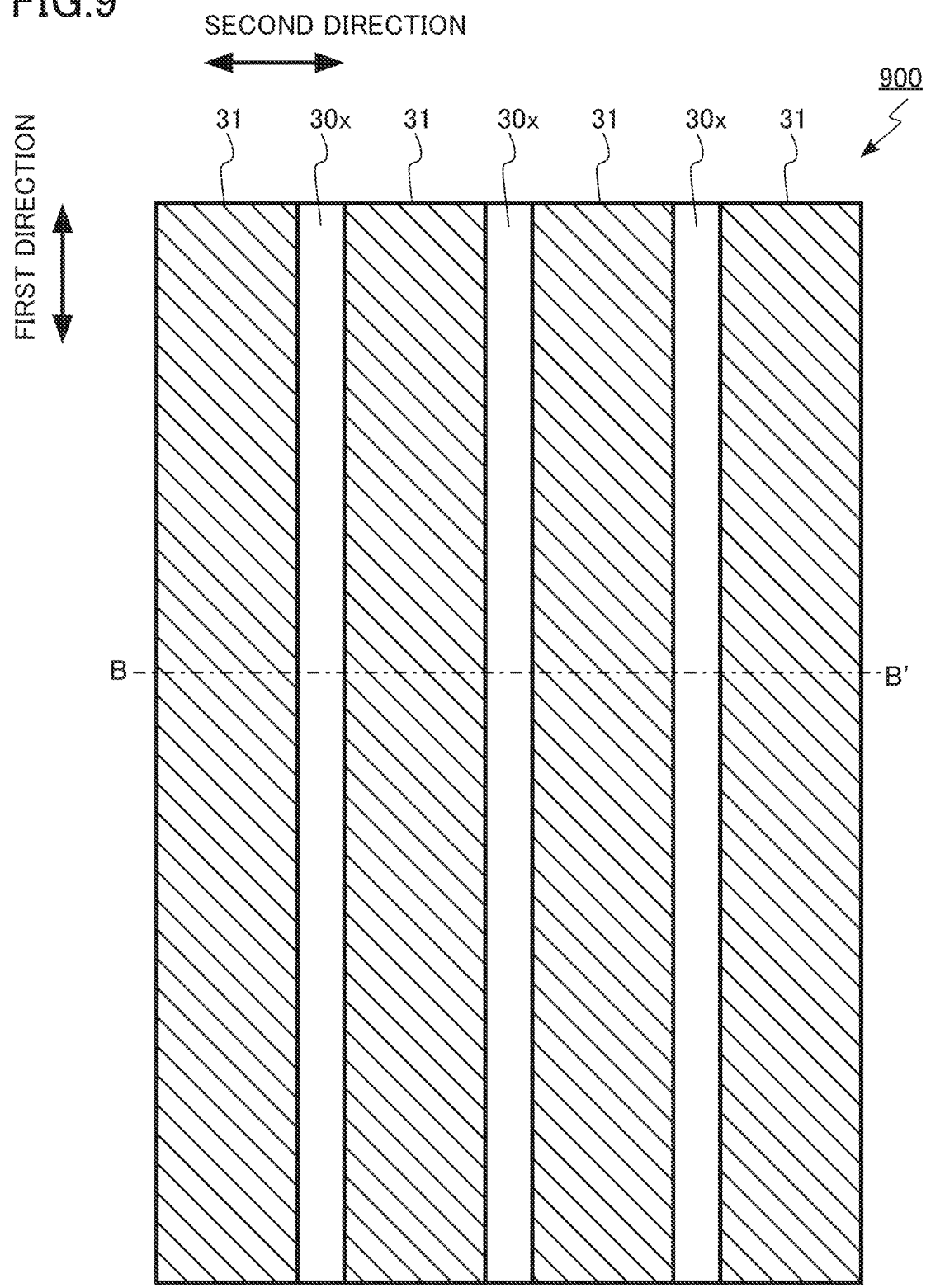
FIG. 9 is a schematic top view of the oxide superconductor of the comparative example of the first embodiment.

FIG. 8 is a schematic cross-sectional view of an oxide superconductor of a comparative example of the first embodiment. FIG. 9 is a schematic top view of an oxide superconductor of a comparative example of the first embodiment. FIG. 9 is a top view of the oxide superconductor in a state in which the metal layer of FIG. 8 is removed. FIG. 8 is a cross-sectional view taken along the line B-B' of FIG. 9.

The oxide superconductor of the comparative example is a superconducting wire 900.

The superconducting wire 900 differs from the superconducting wire 100 of the first embodiment in that the non-superconducting region is not provided in a region 30x between the adjacent superconducting regions 31. In the region 30x, the superconducting region 31 is divided and the metal layer 40 is inserted.

In the superconducting wire 900, the oxide superconducting layer 30 is divided by the laser scribing method and divided into a plurality of superconducting regions 31. The superconducting wire 900 realizes the reduction in the AC loss by dividing the oxide superconducting layer 30 into the plurality of superconducting regions 31.

Figure 10:
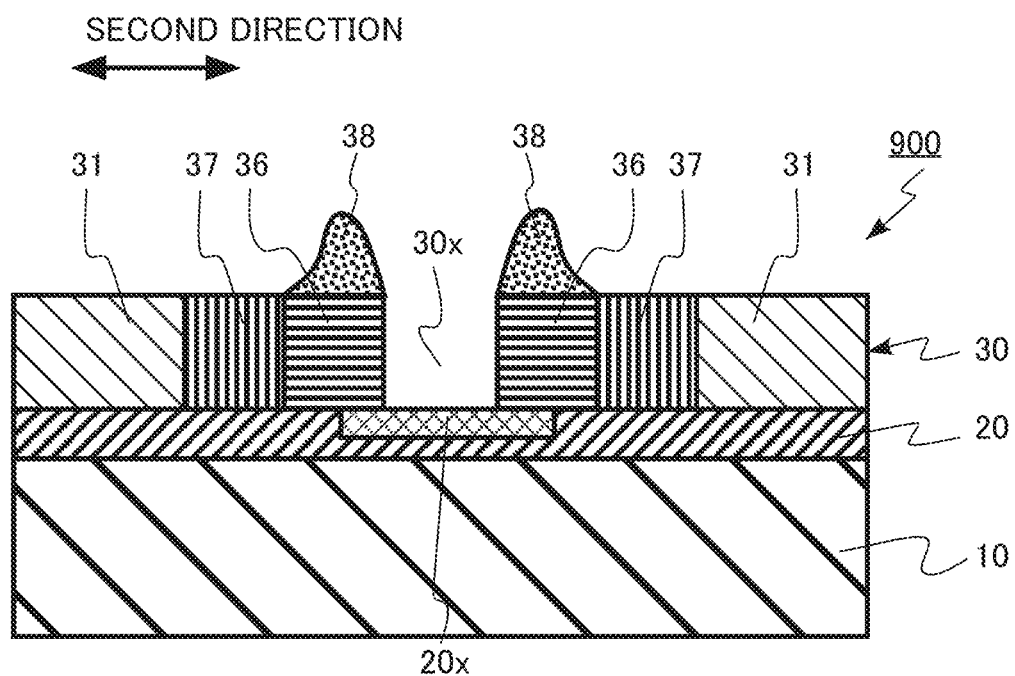
FIG. 10 is an enlarged schematic cross-sectional view of the oxide superconductor of the comparative example of the first embodiment.

FIG. 10 is an enlarged schematic cross-sectional view of an oxide superconductor of a comparative example of the first embodiment. FIG. 10 is an enlarged view of the vicinity of the region 30x of the superconducting wire 900.

The first problem with the superconducting wire 900 is that a decomposition oxide layer 36 and a non-superconductor region 37 are formed by high heat during ablation. The decomposition oxide layer 36 is a decomposition product such as $Y_2O_3$, CuO, and $BaCuO_2$. The non-superconductor region 37 is a non-superconductor region where the number of oxygen of the oxide superconducting layer 30 changes and the number of oxygen is different while being YBCO. In particular, the coefficient of thermal expansion of the decomposition oxide layer 36 is different from that of the superconducting region 31, so the intermediate layer 20 is likely to be peeled off due to stress caused by the difference in the coefficient of thermal expansion at cooling from room temperature to extremely low temperature which is a superconducting state or temperature rising during periodic inspections.

The second problem with the superconducting wire 900 is the peeling within the intermediate layer 20 due to the high heat during the ablation and the peeling of the intermediate layer 20 and the substrate 10. When heated in a short time, there is a time lag in heating with an underlayer, and a difference in thermal expansion facilitates the occurrence of peeling.

The third problem with the superconducting wire 900 is an altered region 20x formed in the intermediate layer 20. For example, the oxide superconducting layer 30 and the intermediate layer 20 are likely to be peeled off due to the difference in thermal expansion between the altered region 20x and the upper oxide.

The fourth problem with the superconducting wire 900 is the formation of debris 38. Since the step shape is formed by the debris 38, for example, when the superconducting wire 900 is wound as a coil, a large stress is applied to the vicinity of the debris 38, and therefore, the superconducting wire 900 is damaged.

The fifth problem with the superconducting wire 900 is a recess formed in a region 30x. Since the step shape is formed by the recess formed by the region 30x, for example, when the superconducting wire 900 is wound as a coil, a large stress is applied to the vicinity of the region 30x, and therefore, the superconducting wire 900 is damaged.

The sixth problem with the superconducting wire 900 is the vulnerability of the superconducting region 31, which has become a thin wire due to the division of the oxide superconducting layer 30. The thinned superconducting region 31 tends to be physically damaged.

The superconducting wire 900 manufactured by the laser scribing method has the reduced mechanical strength, as shown by the first to sixth problems described above.

The superconducting wire 100 of the first embodiment uses, for example, a die coating method at the time of manufacturing. Since the laser scribing method is not used, the first to fourth problems unique to the laser scribing method are solved.

Further, the superconducting wire 100 of the first embodiment includes the non-superconducting region 32 between the divided superconducting regions 31. The perovskite structure of the superconducting region 31 and the perovskite structure of the non-superconducting region 32 are continuous with each other.

Due to the existence of the non-superconducting region 32 integrated with the superconducting region 31 at the crystal level, the crystal structure of the oxide superconducting layer 30 is the same as that before the division of the oxide superconducting layer 30. Therefore, the fifth problem and the sixth problem with the superconducting wire 900 are also solved. Therefore, the mechanical strength of the superconducting wire 100 of the first embodiment is higher than that of the superconducting wire 900 of the comparative example.

In the superconducting wire 100 of the first embodiment, from the viewpoint of increasing the mechanical strength of the oxide superconducting layer 30, the non-superconducting region 32 is preferably provided between the two superconducting regions 31.

In the superconducting wire 100 of the first embodiment, from the viewpoint of increasing the mechanical strength of the oxide superconducting layer 30, the area of the region of the oxide superconducting layer 30 facing the substrate 10 is preferably 90% or more of the surface area of the substrate 10.

In the superconducting wire 100 of the first embodiment, the non-superconducting region 32 of the oxide superconducting layer 30 is preferably lattice-matched with the intermediate layer 20 from the viewpoint of increasing the mechanical strength of the oxide superconducting layer 30.

In the superconducting wire 100 of the first embodiment, from the viewpoint of making the superconducting wire 100 function as a wire, the length of the superconducting region 31 and the non-superconducting region 32 in the first direction is preferably 1 μm or more, and more preferably 1 m or more.

In the superconducting wire 100 of the first embodiment, from the viewpoint of reducing the AC loss, the width (W2 in FIG. 2) of the non-superconducting region 32 in the second direction is preferably, for example, smaller than the width (W1 in FIG. 2) of the superconducting region 31 in the second direction.

In the superconducting wire 100 of the first embodiment, from the viewpoint of reducing AC loss, the width (W2 in FIG. 2) of the non-superconducting region 32 in the second direction is preferably, for example, 80 μm or less.

The oxide superconducting layer 30 preferably contains fluorine (F) of $2.0\times10^{15}$ atom/cm$^3$ or more and $5.0\times10^{19}$ atom/cm$^3$ or less, and carbon (C) of $1.0\times10^{17}$ atom/cm$^3$ or more and $5.0\times10^{20}$ atom/cm$^3$ or less. The fluorine or carbon contained in the oxide superconducting layer 30 is considered to function as an artificial pin with a small effect under a very strong magnetic field exceeding 10 T. Therefore, the magnetic field characteristics of the superconducting wire 100 are improved by including the fluorine and carbon.

The superconducting region 31 preferably contains praseodymium (Pr). The PrBCO, which is the non-superconductor, is dispersed in the oxide superconducting layer 30 and functions as an artificial pin. Therefore, the magnetic field characteristics of the superconducting wire 100 are improved.

From the viewpoint that the superconducting region 31 exhibits good superconductivity, the ratio of the number of atoms of the praseodymium (Pr) to the sum of the number of atoms of the rare earth elements other than praseodymium (Pr) and the number of atoms of the praseodymium (Pr) contained in the oxide superconducting layer 30 is preferably 15% or less.

The superconducting region 31 preferably contains a clustered atomically substituted artificial pin (CARP). The clustered atomically substituted artificial pin (CARP) is, for example, an artificial pin described in Japanese Patent No. 6374365, Japanese Patent No. 6479251, or Japanese Patent No. 6556769. By including the clustered atomically substituted artificial pin (CARP) in the superconducting region 31, the magnetic field characteristics of the superconducting wire 100 are improved.

In the superconducting wire 100 of the first embodiment, for example, the YBCO superconductor constituting the superconducting region 31 contains almost 0% of Pr, and the Y site of the YBCO superconductor constituting the non-superconducting region 32 contains 20% of Pr. Since the characteristics of the superconducting region 31 deteriorate as the amount of Pr increases, it is preferable to use the superconducting region 31 that does not contain Pr in the situation where the current value is increased or decreased but the magnetic field is hardly applied.

In the superconducting wire 100 of the first embodiment, for example, the superconductor in which the YBCO superconductor constituting the superconducting region 31 contains almost 2% of Pr is used, and the Y site of the YBCO superconductor constituting the non-superconducting region 32 contains 20% of Pr. In order to reduce the influence of the magnetic field, the artificial pin, which is a technique for forming a non-superconducting portion having a size of about 5 to 10 nm inside a superconductor, is known. Since the artificial pin is non-superconductivity, the superconducting characteristics deteriorate under a non-magnetic field. However, there is a phenomenon that the superconducting characteristics deteriorate because the quantum magnetic flux moves inside the superconductor under the magnetic field. If an artificial pin of 5 to 10 nm, which is the non-superconducting portion, exists inside the superconductor, the quantum magnetic flux is fixed by the potential difference between superconductivity and non-superconductivity, and therefore, the deterioration of the magnetic field characteristics is avoided. That is, the magnetic field characteristics of the superconducting wire 100 are improved.

When the size of the clustered atomically substituted artificial pin (CARP) is large, there is no effect. This is because the artificial pin captures the quantum magnetic flux at the interface between superconductivity and non-superconductivity and exerts the effect, and therefore, as the size of the artificial pin increases, the amount or area of the interface decreases and the effect decreases accordingly. The size of the clustered atomically substituted artificial pin is currently around 10 nm, but the non-superconducting region 32 of the first embodiment has a different size at 100 nm or more, which is another technology. There is no CARP of 100 nm, and as can be seen from the growth mechanism reported by the inventor, it is difficult to make the CARP of 100 nm.

As the superconducting application associated with the PrBCO, the Josephson junction has been actively studied in the past (JP H04-357889). This is also a junction of PrBCO and YBCO, but the PrBCO is formed separately from the YBCO, and is mainly formed by the PLD method. In the PLD method, the optimum oxygen partial pressure exists depending on the element, and at 800° C., optimal oxygen partial pressure of the YBCO is 1000 ppm and the optimal oxygen partial pressure of the PrBCO is 1 ppm. In the vacuum physical vapor deposition method, the oxygen concentration at the time of film formation is allowed only 0.5 to 2 times the optimum value. For example, when the YBCO is firing at 1 ppm at 800° C., the YBCO is not formed. Separate oxides such as $Y_2O_3$ are formed. At present, only the TFA-MOD method, which is a liquid phase growth method, has been reported to be able to form YBCO and PrBCO oxides with significantly different optimal oxygen partial pressures into a common perovskite structure.

In the superconducting wire 100 of the first embodiment, for example, the superconducting region 31 contains a parent phase YBCO, and the superconductor uniformly disperses the PrBCO, which is a non-superconductor. The concentration of Pr occupied the Y site is 15% or less, and may be 0%. The superconducting region 31 has the perovskite structure in common with the non-superconducting region 32. In the non-superconducting region 32, 20% or more of Pr is contained in the Y site.

All the vacuum physical deposition methods, including the PLD method, do not provide a structure in which the YBCO and PrBCO coexist. The reason is that there is a 1000-fold difference in the optimal oxygen partial pressure between the YBCO and PrBCO shown above. Note that the allowable oxygen partial pressure value in the vacuum physical vapor deposition method is 0.5 to 2 times the optimum value.

In all the methods for manufacturing a superconductor, there is the optimum oxygen partial pressure for each firing temperature depending on the substance, especially what enters the Y site. For example, if Y is 100% at the Y site, the optimal oxygen partial pressure is 1000 ppm in firing of 800° C., 500 ppm in firing of 775° C., and 250 ppm in firing of 750° C. The optimal oxygen partial pressure changes exponentially to 50% each time the firing temperature drops by 25° C.

The optimum oxygen partial pressure of SmBCO is 20 ppm in the firing of 800° C., and also 10 ppm and 5 ppm in the firing of 775° C. and the firing of 750° C., respectively. In addition, it is estimated that the optimum oxygen partial pressure of NdBCO is 5 ppm and the optimum oxygen partial pressure of LaBCO is 0.2 ppm, in the firing of 800° C. The optimum oxygen partial pressure at 800° C. decreases as an atomic radius increases. Therefore, although there is no specific report, it is estimated that the optimum oxygen partial pressure for the PrBCO to form the perovskite structure at 800° C. is around 1 ppm. It is based on the atomic radius of La>Pr>Nd>Sm> . . . >Y.

The optimum oxygen partial pressure is the same regardless of the manufacturing method. That is, the optimum oxygen partial pressure is the same in all the methods such as the TFA-MOD method which is mainly related to the first embodiment, the PLD method which is the vacuum physical vapor deposition method, the MOCVD method, an electron beam (EB) method which s another vacuum physical vapor deposition method, a co-evaporation (CE) method, and an accelerated co-deposition (RCE) method. In addition, the optimum oxygen partial pressure is the same in the MOD method or the like that is another chemical solution method.

It is known that the optimum oxygen partial pressure forms the structure with the highest quality at the optimum value, that is, the optimum oxygen partial pressure forms a structure with oxide decomposition products and the perovskite structure with less heterogeneous phases. For example, in the PLD method, is known that the YBCO with the least heterogeneous phases can be obtained when a film is formed at 1000 ppm in the firing of 800° C. When this oxygen partial pressure is set to, for example, 500 ppm, the heterogeneous phase in the YBCO increases and the superconducting characteristics deteriorate. At 250 ppm, it becomes an aggregate of decomposition products such as $Y_2O_3$ and CuO, and YBCO superconductor cannot be obtained. The same applies to the large oxygen partial pressure side. However, (102) or (103) oriented structure instead of (001) oriented structure is formed on the large oxygen partial pressure side, and the characteristics may deteriorate.

Therefore, the YBCO and PrBCO with the optimum oxygen partial pressures of 1000 ppm and 1 ppm cannot be formed in the common perovskite structure. The same applies to one MOD method of the chemical solution method. In the MOD method, the YBCO is formed by a solid phase reaction, and the growth interface is exposed to the outside air and is affected by the optimum oxygen partial pressure. Therefore, it is highly dependent on the oxygen partial pressure, and when the oxygen partial pressure is different and the YBCO can be formed at 1000 ppm, the PrBCO cannot be formed. In addition, when 1 ppm is used, which is advantageous for the PrBCO, the YBCO cannot be formed.

The TFA-MOD method can form the perovskite structure in which the YBCO and PrBCO coexist, which is thought to be due to the reaction through the quasi-liquid phase. The TFA-MOD method can explain various phenomena during the firing that are different from the general MOD method by using the quasi-liquid phase network model, and it is considered that the unit cell with the perovskite structure is formed by the growth mechanism. In the TFA-MOD method, the quasi-liquid phase is formed during the firing, and the unit cells such as the YBCO are released at the growth interface (T. Araki and I. Hirabayashi, Supercond. Sci. Technol. 16 (2003) R71-R94) at the bottom of the liquid phase, which is the boundary with the solid phase, in proportion to the amount of HF gas dissipated from the quasi-liquid phase to the gas phase, and takes a growth style in which the growth interface is formed.

Both the YBCO and PrBCO once form the quasi-liquid phase. The unit cells are released from the quasi-liquid phase to form the perovskite structure. At this time, the optimum oxygen partial pressure for forming a good perovskite structure certainly exists. The pure YBCO is 1000 ppm at 300° C. and the SmBCO is 20 ppm at 800° C. The experimental results are also the same.

However, as can be seen that the CARP is actually formed in the TFA-MOD method (Japanese Patent No. 6374365, Japanese Patent No. 6556769, T. Araki, et. al. Supercond. Sci. Technol. 31 (2018) 065008 (8pp)), it is possible to simultaneously coexist various unit cells such as YBCO, PrBCO, SmBCO, and TmBCO in the same perovskite structure. It is assumed that this is because the growth interface is at the bottom of the quasi-liquid phase and is not significantly affected by the external oxygen partial pressure, although the external oxygen partial pressure and the quasi-liquid phase exchange oxygen. The optimum oxygen partial pressure at the time of mixing is likely to be an exponential logarithmic average value of each element.

For the above reasons, the structure that cannot be obtained by the PLD method or the like can be obtained by the TFA-MOD method, and the structure is actually realized.

Similarly, for example, the MOCVD method, which is other vacuum physical vapor deposition methods, cannot form the structure in which the YBCO and PrBCO are mixed. The method is a method for decomposing organic matters after the meta element reaches the substrate. Since the growth interface is in contact with the gas phase, the oxygen partial pressure has an effect it may be because like the TFA-MOD method, the oxygen partial pressure does not have an indirect effect on mechanism. One MOD method of the chemical solution method and all other vacuum physical deposition methods cannot form the structure in which the YBCO and PrBCO are adjacent to each other in the same perovskite structure.

If the perovskite structure in which the YBCO and PrBCO coexist other than the TFA-MOD method is formed, it seems to be a method in which the liquid phase is involved like the TFA-MOD method, the growth interface exists at the bottom of the sea of the liquid phase, and a world is formed that is cut off from the external oxygen partial pressure. At least at this time, such a method has not been reported in the method for manufacturing Y-based superconductors. The TFA-MOD method is the only method.

A large decrease in Tc has been reported in an attempt to improve the magnetic field characteristics by forming YBCO+PrBCO in a bulk body. This is because after the PrBCO and YBCO are formed as aggregates, when the valence of Pr changes from trivalent to the vicinity of tetravalent, a lattice constant of the aggregate of the PrBCO contracts by 12 to 14%, and the bonded state of the unit cells in which the physical peeling from the aggregate of the YBCO occurs deteriorates. The gap between the unit cells lowers Tc. In other words, the report of the bulk body shows that the structure in which the unit cell of the YBCO and PrBCO presented in the first embodiment form the same perovskite structure has not been realized.

In the past, even in the development of Josephson junction devices using superconductivity, there were many attempts to make devices by being bonded with the YBCO using the PrBCO as the non-superconductor. However, since the PLD method and the like is used in this device formation as well, the YBCO and PrBCO are not formed at the same time, but the device is formed by the method such as forming the PrBCO after the YBCO is formed once, and therefore the continuous perovskite structure is not achieved. As long as the device is non-superconducting, even if there is an example in which the PrBCO is formed with the same oxygen partial pressure as the YBCO, the PrBCO cannot form the perovskite structure in that case. This is because the optimum oxygen partial pressure is 1 ppm, and as a result, aggregates of other oxides are formed under 1000 ppm. Furthermore, there are many cases where the Tc value is also reduced by 2 to 3K.

When the YBCO and the PrBCO form a common perovskite structure or the CARP, the decrease in critical temperature Tc is 0.3 K or less. This Tc value within 0.3 K is considered to indicate the common perovskite structure.

Regarding the first embodiment, the inventor has reported the perovskite structure in which elements having a large atomic radius difference such as Pr and Y coexist in the related PrBCO-added YBCO structure. To achieve this, it was desirable to purify the solution. In the examples of the above report, it is reported that the Pr is 10%, but when the Pr is increased to about 20%, it is unstable, and therefore reproducibility is low because a solution was obtained or decomposed. At that time, the manufacturer estimates that the purity of praseodymium acetate is around 98%.

This time, increasing the purity of praseodymium acetate to 99% by estimation, the coating solution of the YBCO in which Y sites are substituted with up to 24% of Pr. As explained above, the Pr has a large ionic radius and is easily decomposed. Therefore, it can be estimated that even if the amount of Pr is less than the amount that can be mixed, the Pr is decomposed if impurities are present above a certain level.

In addition, even for unstable elements such as Pr, if a stable element such as Y is mixed to synthesize a solution, the stable solution can be obtained as a whole. The coating solution can be obtained without decomposition by the PS-SIG method, which is a partially stabilized SIG method. It is previously reported that the amount of Pr that could be mixed by the PS-SIG method was less than 20%, but this time, 20% of solution is stably obtained by increasing the purity of Pr salt, and up to 22% or 24% of solution can be stably obtained.

Regarding the addition of Pr, it has been found that the superconducting characteristics of 5 times the amount of Pr added are reduced (M. Hayashi, et. al. Supercond. Sci. Technol. 31 (2018) 055013 (7 pp)). This is because the valence of Pr changes from trivalent to trivalent to tetravalent, the number of oxygen changes from 6.93 to 7.42 in the unit cell, and oxygen is present at the oxygen deficient site, so that an attractive force with upper and lower Cu acts, a c-axis length becomes shorter, and the unit cell becomes non-superconductor.

The non-superconductor seems to extend not only to the PrBCO but also to adjacent unit cells, and it seems that four unit cells adjacent to an ab plane change to non-superconductor. Therefore, it is considered that the 5 times degradation phenomenon, in which the characteristics deteriorate 5 times as much as the amount of Pr added, is confirmed.

As the coating solution with 20% or more of Pr, which are unstable in the previous report, three types of 20%, 22%, and 24% are formed in the examples described later. In the 5 times degradation phenomenon, the characteristic should theoretically be zero at 20%, but it is unknown whether there is a uniform 20% up to the atomic level. However, even if there is a region of 19%, no current will flow if one of the two conducting terminals is completely surrounded in a region of 20% or 21%. Obviously, at 22% or 24%, the amount of Pr is considered to exceed 20% even in the fine region, that is, a non-superconductor having a perovskite structure is formed.

If a superconductor with Pr exceeding 20% is formed, all the first to sixth problems of the laser scribing method will be solved. Although the laser scribing method is a historic technique, it has various physical weaknesses and no successful cases have been reported for large devices at this time. If the YBCO superconductor with 22% of PrBCO becomes non-superconducting by the TFA-MOD method and the YBCO superconductor is formed with the common perovskite structure with the same width of 100 μm that the laser scribing method realizes, the first to sixth problems discussed earlier will be solved.

As described above, according to the first embodiment, it is possible to provide an oxide superconductor having high mechanical strength and a method for manufacturing the same.

Second Embodiment

An oxide superconductor of the second embodiment is different from the oxide superconductor of the first embodiment in that the oxide superconductor is a superconducting resonator. Hereinafter, some descriptions of the contents that overlap with the first embodiment may be omitted.

Figure 11A:
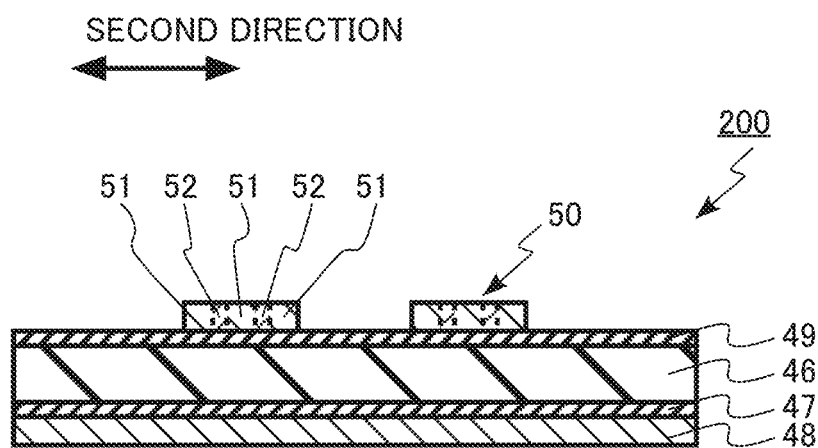
FIGS. 11A and 11B are schematic diagrams of an oxide superconductor of a second embodiment.
Figure 11B:
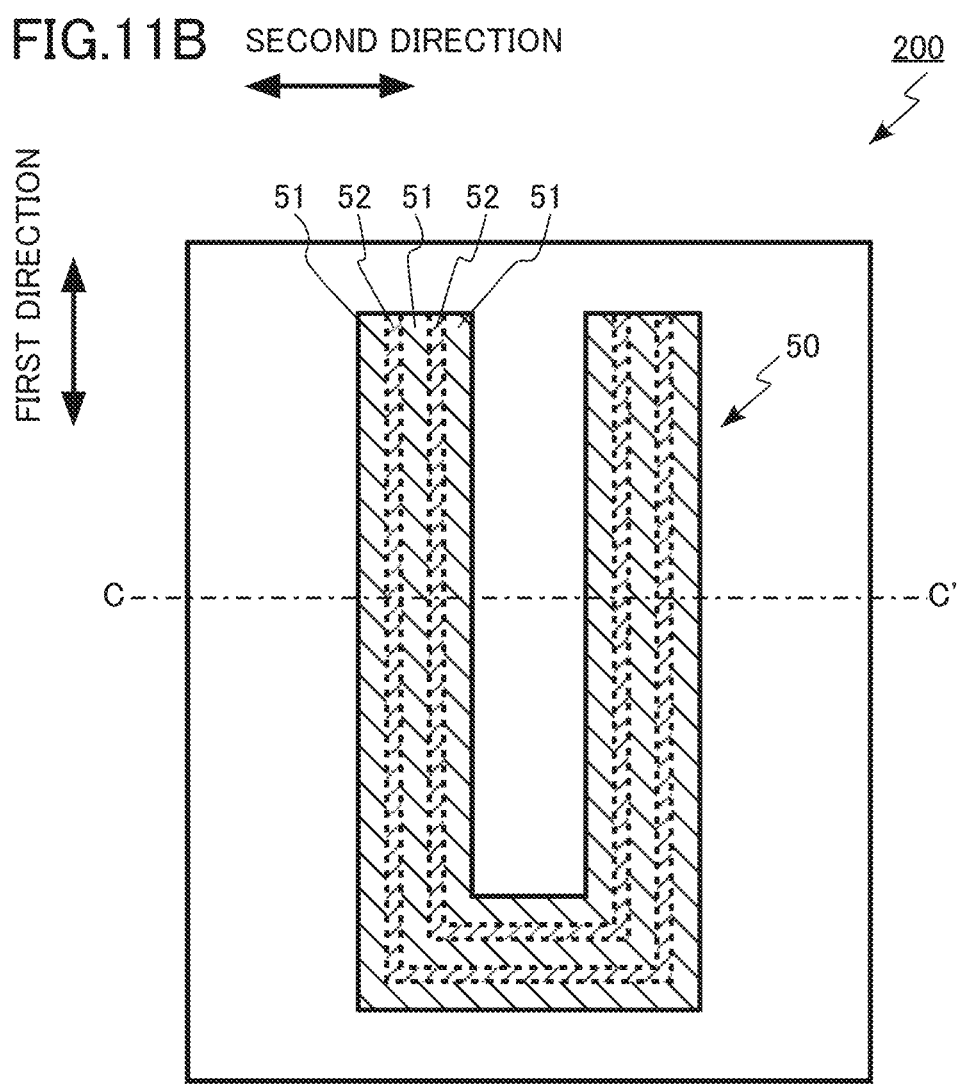

FIGS. 11A and 11B are schematic diagrams of an oxide superconductor of a second embodiment. FIG. 11A is a cross-sectional view, and FIG. 11B is a top view. FIG. 11A is a cross-sectional view taken along the line C-C' of FIG. 11B.

The oxide superconductor of the second embodiment is a superconducting resonator 200. The superconducting resonator 200 has a microstrip line structure. For example, a superconducting filter can be formed by combining a plurality of superconducting resonators 200.

The superconducting resonator 200 includes a substrate 46, a lower intermediate layer 47, a lower oxide superconducting layer 48, an upper intermediate layer 49, and an upper oxide superconducting layer 50.

The substrate 46 is provided between the upper oxide superconducting layer 50 and the lower oxide superconducting layer 48. The substrate 46 is, for example, a sapphire substrate. The lower intermediate layer 47 is provided between the substrate 46 and the lower oxide superconducting layer 48. The upper intermediate layer 49 is provided between the substrate 46 and the upper oxide superconducting layer 50. The lower intermediate layer 47 and the upper intermediate layer 49 are, for example, $CeO_2$.

The upper oxide superconducting layer 50 includes a plurality of superconducting regions 51 and a plurality of non-superconducting regions 52. At least a part of the superconducting region 51 and the non-superconducting region 52 extend in a first direction.

The upper oxide superconducting layer 50 is divided into the plurality of superconducting regions 51 with the non-superconducting region 52 therebetween.

A first rare earth element contained in the superconducting region 51 and a second rare earth element contained in the non-superconducting region 52 are, for example, the same. The first rare earth element and the second rare earth element are, for example, yttrium (Y).

Figure 12A:
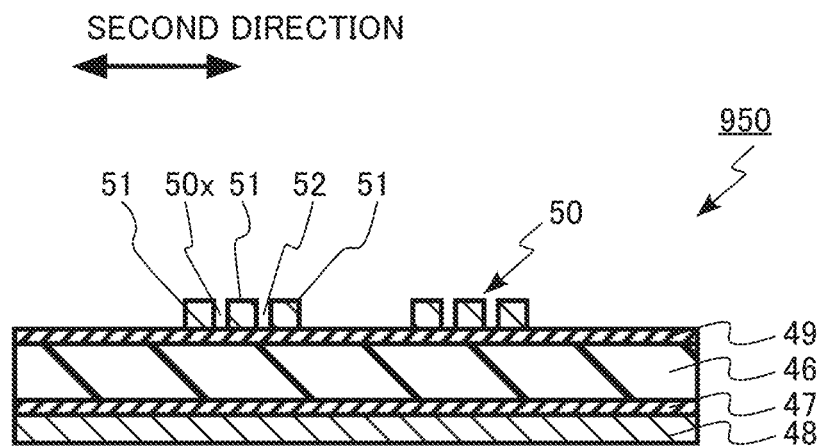
FIGS. 12A and 12B are schematic diagrams of an oxide superconductor of a comparative example of the second embodiment.
Figure 12B:
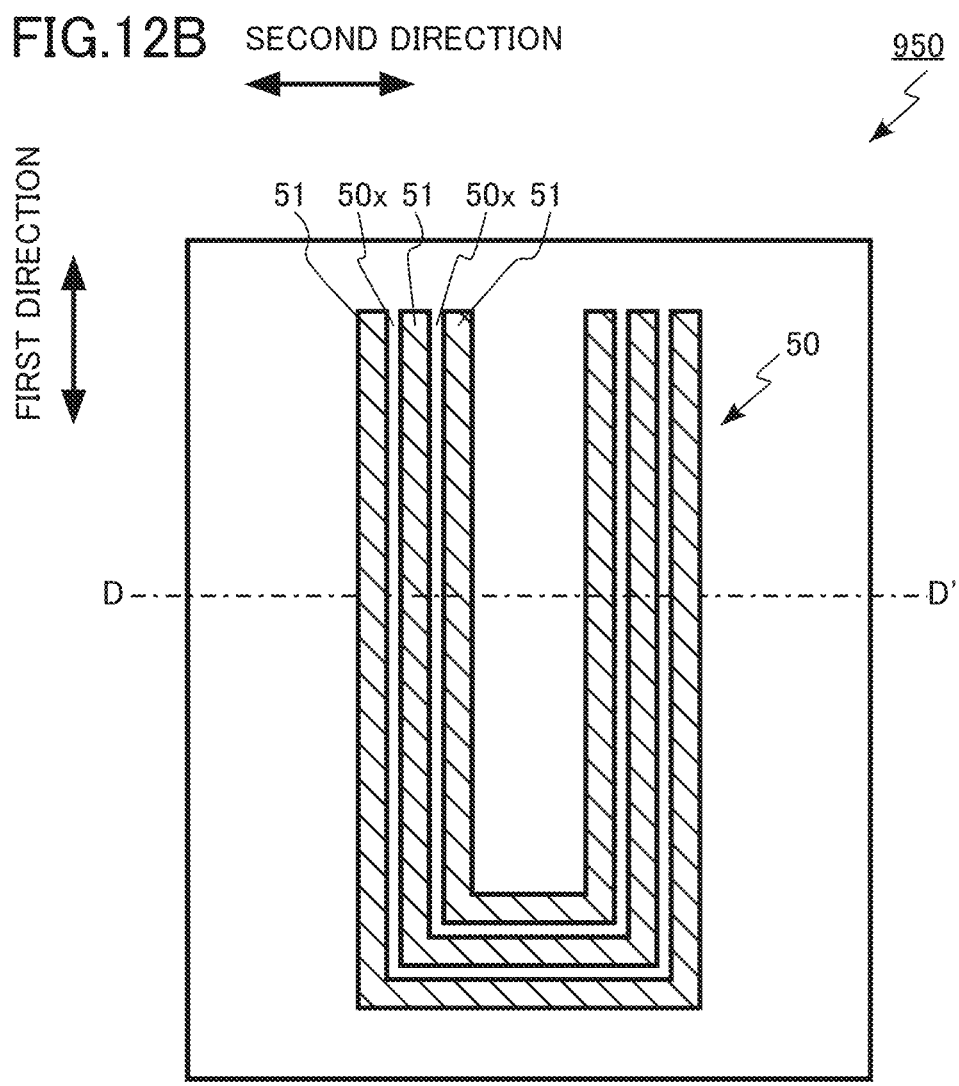

FIGS. 12A and 12B are schematic diagrams of an oxide superconductor of a comparative example of the second embodiment. FIG. 12A is a cross-sectional view, and FIG. 12B is a top view. FIG. 12A is a cross-sectional view taken along the line D-DT of FIG. 12B.

The oxide superconductor of the comparative example is a superconducting resonator 950. In the superconducting resonator 950 of the comparative example, the upper oxide superconducting layer 50 is divided into the plurality of superconducting regions 51. Therefore, an AC loss of the superconducting resonator 950 is reduced.

The superconducting resonator 950 of the comparative example differs from the superconducting resonator 200 of the second embodiment in that the upper oxide superconducting layer 50 does not include a non-superconducting region and a void 50x is provided between adjacent superconducting regions 51.

In the superconducting resonator 950 of the comparative example, for example, the upper oxide superconducting layer 50 is processed by ion milling to form a pattern. In the superconducting resonator 950, the void 50x is present between the superconducting regions 51 to reduce the mechanical strength of the upper oxide superconducting layer 50.

In the superconducting resonator 200 of the second embodiment, the non-superconducting region 52 is provided between the adjacent superconducting regions 51. Therefore, the mechanical strength of the superconducting resonator 200 of the second embodiment is higher than that of the superconducting resonator 950 of the comparative example.

As described above, according to the second embodiment, it is possible to provide the oxide superconductor having high mechanical strength.

Hereinafter, examples will be described.

EXAMPLES

In examples, a large number of metal acetates are mixed to prepare a solution or a superconductor having a perovskite structure. A Y-based superconductor is formed, but substitution substances are not used for Ba and Cu sites. Therefore, basically, the case where another substance or the like is contained only in the Y site will be described. The essential substitution substance is Pr. This is because the Pr is a substance that forms the non-superconducting layer by substituting only at the Y site. Other rare earth elements that enter the Y site and exhibit superconductivity can be expected to have the same effect when used in place of Y. Note that Y will be used as a typical example of a substance exhibiting superconductivity.

It is widely known that Y-based superconductors become the non-superconductor due to the substitution of the Y-site and Ba-site for some elements (La, Nd, and Sm) under different oxygen annealing treatment conditions after firing. The superconductor forms the perovskite structure of the number of oxygen 6.00 by firing, but the number of oxygen increases to 6.93 by subsequent oxygen annealing. It is widely known that the oxygen annealing is performed at a high temperature outside the proper temperature range, and the Y site and the Ba site are exchanged, resulting in Ba substitution. It is known that the likelihood to the Ba substitution depends on the ionic radius of the element entering the Y site, and La, Nd, and Sm having a large ionic radius, that is, having a small atomic number, are particularly II to be substituted with Ba. However, even after the substitution, a valence of Ba is 2, the La, Nd, and Sm are trivalent, and the perovskite structure is maintained as it is. Therefore, the entire perovskite structure does not collapse or some of the perovskite structure collapses. A (00n) peak position is almost the same in the XRD measurement, but FWHM of Rocking Curve is slightly expanded due to a plane distortion. In the examples, the case where Ba substitution is intentionally caused and the Ba site contains a rare earth element is not discussed, but even in this case, the discussion will proceed with the amount of the rare earth element substituted at the Y site.

Note that when the perovskite structure is formed, only the Y site is a trivalent cation, and other Ba and Cu are divalent cation. In that case, the perovskite structure is formed, but for example, when the temperature is as high as 800° C. like Tb, that is, when divalent cations are formed during firing, the perovskite structure is not formed. The Sm is divalent and trivalent, and the perovskite structure is formed in trivalent. On the other hand, the Pr is trivalent at 800° C., but is thought to be tetravalent when cooled. In that case, the perovskite structure is formed, but it is considered that the superconducting current does not flow on a CuO surface.

In the examples, the perovskite structure that is the non-superconducting region is to substitute the Pr by 20% or more at the Y site. The Pr can be synthesized in amount of 18%, 20%, 22%, and 24% without the coating solution being precipitated or decomposed, but only three cases of 20%, 22%, and 24% of Pr can form non-superconductivity while having the perovskite structure. When the amount of Pr is 27%, 30% and 40% of substitution, the coating solution is precipitated due to a decomposition reaction during synthesis. If the precipitation occurs, the TFA-MOD method will not work. This is because the MOD method generally assumes that each metal ion uniformly forms a film from a uniform solution, and therefore it is not possible to form a film from a solution in which the assumption collapses.

The previous patent application of the inventor mainly reported the solution synthesis or sample with 10% of Pr. The solution tends to be precipitated around 20%, and the stable coating solution cannot be obtained, so the report up to 10% is made. This time, it is considered that the fact that the coating solution is stably obtained and reported at higher concentrations of 22% and 24% of Pr, including 20% is that the purity of praseodymium acetate which is a raw material is improved.

An ionic radius of praseodymium is considerably larger than that of trivalent cations, which are rare earth elements, due to a lanthanoid contraction phenomenon. Moreover, an atomic weight is small. The large size and small atomic weight indicate that the bonding force is small, which causes easy decomposition during the synthesis of the coating solution. In fact, in the coating solution synthesis, when trying to synthesize a coating solution of a substance that completely substituting Y, the Sm, Nd, and La are easily decomposed, and we need to perform related research because a special method is required.

If an unstable substance is used in the solution to be synthesized and another impurity is contained, the decomposition reaction is promoted. This seems to be the reason why the coating solution containing around 20% of Pr was unstable in the past. It is highly, possible that the YBCO coating solution containing 20% or more of Pr can be stably synthesized this time is related to high purification of raw materials.

In relation to the threshold value of the Pr amount, in the case of the Sm with a smaller trivalent ionic radius, no precipitate is formed in the coating solution even if it is substituted up to around 50%. In the paper report, there is a result report that SmBCO is mixed with YBCO at about 30%, but this result is the case where the coating solution is not highly purified.

Similar structures of inventions can be made by using other rare earth elements such as Dy and Ho that exhibit superconductivity at the Y sites of the superconducting region and the non-superconducting region. Even if the Pr is 20% or more, it functions as the non-superconducting region. The PS-SIG method (Japanese Patent No. 6479251) is a method that enables the use of stable elements such as Y in the matrix layer. Therefore, the rare earth elements that can substitute Y are elements with atomic numbers larger than Sm, such as Dy and Ho. As described above, Tb seems to be trivalent during the synthesis of the coating solution, but seems to be divalent during firing, so the perovskite structure is not formed. Therefore, Tb is also excluded from candidates for forming a superconductor by substituting Y. However, a small amount of impurities should always be mixed with rare earth elements, and the perovskite structure is formed without any problem even if an amount of Tb and the like which is thought to be less than 1% is mixed. Therefore, it seems that there is no problem even if a small amount of divalent substance is present.

There is no problem even if the clustered atomically substituted artificial pin (CARP) (Japanese Patent No. 6374365, Japanese Patent No. 6556769) is formed in a portion that becomes the superconducting region. The CARP is a technology for forming a non-superconducting clustered region with a length of about 5 to 10 nm in a superconductor matrix. However, the portion other than the non-superconducting clustered region is almost YBCO superconductor.

The La, Nd, and Sm are used in the CARP formation, out the amount of CARP is 40% or less. For example, in the case of Tm-CARP, the elements formed by the substitution at the Y site are Pr, Sm, and Tm, but the total of Pr and Sm with a large radius is 20% or less, and Tm with a small radius is also 20% or less. When forming by a general method, for example, Pr:Sm=1:1, the amount of Pr is 10% or less. With the CARP formation, the c-axis length of the YBCO containing the Pr seems to slightly change in a length direction. In the case of the Tm-CARP, in the c-axis length, Tm changes to the shorter c-axis and Pr and Sm change to the longer side. However, Pr contributes to the shorter c-axis length from trivalent to tetravalent, and there was almost no change in the c-axis length as a whole.

The change in the c-axis length of the YBCO film containing 22% of Pr was extremely small. It is generally said that the (006) peak position when the CARP-containing YBCO film is measured by $2\theta/\omega$ XRD measurement and the (006) peak position of SmBCO are 46.68° and 46.53°, respectively. This value is a very small angle, and therefore may vary depending on the measuring device, and is necessary to discuss by the measurement device. However, the difference between the YBCO mixed with 22% of Pr which is obtained in the examples and the (006) peak position of the normal YBCO is 0.02°. The difference between the YBCO and the SmBCO is 0.15°, which is a slight difference. The PrBCO is this value when it changes to tetravalent, but even if the perovskite structure is trivalent at the time of formation and the c-axis length is long, the formation itself is possible because the perovskite structure is actually formed. At the time of the structure formation of the example, the c-axis length difference is closer to the parent phase YBCO, and it seems that the Pr exists stably. Since the c-axis length changes in YBCO substituted by 22% of Pr, it seems to be treated as almost YBCO.

In carrying out the examples, it is known that a gel film is formed and burned in a calcining furnace to decompose organic components and form oxide fluoride, which is then fired and oxygen-annealed to form a superconducting layer. The first is the formation of a gel film. However, a meniscus portion is formed between the coating solution and the substrate as in the die coating method, the gel film is formed by moving the substrate and is formed into a calcining film by calcining, and fired and oxygen-annealed to form the superconductor. By setting a width of a discharge port of the coating solution to 100 μm in the formation of the meniscus portion, it is possible to form a region containing 20% of Pr, which is a non-superconducting region. By setting the width of the YBCO superconducting formation region to 400 μm at the same time as the film formation, the same AC loss reduction effect as the conventional laser scribing method can be expected. Regarding the film formation method of the gel film, there is not much difference between the film formation on a single crystal using a dip coat or the like and the film formation method on a metal tape with an intermediate layer by the film formation method applying the die coating method which is a continuous method. This is because the gel film forming method is a method for forming using a meniscus portion.

The obtained gel film is calcined by a continuous furnace or the like. The calcining reaction mainly decomposes organic components at 400° C. or lower, in particular, at 200 to 250° C. under normal pressure. The substance obtained by the calcining is oxide fluoride in which oxides and fluorides are mixed. There is almost no difference in this reaction between the single crystal and the metal tape on which the oxide intermediate layer is formed. This is because the calcining process decomposes organic matter by overheating, and the underlying substrate does not affect the reaction.

The obtained calcining film is fired and oxygen-annealed to form the superconducting layer. In this process, for the first time, there is a difference between the film formation on the single crystal and on the metal with the intermediate layer. Regarding the firing, it is indirectly known that the TFA-MOD method forms a quasi-liquid phase with all metal elements and hydrogen, oxygen, and fluorine. The unit cell is supplied from the quasi-liquid phase to the growth interface where the unit cells are lattice-matched. At the initial growth interface, a single crystal is the outermost surface of the substrate, and in the metal tape with the intermediate layer, the $CeO_2$ intermediate layer which is often used on the outermost surface becomes the outermost surface. The unit cell that is lattice-matched is formed on the $CeO_2$ intermediate layer, but a delta of the surface of the single crystal substrate is around 0.2° and faces the same direction, but on the metal substrate, the delta $\varphi$ is around 5° although it depends on the alignment layer formation method and the number of repetitions. In the case of the TFA-MOD method, since the superconductor is formed so as to be transferred to the upper portion, the delta $\varphi$ of the superconducting layer also has almost the same value. The smaller the value of delta $\varphi$, the higher the superconducting characteristics.

A protective layer is immediately formed on the formed superconductor. For example, in order to improve contactability, there is a wire in which 1 μm thick silver is deposited and 20 μm of copper is deposited thereon. Furthermore, the outside is reinforced with SUS tape or the like to complete the superconducting wire. Herein, since the superconducting layer is being discussed, the discussion of the film-forming layer above the superconducting layer will be omitted.

In this way, the crystallographically single perovskite structure is formed, 20% or more of Pr is partially present, and the non-superconductor is formed by a 5 times degradation phenomenon. A superconductor having 15% or less of Pr is formed in the other region. One of the embodiments is to reduce the AC loss. In this case, it is often used in a magnetic field, and it seems that the CARP is often formed in the superconducting region in order to avoid the influence of the magnetic field. For example, the Tm-CARP has a structure in which Tm is substituted by 4% and Pr and Sm are substituted by 2% at the Y site. The formed CARP has a size of about 10 nm, and the superconductor is divided into the non-superconducting region of 20% or more of Pr at a length of several cm on a single crystal substrate as in the embodiment, and for example, at a length of 500 m in the case of the film formation on the metal tape. Moreover, the structure has solved the first to sixth problems as compared with the method formed by the laser scribing method mentioned above.

The extent to which the substance moves to the peripheral region during the formation of the gel film will be described below. The TFA-MOD method is a method in which the substance hardly moves in the horizontal direction after the gel film is formed. This is because the gel film contains trifluoroacetic acid salt, and contains fluorine which has the strongest electronegativity of 4.0 among all elements, and at the time of forming the gel film, methanol of the solvent contains hydrogen and cannot move due to the presence of many hydrogen bonds. After the gel film is formed, it is more difficult to move, and it becomes the level of whether or not it can move 1 nm in the horizontal direction.

When the gel film is calcined, the fluoride oxide is formed, but an attractive force is generated by the positively charged metal element and a strong coulomb force. Therefore, each element cannot move in the horizontal direction even during the calcining process from the gel film to the calcining film. It is easily estimated that it can move several nm.

In the TEA-MOD method, after the gel film is formed, the substance moves most easily during the firing. Since the quasi-liquid phase is formed during the firing, each ion can move to some extent in the quasi-liquid phase that emits the superconducting unit cell. However, this quasi-liquid phase is formed, and the temperature at which the superconductivity can form a film in the unit cell is 725° C., and the film formation temperature of 750 to 800° C. is a condition that the temperature is only a little high. Therefore, it is also known that the quasi-liquid phase has high viscosity and low fluidity, and the calcining film cracks having a width of several tens of nm are maintained as they are to form the superconducting film. Therefore, the moving distance in the horizontal direction is estimated to be about several nm. In addition, it is considered that the movement of substances between a portion containing a large amount of Pr and a portion not containing a large amount of Pr is about 100 nm at the maximum.

The firing is often performed at 750 to 800° C., which is the lowest temperature at which the quasi-liquid phase is formed, in order to avoid the damage to the metal tape. Since the film formation on the metal protects the alignment layer of the $CeO_2$ intermediate layer on the outermost surface of the metal layer, it cannot be fired at a temperature of 800° C. or higher. Therefore, the mutual diffusion distance is estimated to be about 100 nm in the horizontal direction, or is estimated to be 1 μm equivalent to the film thickness in the worst case.

From the above discussion, the width of 100 μm for reducing the AC loss formed by the laser scribing method, which has been studied from the past, is considered to function effectively even in the structure in which the perovskite structure formed by this method is continuous, from a trial calculation that the mutual diffusion region is less than 1 μm. Even if there is mutual diffusion of 1 μm, when the non-superconducting region is formed at a width of 100 μm, the minimum width is 98 μm and the effect is small.

In addition, the same applies for the superconducting region. The width of the superconducting region is 400 μm, but even if the non-superconducting region is diffused on both sides of 1 μm, the width of the superconductor will be 398 μm. The characteristic deterioration is only 0.5%. Therefore, it is clear that almost the same AC loss reduction effect can be obtained if the non-superconducting region is formed at the same width.

On the other hand, it is a very excellent structure to be formed. First of all, the substances other than the perovskite structure, which is the first problem, are not formed in the first place. In the laser scribing method of the comparative example, the substance is decomposed and removed at a high temperature. Therefore, it is expected that $Y_2O_3$ and CuO, which are decomposition products, are naturally formed in the vicinity thereof. In a planted-shared-insulator (PSI) method of the embodiment, the decomposition products are not formed in the first place, and the first problem is solved.

The second problem is the heating of the intermediate layer, the peeling due to the difference in coefficient of thermal expansion, or the formation of a starting point that is the cause of the peeling. However, in the PSI method, the non-superconducting layer is formed without overheating after the superconductor is formed, so the second problem does not exist in the first place.

The third problem is that the alignment layer is lost or almost lost due to the deterioration in the underlying intermediate layer, and the peeling from the upper layer is likely to occur. This also does not cause any problems with the PSI method. This is because as discussed above, the non-superconducting layer is formed at the same time as the firing, and the laser irradiation that is a cause of heating is not performed after the superconducting layer is formed. Therefore, the third problem is also solved.

The fourth problem, the debris, is not formed in the first place. This is because the PSI method does not remove substances by the ablation in the first place, and thus there are no substances scattered after the formation of superconductivity. Even so, since the non-superconducting region is formed, the structure capable of reducing the AC loss can be obtained.

The fifth problem, the recess, is not formed in the first place. This is because the PSI method does not remove substances by the ablation in the first place. Therefore, a smooth structure is formed, and a structure capable of reducing the AC loss can be obtained.

The sixth problem, the physically damaged structure, does not exist in the PSI method. In the laser scribing method, for example, if a line width of 4 mm is divided into eight and the wire is divided every 0.5 mm, the region where the perovskite structure is continuous becomes 0.50 mm at the maximum. Moreover, the non-superconductor CuO or $Y_2O_3$ is present at the end of the superconducting region, and still a damaged structure when coiled.

One of the AC loss reduction structures is formed by the PSI method, but even if the superconducting wire with a width of 4 mm is divided into eight by the PSI method, the region where the perovskite structure is continuous remains 4 mm. Moreover, it is known from the XRD measurement that the c-axis lengths are almost the same, and it is clear that the structure is very stable.

From the above, the PSI method is a new technology that can realize the structure that realizes reduction of the AC loss while simultaneously solving the first to sixth problems.

Example 1

According to the flowchart illustrated in FIG. 3, ten types of coating solutions for superconductors are synthesized and purified. As five types of coating solutions to be first synthesized, powders of each hydrate of 98% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

These coating solutions were dissolved in ion-exchanged water at a metal ion molar ratio of 0.00:1.00:2:3, 0.10:0.90:

2:3, 0.15:0.85:2:3, 0.20:0.80:2:3, 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 1Mi-low-$Pr_{0.00}Y_{1.00}BCO$ (substance described in Example 1, Pr with low purity, 0% Pr, 100% Y Material with impurity), 1Mi-low-$Pr_{0.10}Y_{0.90}BCO$, 1Mi-low-$Pr_{0.15}Y_{0.85}BCO$, 1Mi-low-$Pr_{0.20}Y_{0.80}BCO$, 1Mi-low-$Pr_{0.22}Y_{0.78}BCO$ were obtained.

About 7 wt. % of water or acetic acid, which is reaction by-products during solution synthesis, was contained in the obtained translucent blue substances 1Mi-low-$Pr_{0.00}Y_{1.00}BCO$, 1Mi-low-$Pr_{0.10}Y_{0.90}BCO$, 1Mi-low-$Pr_{0.15}Y_{0.85}BCO$, 1Mi-low-$Pr_{0.20}Y_{0.80}BCO$, and 1Mi-low-$Pr_{0.22}Y_{0.78}BCO$. 20 times by weight of anhydrous methanol was added to translucent blue substances 1Mi-low-$Pr_{0.00}Y_{1.00}BCO$, 1Mi-low-$Pr_{0.10}Y_{0.90}BCO$, 1Mi-low-$Pr_{0.15}Y_{0.85}BCO$, 1Mi-low-$Pr_{0.20}Y_{0.80}BCO$, and 1Mi-low-$Pr_{0.22}Y_{0.78}BCO$ and dissolved to obtain the coating solution, but when 1Mi-low-$Pr_{0.20}Y_{0.80}BCO$, and 1Mi-low-$Pr_{0.22}Y_{0.78}BCO$ are dissolved in methanol, a large amount of opaque greenish white precipitate occurred, and therefore, the experiment was stopped. Other substances did not form a precipitate even when dissolved in methanol, 1CSi-low-$Pr_{0.00}Y_{1.00}BCO$ (coating solution described in Example 1, Pr with low purity, 0% Pr, 100% Y Material with impurities), 1CSi-low-$Pr_{0.10}Y_{0.90}BCO$, and 1CSi-low-$Pr_{0.15}Y_{0.85}BCO$ were each obtained.

When the coating solutions 1CSi-low-$Pr_{0.00}Y_{1.00}BCO$, 1CSi-low-$Pr_{0.10}Y_{0.90}BCO$, and 1CSi-low-$Pr_{0.15}Y_{0.85}$ BCO were stored for 12 hours, the opaque greenish white precipitate occurred in the coating solution 1CSi-low-$Pr_{0.15}Y_{0.85}BCO$, and therefore, the experiment was stopped.

According to the flowchart illustrated in FIG. 3, other five types of coating solutions were synthesized and produced. Powders of each hydrate of 99% purity of $Pr(OCOCH_3)_3$, 99° purity of $Y(OCOCH_3)_3$, 99% purity of $Ba(OCOCH_3)_2$, and 99% purity of $Cu(OCOCH_3)_2$ in metal acetate were used.

These coating solutions were dissolved in ion-exchanged water at a metal ion molar ratio of 0.00:1.00:2:3, 0.10:0.90:2:3, 0.15:0.85:2:3, 0.20:0.80:2:3, 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 1Mi-high-$Pr_{0.00}Y_{1.00}BCO$ (substance described in Example 1, Pr with high purity, 0% Pr, 100% Y Material with impurities), 1Mi-high-$Pr_{0.10}Y_{0.90}BCO$, 1Mi-low-$Pr_{0.15}Y_{0.85}BCO$, 1Mi-low-$P_{0.20}Y_{0.80}BCO$, and 1Mi-low-$Pr_{0.22}Y_{0.78}BCO$ were obtained. No coating solution was precipitated during solution synthesis on this side.

About 7 wt. % of water or acetic acid, which is reaction by-products during solution synthesis, was contained in the obtained translucent blue substances 1Mi-high-$Pr_{0.00}Y_{1.00}BCO$, 1Mi-high-$Pr_{0.10}Y_{0.90}BCO$, 1Mi-high-$Pr_{0.15}Y_{0.85}BCO$, 1Mi-high-$Pr_{0.20}Y_{0.80}BCO$, and 1Mi-high-$Pr_{0.22}Y_{0.78}BCO$. 20 times by weight of anhydrous methanol was added to 1Mi-high-$Pr_{0.00}Y_{1.00}BCO$, 1Mi-high-$Pr_{0.10}Y_{0.90}BCO$, 1Mi-high-$Pr_{0.15}Y_{0.85}BCO$, 1Mi-high-$Pr_{0.20}Y_{0.80}BCO$, and 1Mi-high-$Pr_{0.22}Y_{0.78}BCO$ and dissolved, and 1CSi-high-$Pr_{0.00}Y_{1.00}BCO$ (coating solution described in Example 1, Pr with high purity, 0% Pr, 100% Y Material with impurities), 1CSi-high-$Pr_{0.10}Y_{0.90}BCO$, 1CSi-high-$Pr_{0.15}Y_{0.85}BCO$, 1CSi-high-$Pr_{0.20}Y_{0.80}BCO$, and 1CSi-high-$Pr_{0.22}Y_{0.78}BCO$ were each obtained.

The purification (h in FIG. 3) is performed together with the coating solution obtained in advance. When 1CSi-low-$Pr_{0.00}Y_{1.00}BCO$, 1CSi-low-$Pr_{0.10}Y_{0.90}BCO$, 1CSi-high-$Pr_{0.00}Y_{1.00}BCO$, 1CSi-high-$Pr_{0.10}Y_{0.90}BCO$, 1CSi-high-$Pr_{0.15}Y_{0.85}BCO$, 1CSi-high-$Pr_{0.20}Y_{0.80}BCO$, and 1CSi-high-$Pr_{0.22}Y_{0.78}BCO$ were reacted and purified again under reduced pressure in a rotary evaporator for 12 hours, translucent blue substances 1M-low-$Pr_{0.00}Y_{1.00}BCO$ (substance described in Example 1, Pr with low purity, 0% Pr, 100% Y Material without impurity), 1M-low-$Pr_{0.10}Y_{0.90}BCO$, 1M-high-$Pr_{0.00}Y_{1.00}BCO$ (substance described in Example 1, Pr with high purity, 0% Pr, 100% Y Material without impurity), 1M-high-$Pr_{0.10}Y_{0.90}BCO$, 1M-high-$Pr_{0.15}Y_{0.85}BCO$, 1M-high-$Pr_{0.20}Y_{0.80}BCO$, and 1M-high-$Pr_{0.22}Y_{0.78}BCO$ were each obtained.

Translucent blue substances 1M-low-$Pr_{0.00}Y_{1.00}BCO$, 1M-low-$Pr_{0.10}Y_{0.90}BCO$, 1M-high-$Pr_{0.00}Y_{1.00}BCO$, 1M-high-$Pr_{0.10}Y_{0.90}BCO$, 1M-high-$Pr_{0.15}Y_{0.85}BCO$, 1M-high-$Pr_{0.20}Y_{0.80}BCO$, and 1M-high-$Pr_{0.22}Y_{0.78}BCO$ were dissolved in methanol (j in FIG. 3) and diluted using a volumetric flask, and each of the coating solutions 1CS-low-$Pr_{0.00}Y_{1.00}BCO$ (Example 1, coating Solution for 0% Pr, 100% Y perovskite structure, Pr with low purity), 1CS-low-$Pr_{0.10}Y_{0.90}BCO$, 1CS-high-$Pr_{0.00}Y_{1.00}BCO$ (Example 1, coating Solution for 0% Pr, 100% Y perovskite structure, Pr with high purity), 1CS-high-$Pr_{0.10}Y_{0.90}BCO$, 1CS-high-$Pr_{0.15}Y_{0.85}BCO$, 1CS-high-$Pr_{0.20}Y_{0.80}BCO$, and 1CS-high-$Pr_{0.22}Y_{0.78}BCO$ of 1.50 mol/l in terms of metal ions were obtained.

The coating solutions 1CS-$Pr_{0.00}Y_{1.00}BCO$, 1CS-low-$Pr_{0.10}Y_{0.90}BCO$, 1CS-high-$Pr_{0.00}Y_{1.00}BCO$, 1CS-high-$Pr_{0.10}Y_{0.90}BCO$, 1CS-high-$Pr_{0.15}Y_{0.85}BCO$, 1CS-high-$Pr_{0.20}Y_{0.80}BCO$, and 1CS-high-$Pr_{0.22}Y_{0.78}BCO$ were used, a film was formed on $LaAlO_3$ (100) oriented single crystal of a 10 mm×10 mm×0.50 mmt with an acceleration of 10000 rpm/s, a maximum rotation speed of 4000 rpm, and a holding time of 60 s using a spin coating method, and translucent blue gel films 1Gel-low-$Pr_{0.00}Y_{1.00}BCO$, (Example 1, Pr with low concentration, gel film of resulting 0% Pr, 100% Y films), 1Gel-low-$Pr_{0.10}Y_{0.90}BCO$, 1Gel-high-$Pr_{0.10}Y_{1.00}BCO$ (Example 1, Pr with high concentration, gel film of resulting 0% Pr, 100% Y films), 1Gel-high-$Pr_{0.10}Y_{0.90}BCO$, 1Gel-high-$Pr_{0.15}Y_{0.85}BCO$, 1Gel-high-$Pr_{0.20}Y_{0.80}BCO$, and 1Gel-high-$Pr_{0.22}Y_{0.78}BCO$ were each obtained.

The obtained gel films 1Gel-low-$Pr_{0.00}Y_{1.00}BCO$, 1Gel-low-$Pr_{0.10}Y_{0.90}BCO$, 1Gel-high-$Pr_{0.10}Y_{0.90}BCO$, 1Gel-high-$Pr_{0.10}Y_{0.90}BCO$, 1Gel-high-$Pr_{0.15}Y_{0.85}BCO$, 1Gel-high-$Pr_{0.20}Y_{0.80}BCO$, and 1Gel-high-$Pr_{0.22}Y_{0.78}BCO$ were immediately installed in a furnace filled with dry gas, the calcining was performed under a humidified pure oxygen atmosphere at 400° C. or lower with the profile illustrated in FIG. 6, and translucent brown calcining films 1Cal-low-$Pr_{0.00}Y_{1.00}BCO$ (Example 1, Pr with low concentration, calcined film of resulting 0% Pr, 100% Y films), 1Cal-low-$Pr_{0.10}Y_{0.90}BCO$, 1Cal-high-$Pr_{0.00}Y_{1.00}BCO$ (Example 1, Pr with high concentration, calcined film of resulting 0% Pr, 100% Y films), 1Cal-high-$Pr_{0.10}Y_{0.90}BCO$, 1Cal-high-$Pr_{0.15}Y_{0.85}BCO$, 1Cal-high-$Pr_{0.20}Y_{0.80}BCO$, and 1Cal-high-$Pr_{0.22}Y_{0.78}BCO$ were each obtained.

In the firing profile illustrated in FIG. 7, the calcining films 1Cal-low-$Pr_{0.00}Y_{1.00}BCO$, 1Cal-low-$Pr_{0.10}Y_{0.90}BCO$, 1Cal-high-$Pr_{0.00}Y_{1.00}BCO$, 1Cal-high-$Pr_{0.10}Y_{0.90}BCO$, 1Cal-high-$Pr_{0.15}Y_{0.85}BCO$, 1Cal-high-$Pr_{0.20}Y_{0.80}BCO$, and 1Cal-high-$Pr_{0.22}Y_{0.78}BCO$ were fired in 1000 ppm oxygen mixed argon gas at 800° C. and annealed in pure oxygen of 525° C. or lower, and oxide thin films 1F-low- $Pr_{0.00}Y_{1.00}BCO$ (Example 1, fired oxide films of $Pr_{0.00}Y_{1.00}BCO$, Pr with low concentration), 1F-low-$Pr_{0.10}Y_{0.90}BCO$, 1F-high-$Pr_{0.00}Y_{1.00}BCO$ (Example 1, fired oxide films of $Pr_{0.00}Y_{1.00}BCO$, Pr with high concentration), 1F-high-$Pr_{0.10}Y_{0.90}BCO$, 1F-high-$Pr_{0.15}Y_{0.85}BCO$, 1F-high-$Pr_{0.20}Y_{0.80}BCO$, and 1F-high-$Pr_{0.22}Y_{0.78}BCO$ were each obtained.

As a result of measuring each of the oxide thin films 1F-low-$Pr_{0.00}Y_{1.00}BCO$, 1F-low-$Pr_{0.10}Y_{0.90}BCO$, 1F-high-$Pr_{0.00}Y_{1.00}BCO$, 1F-high-$Pr_{0.10}Y_{0.90}BCO$, 1F-high-$Pr_{0.15}Y_{0.85}BCO$, 1F-high-$Pr_{0.20}Y_{0.80}BCO$, and 1F-high-$Pr_{0.22}Y_{0.78}BCO$ by a 2θ/ω method of XRD measurement, only a YBCO (00n) peak was confirmed, and CuO, $Y_2O_3$, $BaCuO_2$, or the like, which is a heterogeneous phase, was at a level where the difference from the background could not be discriminated. YBCO (006) was the strongest peak, and the peak of the heterogeneous phase was 1/1000 or less. There was no difference in the XRD phase identification results depending on the purity of the raw material Pr.

Superconducting characteristics of oxide thin films 1F-low-$Pr_{0.00}Y_{1.00}BCO$, 1F-low-$Pr_{0.10}Y_{0.90}BCO$, 1F-high-$Pr_{0.00}Y_{1.00}BCO$, 1F-high-$Pr_{0.10}Y_{0.90}BCO$, 1F-high-$Pr_{0.15}Y_{0.85}BCO$, 1F-high-$Pr_{0.2}Y_{0.80}BCO$, and 1F-high-$Pr_{0.22}Y_{0.78}BCO$ were each measured by an inductive method in liquid nitrogen under a self-magnetic field. In principle, the superconducting characteristics cannot be evaluated by the inductive method unless the superconductor exists in the region of about 6 mm in diameter in the superconducting film to be targeted. Therefore, the characteristics of only 4 to 6 points in the central portion can be obtained, but the highest value is the characteristic of the superconducting film. The obtained superconducting characteristics each were 6.77, 3.39, 6.81, 3.41, 1.72, 0.00, and 0.00 $MA/cm^2$ (77 K, 0 T).

The measurement results of the superconducting characteristics by the inductive method were based on the result of the 5 times degradation phenomenon, in which the characteristics decreased by about 5 times the amount of Pr added. That is, when 10% of Pr was added, the characteristics were reduced by about 50%, and when 15% of Pr was added, the characteristics were reduced by 75%. It was found that almost the same characteristics were obtained regardless of whether the purity of praseodymium acetate was 98% or 99% and that the deterioration in characteristics due to the 5 times degradation phenomenon was also almost the same. It was found that the characteristics of those with 20% and 22% of Pr could not be confirmed by the inductive method, and were non-superconducting.

Oxide thin films 1F-low-$Pr_{0.00}Y_{1.00}BCO$, 1F-low-$Pr_{0.10}Y_{0.90}BCO$, 1F-high-$Pr_{0.00}Y_{1.00}BCO$, 1F-high-$Pr_{0.10}Y_{0.90}BCO$, 1F-high-$Pr_{0.15}Y_{0.85}BCO$, 1F-high-$Pr_{0.20}Y_{0.80}BCO$, and 1F-high-$Pr_{0.22}Y_{0.78}BCO$ were deposited with silver having a width of 2 mm perpendicular to the 10 mm square diagonal direction of the film surface by an electron beam method and was subjected to heat treatment at 180° C. under pure oxygen, thereby improving the contactability between the deposited silver and the superconducting layer. Two terminals at both end portions are current terminals, and two terminals at a central portion are voltage terminals. The temperature of the sample was controlled by moving a metal plate directly disposed above liquid nitrogen up and down, and Tc measurement was performed with a current of 0.10 μA by a DC 4-probe method. To was determined on the basis of 1 μV/cm.

The obtained Tc values of oxide thin films 1F-low-$Pr_{0.00}Y_{1.00}BCO$, 1F-low-$Pr_{0.10}Y_{0.90}BCO$, 1F-high-$Pr_{0.00}Y_{1.00}BCO$, 1F-high-$Pr_{0.10}Y_{0.90}BCO$, and 1F-high-$Pr_{0.15}Y_{0.85}BCO$ each were 90.71, 90.68, 90.69, 90.73, and 90.65 K. Since the measurement error was 0.07 K of the semiconductor thermometer, the Tc value was almost the same. It was found that the oxide thin films 1F-high-$Pr_{0.20}Y_{0.80}BCO$ and 1F-high-$Pr_{0.22}Y_{0.78}BCO$ did not undergo superconducting transition and were non-superconductor at least between the connected terminals.

It was found from the results of the XRD phase identification, the inductive method, and the DC 4-probe method that the oxide thin films 1F-high-$Pr_{0.20}Y_{0.80}BCO$ and 1F-high-$Pr_{0.22}Y_{0.78}BCO$ are a non-superconducting layer that has the same perovskite structure as YBCO but has zero superconducting characteristics due to the 5 times degradation phenomenon of Pr. It was found for the first time that the 5 times degradation phenomenon of Pr is a phenomenon that is applied even if the amount of Pr exceeds 20%.

A solution with 10% of Pr was realized in the previous invention and a patent application has been filed. The PS-SIG method is used to make Pr exist stably. However, it was found that the precipitation is likely to occur when the purity of Pr is as low as 98%. Originally, Pr is a single substance from the size of the ionic radius during solution synthesis, and a substance decomposed when trying to synthesize a PrBCO solution. The suppression was realized by the PS-SIG method, which performs partial stabilization by mixing with Y. When the purity of Pr is as low as 98%, the contained impurities may act during solution synthesis and have the effect of decomposing. When the purity of Pr is 99%, a 22% Pr-substituted YBCO solution is obtained without precipitation. However, even if the purity is further improved in advance, it is considered that the concentration of Pr cannot be increased by more than 22% because Pr is originally a substance having a large ionic radius and easily decomposed. This is because the inherent mixing limit of Pr should exist.

There was no difference in the phase identification results and the superconducting characteristic results by the inductive method regardless of whether the purity of Pr was 98% or 99%. The amount of impurities is 2% and 1%, and it is unknown what the impurities are, but it seems that the impurities are not substances that show a 5 times degradation phenomenon like PrBCO. In other words, it seems that the substances that caused the decomposition did not form the common perovskite structure. The purity of Pr seems to be related to the decomposition during the solution synthesis, that is, the presence or absence of precipitation.

Examples of overlapping YBCO and PrBCO, and attempts to form the film have been reported for a long time. For example, in the Josephson junction, the YBCO is formed once, and then the PrBCO is formed, and an attempt is made to produce a junction portion between superconductivity and non-superconductivity. However, as described above, the YBCO and PrBCO are substances with extremely different optimum oxygen partial pressure at the same film formation temperature. For example, the optimum oxygen partial pressure at 800° C. is 1000 ppm and 1 ppm, and is 500 ppm and 0.5 ppm which is a half of the above value at 775° C. It is known that the optimum oxygen partial pressure is halved every 25° C. The oxygen partial pressures of the YBCO and PrBCO have 1000-fold difference.

When the YBCO is formed by the PLC method or the MOCVD method, which is a vacuum physical vapor deposition method, the allowable oxygen partial pressure is at most twice as much as 500 ppm to 2000 ppm. Moreover, a considerably poor quality YBCO layer is formed at 500 ppm. Therefore, the YBCO and PrBCO are formed under different conditions, and each cannot have a bond in the perovskite structure.

In the TEA-MOD method, the quasi-liquid phase grows, and the growth interface where the unit cells are released is in a state of precipitated into the bottom of the quasi-liquid phase. Since the control of the oxygen partial pressure is outside the quasi-liquid phase and the oxygen partial pressure does not significantly affect the growth interface, the perovskite structure in which the YBCO and PrBCO are mixed can be obtained. In the previous application, the YBCO with 10% Pr substitution has been reported.

Under the conditions of the previous application, the purity of Pr was as low as 98%, so the limit of Pr that could be substituted at the Y site was 10%, and the coating solution was precipitated at a higher concentration. It is certain that the decomposition of Pr in the PS-SIG method was further suppressed by improving the purity of Pr to 99%, and the YBCO and PrBCO exceeding 20% coexist in the obtained perovskite structure. This is the first report of an unprecedented structure. At the same time, it is the first report that it was confirmed that the 5 times degradation phenomenon of Pr is applied even with 20% or 22% of Pr and thus becomes the non-superconductor.

Example 2

According to the flowchart illustrated in FIG. 3, two types of coating solutions for superconductors are synthesized and purified. Powders of each hydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

These coating solutions were dissolved in ion-exchanged water at a metal ion molar ratio of 0.00:1.00:2:3 and 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 2Mi-$Pr_{0.00}Y_{1.00}BCO$ (substance described in Example 2, 0% Pr, 100% Y Material with impurity) and 2Mi-$Pr_{0.22}Y_{0.78}BCO$ were obtained.

About 7 wt. % of water or acetic acid which is reaction by-products during solution synthesis was contained in the obtained translucent blue substances 2Mi-$Pr_{0.00}Y_{1.00}BCO$ and 2Mi-$Pr_{0.22}Y_{0.78}BCO$. 20 times by weight of anhydrous methanol was added to translucent blue substances 2Mi-$Pr_{0.00}Y_{1.00}BCO$ and 2Mi-$Pr_{0.22}Y_{0.78}BCO$ and dissolved, and the coating solutions 2CSi-$Pr_{0.00}Y_{1.00}BCO$ (coating solution described in Example 2, 0% Pr, 100% Y Material with impurity), and 2CSi-$Pr_{0.22}Y_{0.78}BCO$ were each obtained.

When the obtained coating solutions 2CSi-$Pr_{0.00}Y_{1.00}BCO$ and 2CSi-$Pr_{0.22}Y_{0.78}BCO$ were reacted and purified again under reduced pressure in a rotary evaporator for 12 hours, translucent blue substances 2M-$Pr_{0.00}Y_{1.00}BCO$ (substance described in Example 2, 0% Pr, 100% Y Material without impurity) and 2M-$Pr_{0.22}Y_{0.78}BCO$ were each obtained.

Translucent blue substance 2M-$Pr_{0.00}Y_{0.00}BCO$ and 2M-$Pr_{0.22}Y_{0.78}BCO$ were dissolved in methanol (j in FIG. 3) and diluted using a volumetric flask, and each of the coating solutions 2CS-$Pr_{0.00}Y_{1.00}BCO$ (Example 2, coating solution for 0% Pr, 100% Y perovskite structure) and 2CS-$Pr_{0.22}Y_{0.78}BCO$ of 1.50 mol/l in terms of metal ions were obtained.

Coating solutions 2CS-$Pr_{0.00}Y_{1.00}BCO$ and 2CS-$Pr_{0.22}Y_{0.78}BCO$ were used, two films were each formed on a $LaAlO_3$ (100) oriented single crystal of 10 mm×10 mm×0.50 mmt at an acceleration of 10000 rpm/s, a maximum rotation speed of 4000 rpm, and a holding time of 60 s using a spin coating method, and translucent blue gel films 2Gel-$Pr_{0.00}Y_{1.00}BCO$-1 (Example 2, gel film of resulting 0% Pr, 100% Y films, sample number 1), 2Gel-$Pr_{0.00}Y_{1.00}BCO$-2, 2Gel-$Pr_{0.22}Y_{0.78}BCO$-3 (Example 2, gel film of resulting 0% Pr, 100% Y films, sample number 1), and 2Gel-$Pr_{0.22}\&_{0.78}BCO$-4 were each obtained. This gel film is a film formation condition in which the film thickness becomes 150 nm after firing.

Separately from the above, coating solutions 2CS-$Pr_{0.00}Y_{1.00}BCO$ and 2CS-$Pr_{0.22}Y_{0.78}BCO$ were used, coating solution 2CS-$Pr_{0.00}Y_{1.00}BCO$ dropped onto one side from a center during film formation on a $LaAlO_3$ (100) oriented single crystal substrate of 10 mm×25 mm×0.50 mmt by the spin coating method and coating solution 2CS-$Pr_{0.22}Y_{0.78}BCO$ dropped onto the other side, spin coating was started at the moment when the central portion was mixed, and a translucent blue gel film 2Gel-$Pr_{0.00}Y_{1.00}BCO+Pr_{0.22}Y_{0.78}BCO$-C (Example 2, gel film of resulting 0% Pr, 100% Y films and 22% Pr, 78% Y films, chimera) was obtained. The film formation conditions are an acceleration of 10000 rpm/s, a maximum rotation speed of 4000 rpm, and a holding time of 60 s.

The boundary at the central portion of the spin coat of translucent blue gel film 2Gel-$Pr_{0.000}Y_{1.00}BCO+Pr_{0.22}Y_{0.78}BCO$-C cannot be visually discriminated.

The obtained gel films 2Gel-$Pr_{0.00}Y_{1.00}BCO$-1, 2Gel-$Pr_{0.00}Y_{1.00}BCO$-2, 2Gel-$Pr_{0.22}Y_{0.78}BCO$-3, and 2Gel-$Pr_{0.22}Y_{0.78}BCO$-4, 2Gel-$Pr_{0.10}Y_{1.00}BCO+Pr_{0.22}Y_{0.78}BCO$-C were immediately installed in a furnace filled with dry gas, the calcining was performed under a humidified pure oxygen atmosphere at 400° C. or lower with the profile illustrated in FIG. 6, and translucent brown calcining films 2Cal-$Pr_{0.00}Y_{1.00}BCO$-1 (Example 2, calcined film of resulting 0% Pr, 100% Y films, sample number 1), 2Cal-$Pr_{0.00}Y_{1.00}BCO$-2, 2Cal-$Pr_{0.22}Y_{0.78}BCO$-3, and 2Cal-$Pr_{0.22}Y_{0.78}BCO$-4, and 2Cal-$Pr_{0.00}Y_{1.00}BCO+Pr_{0.02}Y_{0.78}BCO$-C were each obtained.

In the firing profile illustrated in FIG. 7, the calcining films 2Cal-$Pr_{0.00}Y_{1.00}BCO$-1, 2Cal-$Pr_{0.00}Y_{1.00}BCO$-2, 2Cal-$Pr_{0.22}Y_{0.78}BCO$-3, 2Cal-$Pr_{0.22}Y_{0.78}BCO$-4, and 2Cal-$Pr_{0.00}Y_{1.00}BCO+Pr_{0.22}Y_{0.78}BCO$-C were fired in 1000 ppm oxygen mixed argon gas at 800° C. and annealed in pure oxygen of 525° C. or lower, and oxide thin films 2F-$Pr_{0.00}Y_{1.00}BCO$-1 (Example 2, fired oxide films of $Pr_{0.00}Y_{1.00}BCO$, sample number 1), 2F-$Pr_{0.00}Y_{1.00}BCO$-2, 2F-$Pr_{0.22}Y_{0.78}BCO$-3, 2F-$Pr_{0.22}Y_{0.78}BCO$-4, and 2F-$Pr_{0.00}Y_{1.00}BCO+Pr_{0.22}Y_{0.78}BCO$-C were each obtained.

As a result of measuring each of the central portions of the oxide thin films 2F-$Pr_{0.00}Y_{1.00}BCO$-1, 2F-$Pr_{0.0}Y_{1.00}BCO$-2, 2F-$Pr_{0.22}Y_{0.78}BCO$-3, and 2F-$Pr_{0.22}Y_{0.78}BCO$-4 by a 2θ/ω method of XRD measurement, only a YBCO (00n) peak was confirmed, and CuO, $Y_2O_3$, $BaCuO_2$ or the like, which is a heterogeneous phase, was at a level where the difference from the background could not be discriminated. YBCO (006) was the strongest peak, and the peak of the heterogeneous phase was ⅟1000 or less. There was no difference in the XRD phase identification results depending on the purity of the raw material Pr.

Superconducting characteristics of oxide thin films 2F-$Pr_{0.00}Y_{1.00}BCO$-1, 2F-$Pr_{0.00}Y_{1.00}BCO$-2, 2F-$Pr_{0.22}Y_{0.78}BCO$-3, and 2F-$Pr_{0.22}Y_{0.78}BCO$-4 were each measured by an inductive method in liquid nitrogen under a self-magnetic field. FIGS. 13A and 13B are diagrams illustrating measurement results of superconducting characteristics on maps of oxide thin films 2F-$Pr_{0.00}Y_{1.00}$BCO-1 and 2F-$Pr_{0.00}Y_{1.00}$BCO-2.

The measurement of the superconducting characteristics by the inductive method is made by a combination of a single magnetic field generating rod and a third harmonic wave detector. If the other side superconductor has the effect of canceling the applied magnetic field, the oxide thin film is in the superconducting state, the third harmonic wave is generated, and the superconducting characteristics can be measured non-destructively by the detection. Of course, a signal will be output even if this is not the case, but if a waveform deviates from a standard state or the detection voltage does not become zero when a magnetic field is applied, it is treated as non-superconducting.

For the generation and detection of the third harmonic wave, a region with a diameter of 6 mm on the superconductor side is required, and in this method for measuring each 10 mm sample by moving a rod at a pitch of 2 mm, data of up to 3 points on one side is not lined up.

The measurement result of the oxide thin film 2F-$Pr_{0.00}Y_{1.00}$BCO-1 is illustrated in FIG. 13A, and 7 points with Jc values (MA/$cm^2$, 77 K, 0 T) from 6.43 to 6.85 are treated as regions where superconductivity could be measured. The measurement result of the oxide thin film 2F-$Pr_{0.00}Y_{1.00}$BCO-2 is illustrated in FIG. 13B, which has the characteristics of 6.29 to 6.67. If those that are not the maximum value are highly likely that it will be affected by the end portion of the single crystal, so the maximum value of the obtained result will be the Jc value.

It was found that the oxide thin films 2F-$Pr_{0.00}Y_{1.00}$BCO-1 and 2F-$Pr_{0.00}Y_{1.00}$BCO-2 should be good superconductors with superconducting characteristics of 6.85 and 6.67 MA/$cm^2$ in liquid nitrogen in the central portion.

Figures 14A, 14B:
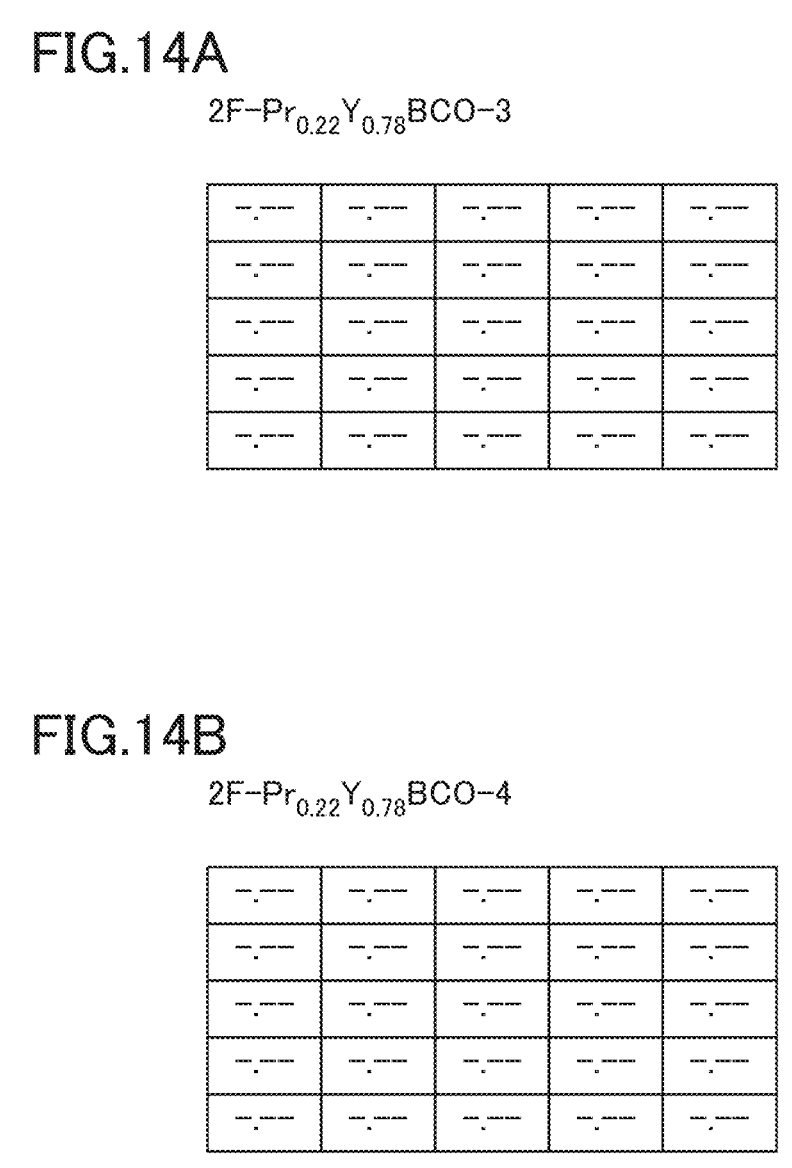

FIGS. 14A and 14B are diagrams illustrating superconducting characteristics of oxide thin films 2F-$Pr_{0.22}Y_{0.78}$BCO-3 and 2F-$Pr_{0.22}Y_{0.78}$BCO-4. 2F-$Pr_{0.22}Y_{0.78}$BCO-3 is illustrated in FIG. 14A, and 2F-$Pr_{0.22}Y_{0.78}$BCO-4 is illustrated in FIG. 14B. In this case, no signal that can be determined as superconductivity was obtained in all regions. This result is the same as in Example 1, but this experiment was performed to confirm the undiluted solution for forming a chimeric film after that. The characteristics are zero over the entire area, and there is no superconducting region with a diameter of 6 mmφ inside the film.

Figure 15:
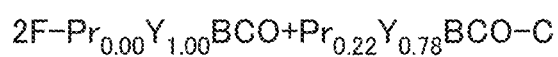
FIG. 15 is a diagram illustrating measurement results of superconducting characteristics when the oxide thin film 2F-$Pr_{0.00}Y_{1.00}BCO+Pr_{0.22}Y_{0.78}BCO$-C of Example 2 is installed on a lower side of YBCO and on an upper side of YBCO with 22% Pr substitution.

FIG. 15 illustrates measurement results of superconducting characteristics when the oxide thin film 2F-$Pr_{0.00}Y_{1.00}$BCO+$Pr_{0.22}Y_{1.00}$BCO-C is installed on a lower side of YBCO and on an upper side of YBCO with 22% Pr substitution. On the upper side of the figure, the YBCO with 22% Pr substitution does not show superconducting characteristics. On the other hand, the lower YBCO shows the superconducting characteristics. At the boundary, a portion that is not determined to be superconducting due to the principle of the inductive method will have a width of 2 to 4 mm.

The YBCO portion of the Jc value of this oxide thin film 2F-$Pr_{0.00}Y_{1.00}$BCO+$Pr_{0.22}Y_{0.78}$BCO-C is a result close to the Jc values of 2F-$Pr_{0.00}Y_{1.00}$BCO-1 and 2F-$Pr_{0.00}Y_{1.00}$BCO-2, and the 22% Pr-YBCO portion is the same result as 2F-$Pr_{0.22}Y_{0.78}$BCO-3 and 2F-$Pr_{0.22}Y_{0.78}$BCO-4.

The appearance of the oxide thin film 2F-$Pr_{0.00}Y_{1.00}$BCO+$Pr_{0.22}Y_{0.78}$BCO-C is as follows: YBCO superconducting portion is glossy black, and a location where 22% Pr is present is slightly whitish. Since the optimum oxygen partial pressure at the time of the firing of the portion where 22% Pr is present is not 1000 ppm, there is a possibility that a heterogeneous phase was partially formed. However, as described above, the TFA-MOD method can perform firing with a wide oxygen partial pressure, and it has been confirmed from the XRD measurement results that it has a perovskite structure. If the optimum oxygen partial pressure is 1000 ppm for the YBCO and 1 ppm for the PrBCO, it will be 218 ppm if it is proportional on the logarithmic axis. Note that it is known that the TFA-MOD method forms a superconductor even if the oxygen partial pressure deviates to this extent. However, due to the deviation of the optimum oxygen partial pressure, a heterogeneous phase may be formed on the surface and the surface may appear white.

As the appearance of the oxide thin film 2F-$Pr_{0.00}Y_{1.00}$BCO+$Pr_{0.22}Y_{0.78}$BCO-C, as measurement results of the 2θ/φ of the XRD method were performed for a white haze in the upper portion of FIG. 15, a slightly white black part in the central portion, and a glossy black part on the opposite side, the results are 2XRD-$Pr_{0.00}Y_{1.00}$BCO+$Pr_{0.22}Y_{0.78}$BCO-CW (XRD measurement result of Example 2, Chimera white area), 2XRD-$Pr_{0.00}Y_{1.00}$BCO+$Pr_{0.22}Y_{0.78}$BCO-CC (center area), and 2XRD-$Pr_{0.00}Y_{1.00}$BCO+$Pr_{0.22}Y_{0.78}$BCO-CB (black area).

The results of 2XRD-$Pr_{0.00}Y_{1.00}$BCO+$Pr_{0.22}Y_{0.78}$BCO-CC and 2XRD-$Pr_{0.00}Y_{1.00}$BCO+$Pr_{0.22}Y_{0.78}$BCO-CB were almost the same. Therefore, it is considered that Pr-YBCO is formed in the center area. The region of 2XRD-$Pr_{0.00}Y_{1.00}$BCO+$Pr_{0.22}Y_{0.78}$BCO-CW on the opposite side seems to obtain results close to the YBCO.

Figure 16:
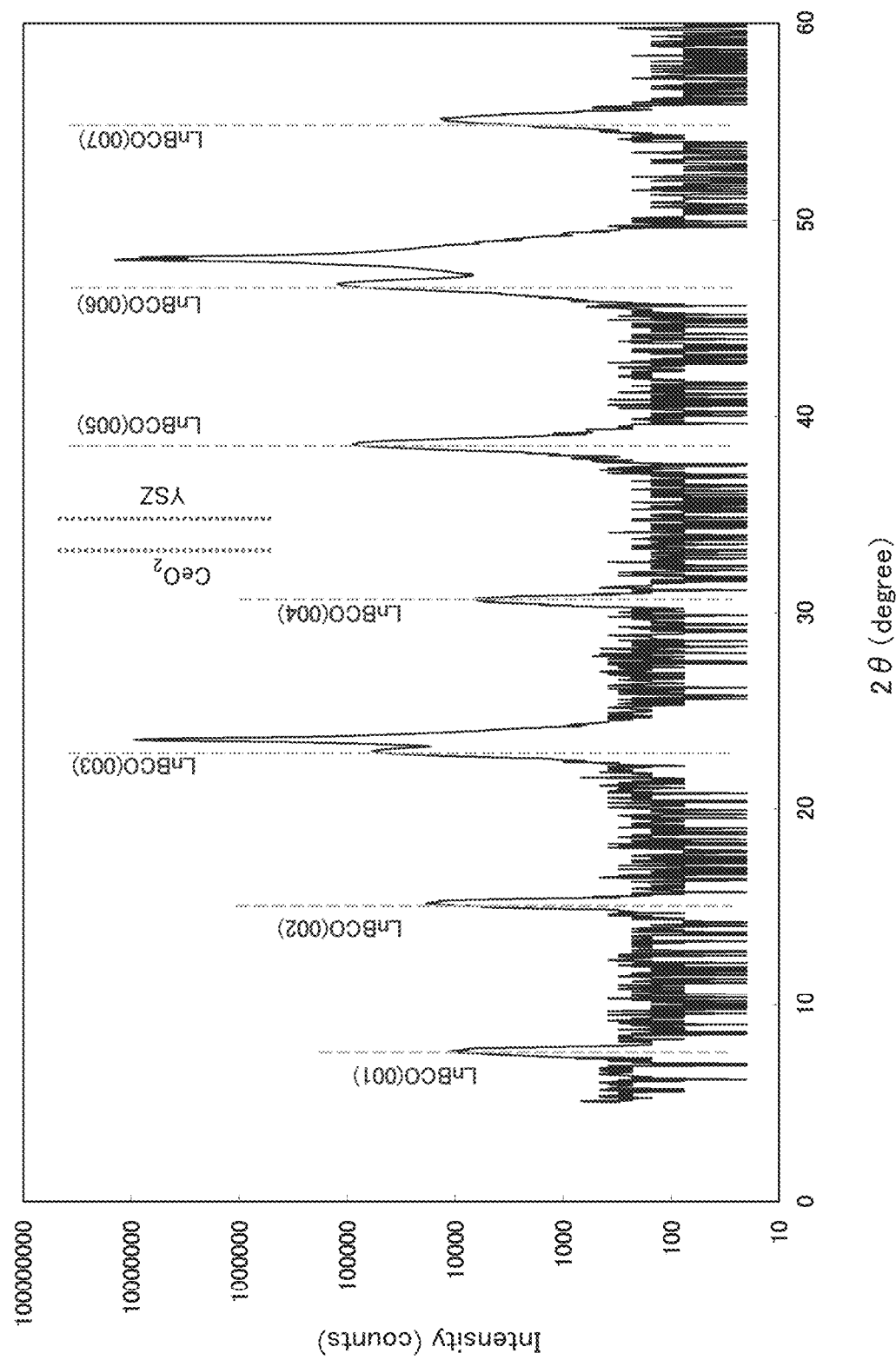
FIG. 16 is a diagram illustrating XRD results of 2XRD-$Pr_{0.00}Y_{1.00}BCO+Pr_{0.22}Y_{0.78}BCO$-CW in which the YBCO of Example 2 is formed.
Figure 17:
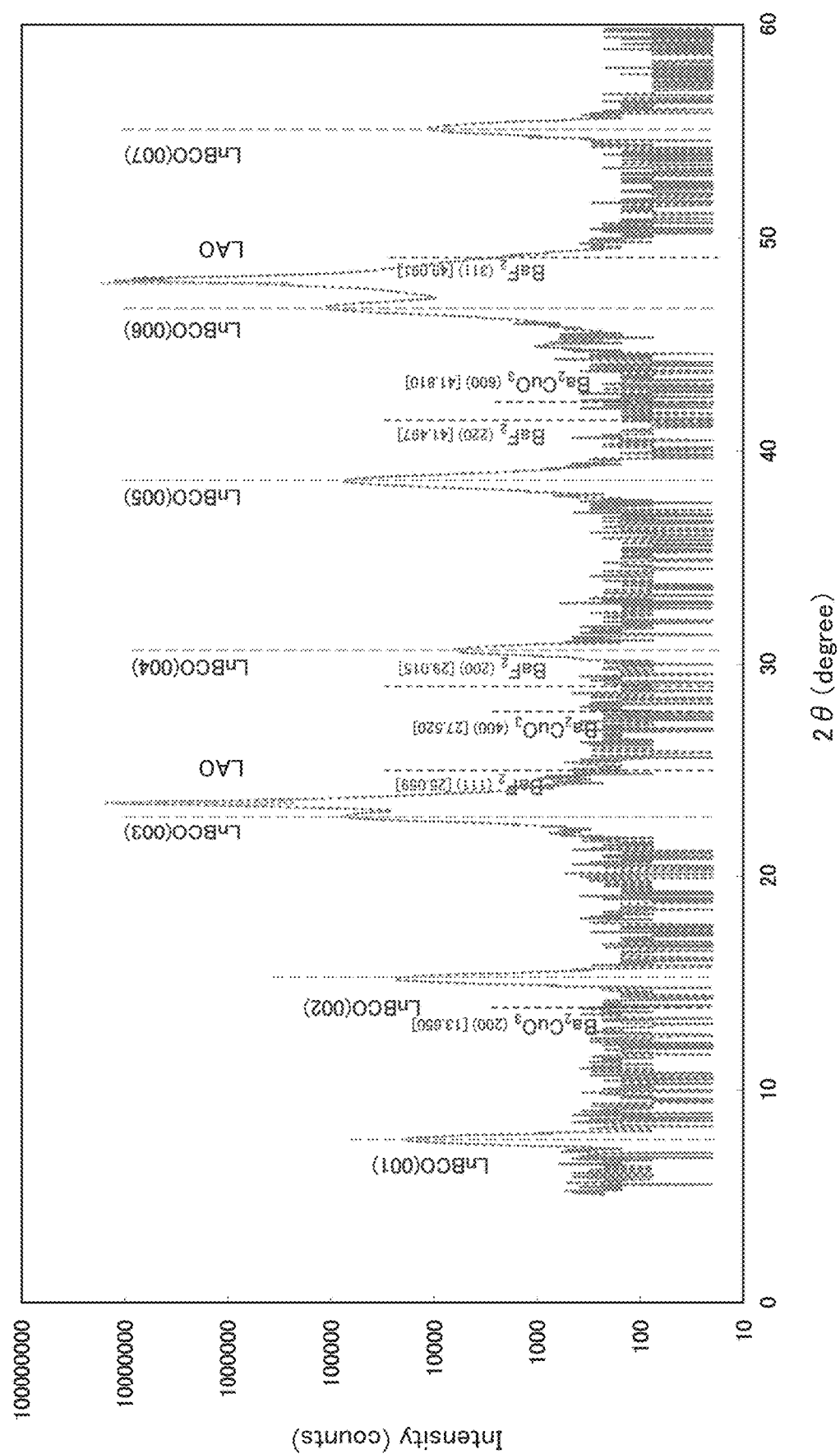
FIG. 17 is a diagram illustrating XRD results of 2XRD-$Pr_{0.00}Y_{1.00}BCO+Pr_{0.22}Y_{0.78}BCO$-CC which seems to be the YBCO with 22% Pr substitution of Example 2.

FIG. 16 illustrates XRD results of 2XRD-$Pr_{0.00}Y_{1.00}$BCO+$Pr_{0.22}Y_{0.78}$BCO-CW in which the YBCO is formed. In addition, FIG. 17 illustrates the XRD results of 2XRD-$Pr_{0.00}Y_{1.00}$BCO+$Pr_{0.22}Y_{0.78}$BCO-CC which seems to be the YBCO with 22% Pr substitution. In both results, only the YBCO (00n) peak is seen, and small peaks showing heterogeneous phases are at the same level as the background. Since the YBCO (006) peak seen near 46.68° and the background have a 1000-fold difference in intensity, it is considered to be almost YBCO.

Figure 18:
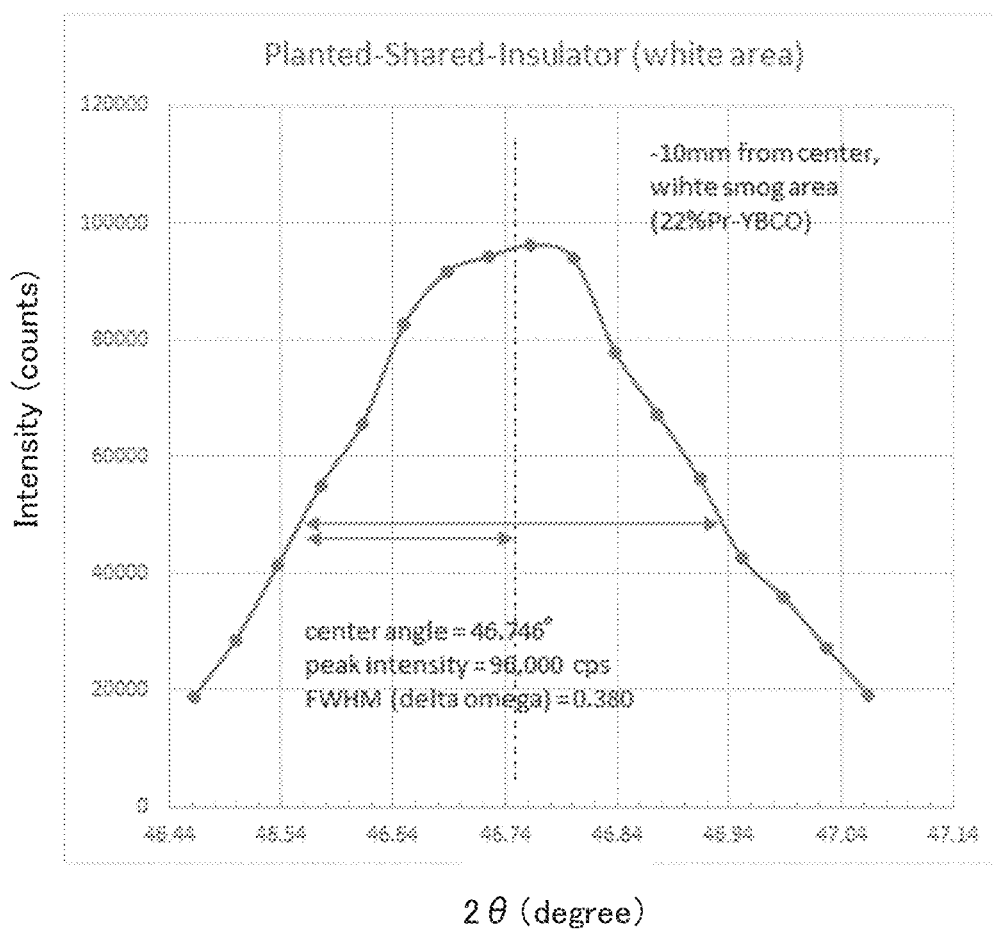
FIG. 18 is an enlarged view of (006) peak of $Pr_{0.22}Y_{0.78}BCO$ of Example 2.

An enlarged view of the YBCO (006) peak is illustrated in FIG. 18. FIG. 18 is an enlarged view of 2XRD-$Pr_{0.00}Y_{1.00}$BCO+$Pr_{0.22}Y_{0.78}$BCO-CW near the YBCO (006) peak. Since the intensity of the nearby LAO (200) peak is small, the peak position of this portion will be discussed as the central portion of the half value of the peak intensity. Due to the influence of the $LaAlO_3$ substrate (200) peak, the YBCO (006) peak is observed at 46.68° on the slightly higher angle side by this method. In the evaluation between samples, is considered that the influence of the $LaAlO_3$ substrate (200) peak does not change significantly unless the position of 2θ deviates from 0.2°, and it seems that relative comparison is possible.

In FIG. 18, the peak of 2XRD-$Pr_{0.00}Y_{1.00}$BCO+$Pr_{0.22}Y_{0.78}$BCO-CW is a single line. It is said that the YBCO peaks at (006) at 46.68°, for example, the SmBCO peaks at 46.53°, and the NdBCO peaks at 46.46°. The LaBCO is 46.00°. This is related to lanthanoid contraction, where the c-axis length is longer in La with a large atomic radius, and the (006) peak is located on the low angle side.

If the PrBCO forms the perovskite structure and the valence of Pr does not change, the peak position should appear near 46.2°, which is the central portion of the LaBCO and NdBCO. However, the result in FIG. 18 shows only one peak at 46.746°. This means that the PrBCO and YBCO form a common or single perovskite structure even with a 22% Pr mixture. It indicates that it is single crystal or crystallographically continuous. The peak intensity was 96000 cps, 2θ=46.746°.

Figure 19:
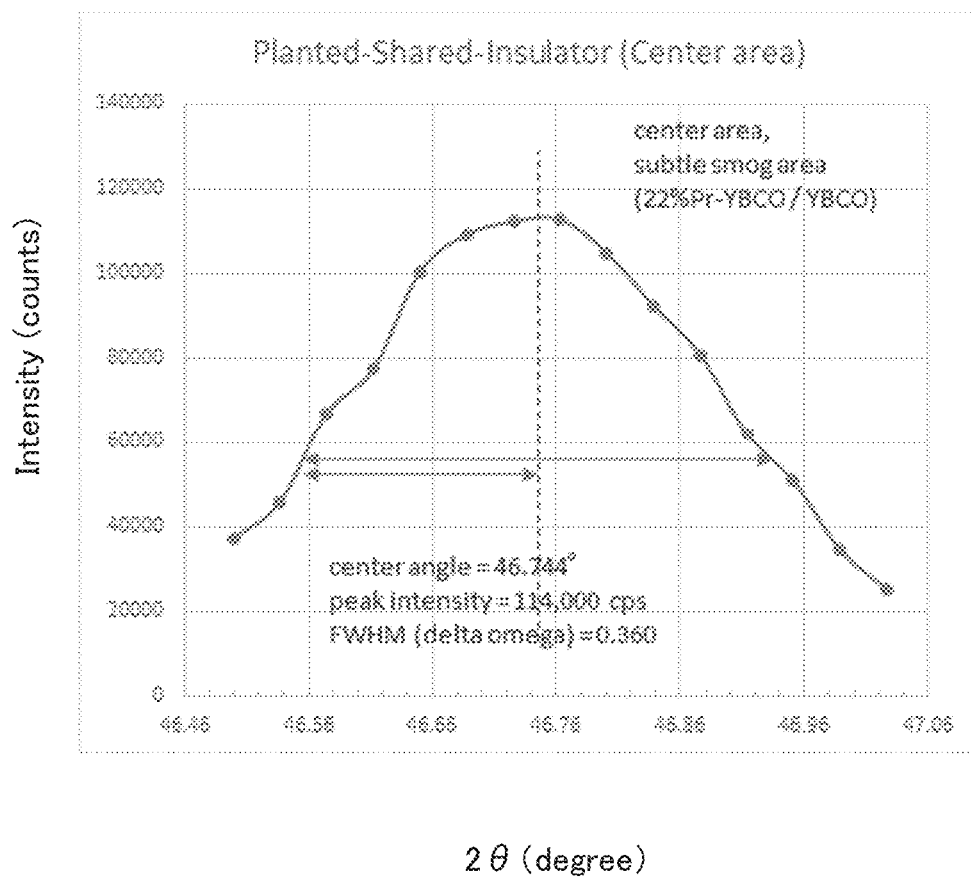
FIG. 19 is an enlarged view of (006) peak of $Pr_{0.22}Y_{0.78}BCO$ approximating the YBCO of Example 2.

In FIG. 19, the XRD result of 2XRD-$Pr_{0.00}Y_{1.00}$BCO+$Pr_{0.22}Y_{0.78}$BCO-CC was 114000 cps and 2θ=46.744 which are almost the same results as FIG. 18 except that the position where the peak intensity became a little stronger moved to the higher angle side by 0.02°. This also indicates that 2XRD-$Pr_{0.00}Y_{1.00}$BCO+$Pr_{0.22}Y_{0.78}$BCO-CC is a composition close to 2XRD-$Pr_{0.00}Y_{1.00}$BCO+$Pr_{0.22}Y_{0.78}$BCO-CW.

The FWHM and intensity that can be read from FIGS. 18 and 19 are 0.380° and 96000 cps for 2XRD-$Pr_{0.00}Y_{1.00}$BCO+$Pr_{0.22}Y_{0.78}$BCO-CW. 2XRD-$Pr_{0.00}Y_{1.00}$BCO+$Pr_{0.22}Y_{0.78}$BCO-CC is 0.360° and 114000 cps. As the amount of Pr increases, the portion changes from trivalent to tetravalent, the c-axis length becomes shorter, and it is expected that the peak intensity will weaken due to the deviation in the XRD measurement. The width is expected to be broad. FIG. 19 illustrates an intermediate result between the YBCO and the 22% Pr-YBCO because it is measured across boundaries. The FWHM corresponding to Δω is small at 0.360°, and the peak is strong at 114000 cps.

Figure 20:
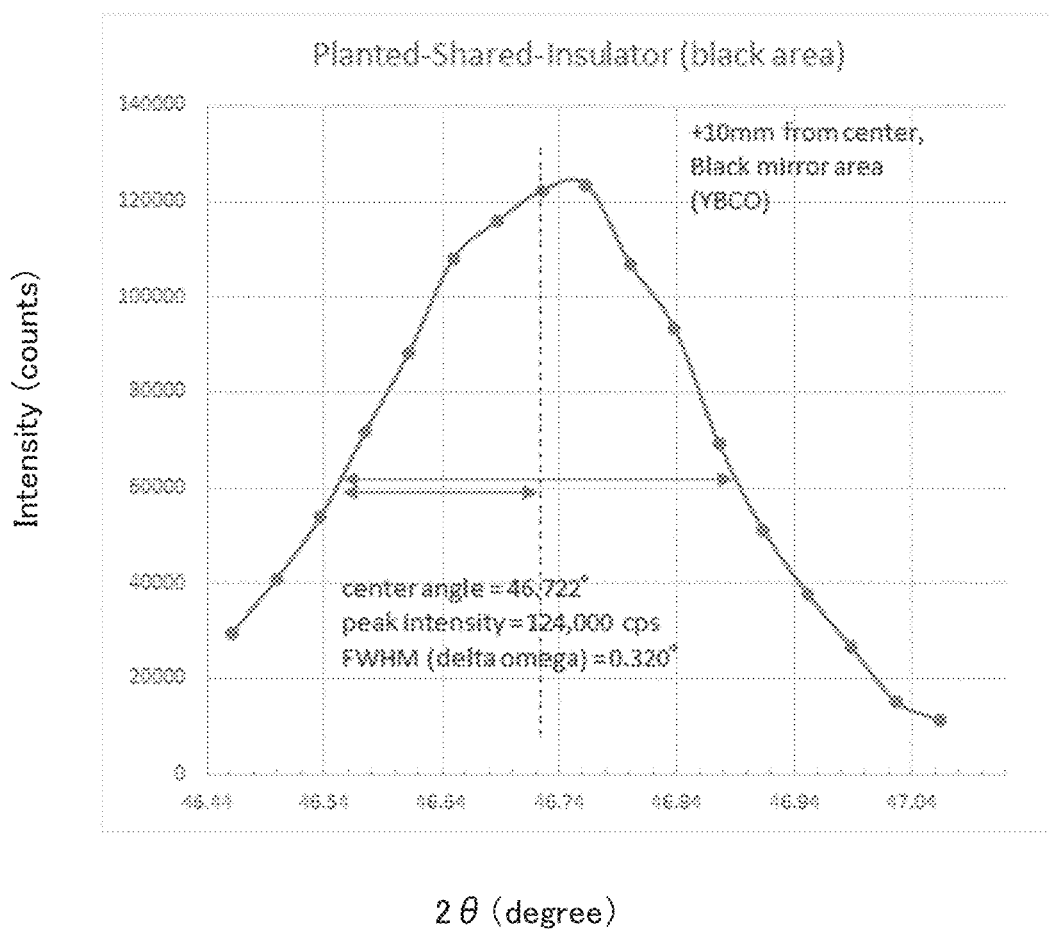
FIG. 20 is an enlarged view of (006) peak of the YBCO of Example 2.

Finally, the result of the region where the YBCO is formed is shown in FIG. 20. Since YBCO is a single substance, it is natural that it has one peak, but the (006) peak position evaluated by this method is 46.722°. This value is only 0.024° different from FIG. 18, which is the most deviated. It is presumed that the PrBCO has a structure in which the peak comes around 46.2° immediately after the formation, but the c-axis length becomes shorter due to the change in the valence of Pr, and the (006) peak shifts to the high angle side. The difference between the comparison results of the perovskite structures containing 22% Pr and YBCO at room temperature was only 0.024°.

This 0.024° is a very small value. It is widely known that the YBCO and SmBCO can form the common perovskite structure in the TFA-MOD method, but their (006) peak positions differ by 0.15°. The YBCO with dispersed Pr shows that the difference of 2θ is smaller and the c-axis length is close to the same value. It is expected that the structure will exist more stably.

As a result of 2XRD-$Pr_{0.00}Y_{1.00}$BCO+$Pr_{0.22}Y_{0.78}$BCO-CB illustrated in FIG. 20, the FWHM is 0.32° and the peak intensity is 124000 cps. From the results of FIGS. 18 to 20, the XRD result shows that a continuous structure can be formed in principle, and it is proof that a continuous perovskite structure is obtained.

As a result, the AC loss could not be reduced unless the structure was drilled by the laser scribing method. However, even if the non-superconducting width is formed at the same 100 μm by the new planted shared insulator (PSI) method, the principle that the structure with excellent intensity or damage avoidance can be formed was shown.

High-resolution TEM observations were performed near the boundary between the region where YBCO is formed and the region where the YBCO with 22% Pr substitution is formed.

Figure 21:
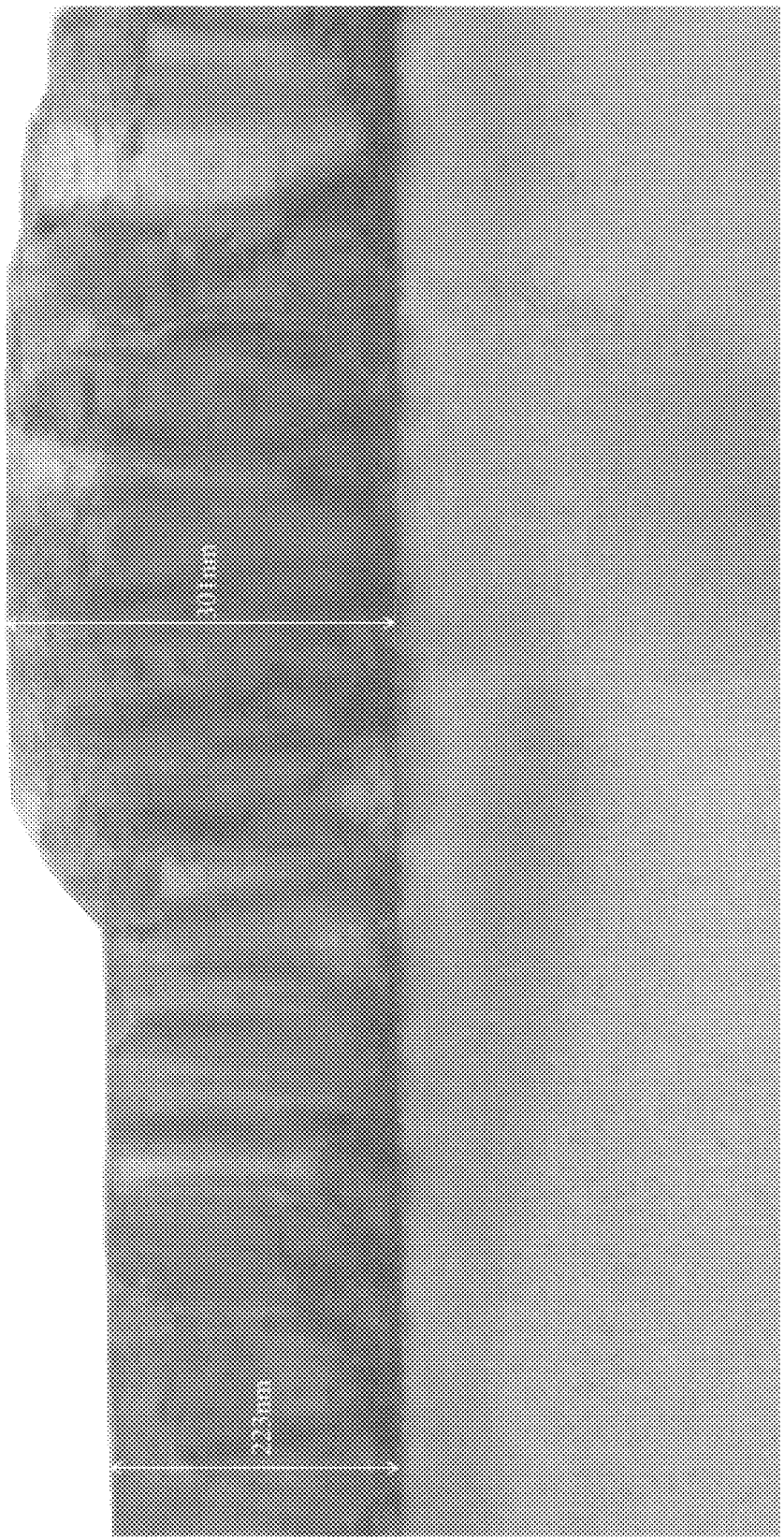
FIG. 21 is a cross-sectional TEM image observed at 200,000 times of Example 2.

FIG. 21 is a cross-sectional TEM image observed at 200,000 times. It is known that since the TFA-MOD method grows in a quasi-liquid phase, it is known that the film thickness is small in the location where the liquid phase is dead, and other locations will be thicker. The film thickness difference depends on the film formation conditions, but it is said to be 70 nm under the film thickness conditions of 800° C.·1000 ppm and humidification 4.2%.

The white area on the lower side of FIG. 21 is the $LaAlO_3$ single crystal substrate, and an area on the white area in which a slightly black striped pattern appears is the YBCO conductor. The film thickness of the YBCO superconductor is scaled, the thin portion is 223 nm and the thick portion is 301 nm. From the film thickness difference, it can be seen that the sample was formed almost according to the conditions. Although it is difficult to see from FIG. 21, all the striped patterns run in the direction parallel to the substrate. In other words, it shows that the c axis oriented particles are aligned.

Figure 22:
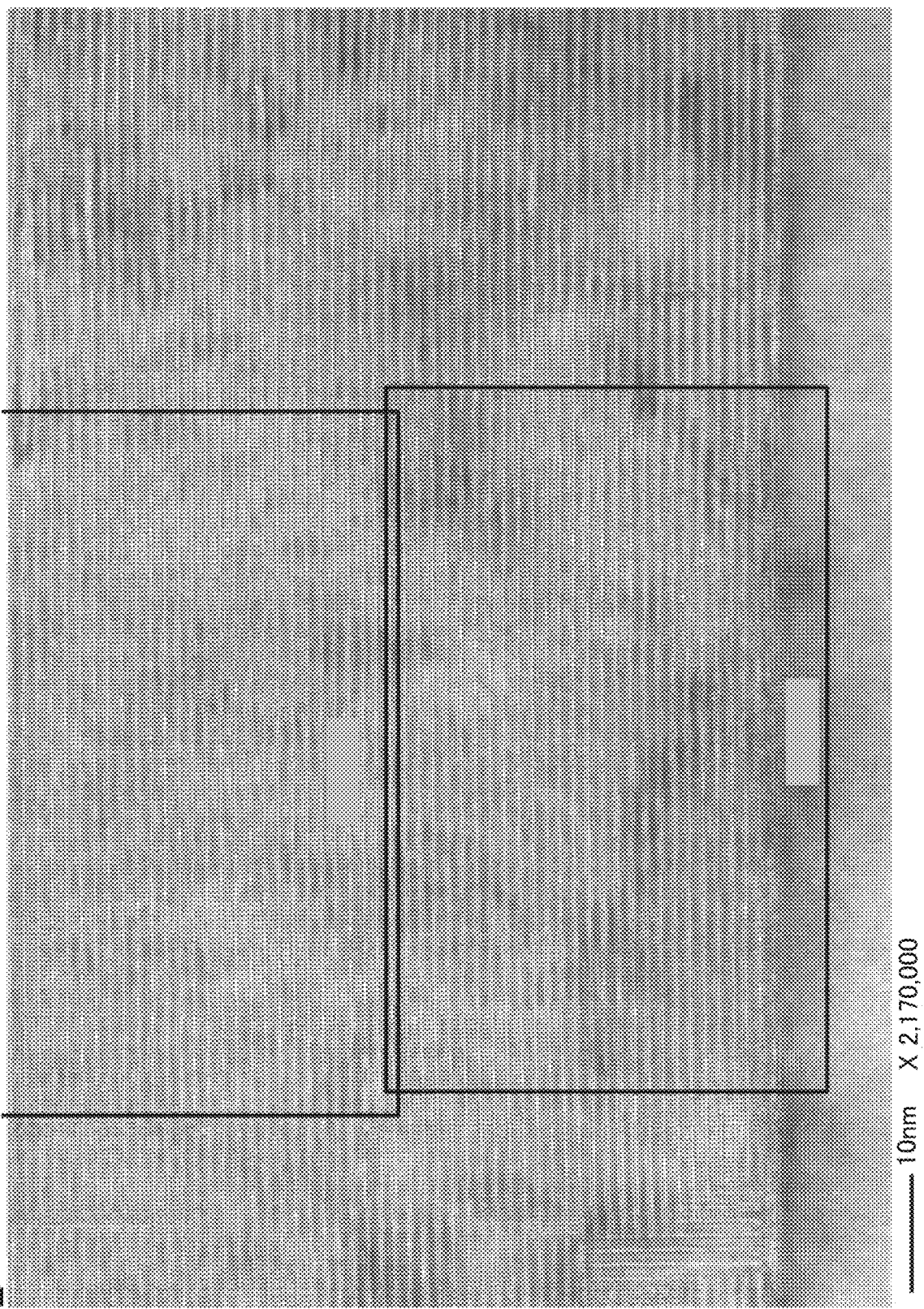
FIG. 22 is a cross-sectional TEM image observed at 2,170,000 times of Example 2.

FIG. 22 illustrates a TEM image in which the boundary between the $LaAlO_3$ single crystal substrate and the YBCO superconductor in FIG. 21 was observed at a high magnification of 2.17 million times. Each element of the $LaAlO_3$ single crystal substrate can be seen at the bottom of the figure, and the region visible in the lateral stripe pattern is the c axis oriented particle of the YBCO superconductor. As can be seen from FIG. 22, c axis oriented particles are formed on almost the entire surface, and a portion where stripes are slightly connected in the vertical direction can be seen on the left end of the figure, which is the a/b axis or particle.

Once a/b axis oriented particle is formed, a wall to block the lateral (superconducting current direction by the c axis oriented particle) superconducting current to grow faster on the upper side is formed, which greatly reduces the superconducting characteristics. However, in this field of view of the sample, the a/b axis oriented Particle exists only from the substrate to the height of 14 unit cells as illustrated in FIG. 22, and it can be seen that the c axis oriented particle is formed again on the upper portion. Since the lattice length is 1:1:2.94, the a/b axis oriented particle and the c axis oriented particle can form a common lattice structure.

The c axis oriented particle and the a/b axis oriented particle that can be observed in FIG. 22 can be separated by a method called polar figure of the XRD measurement. When the polar figure is measured on the YBCO (102) plane, the a/b axis oriented particle is observed near ψ=56°, and the c axis oriented particle is observed near ψ=34°. An abundance ratio can be quantitatively evaluated from the ratio of the total value and the a/b axis orientation intensity, and the result in FIG. 22 was 1.2%. If the a/b axis orientation ratio is 3% or less, the superconducting characteristics can be obtained almost 100%. This is because the superconducting current can freely bypass the c-axis oriented portion. When the a/b axis orientation ratio is 10%, the characteristics are less than half, and when the a/b axis orientation ratio is 30%, the characteristics are 1/100 or less which is close to zero.

Figure 23:
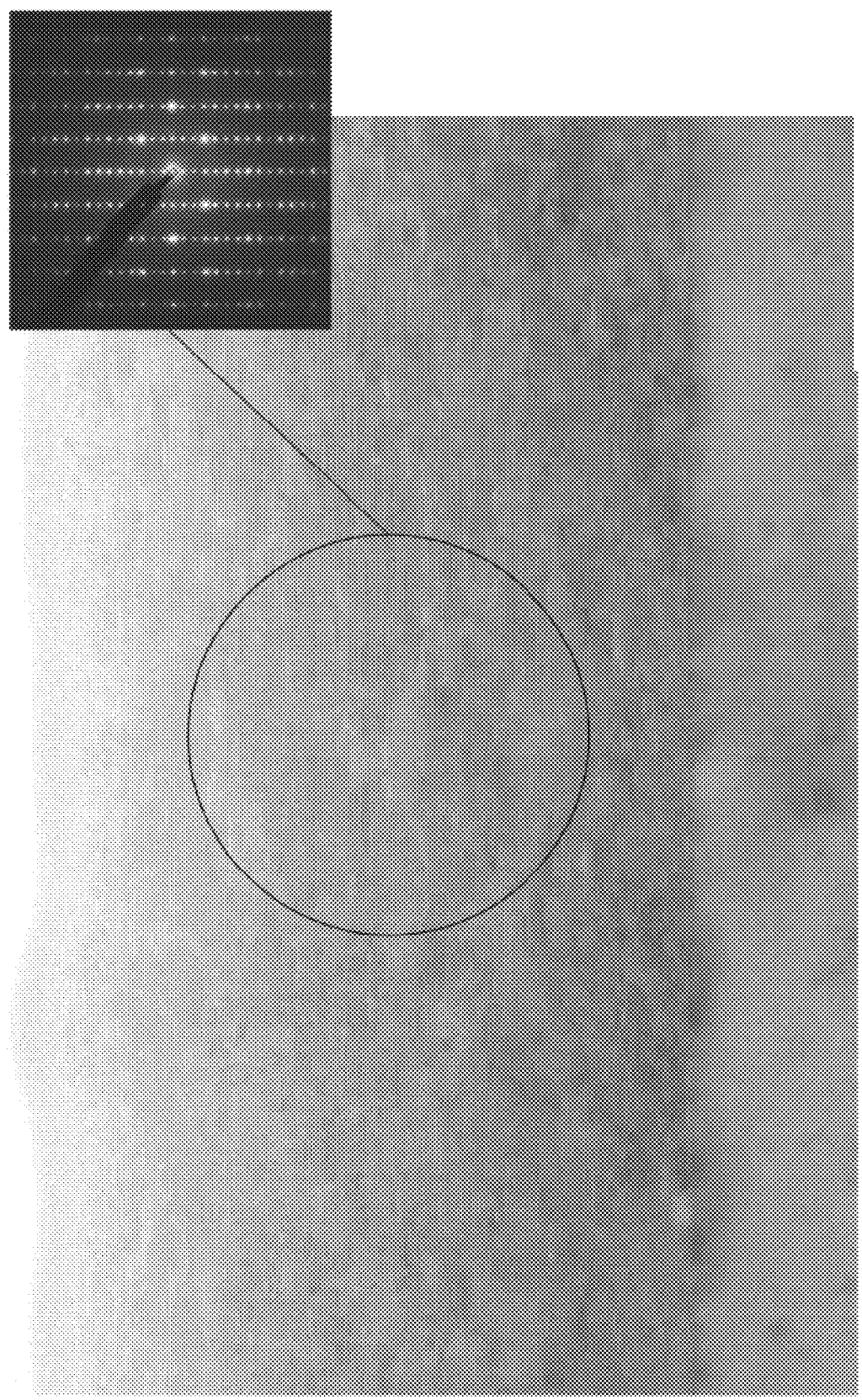
FIG. 23 is a cross-sectional TEM image observed at 520,000 times of Example 2.

FIG. 23 illustrates the results of observing another part of the sample at 520,000 times. The lower portion of FIG. 23 is the LAO single crystal substrate, and the black part of the upper portion is the YBCO superconductor. The lateral stripe indicates c axis oriented particles. The a/b axis oriented particles cannot be observed in this field of view.

In addition, the result in the upper right of the figure illustrating the X-ray opening image also shows that the c axis oriented particle is almost 100%. These observation results showed YBCO on the right side and 22% Pr-substituted YBCO on the left side, but the boundaries were unclear and therefore no formation of the a/b axis oriented particles was observed. In addition, the abundance ratio of the a/b axis oriented particles was only 1.2% from the results of the polar figure. From this, it was found that the method of substituting the Y site with Pr of 20% or more to form the non-superconductor forms the perovskite structure common to the YBCO, and the formation of the a/b axis oriented particles can be suppressed to less than 30%.

In the TFA-MOD method, the a/b axis oriented particles that reduce the superconducting characteristics are thought to be caused by excessive nucleation due to the release of excess unit cells, and in the AC loss reduction structure using voids, the characteristics of superconductors are decrease. In the method for reducing an AC loss by forming a void, the formation of a/b axis oriented particles in the superconductor portion is considered to be 100 µm from the void, and the ratio of a/b axis oriented particles in that portion reaches 30% or more. When the a/b axis oriented particle reaches 30%, the superconducting characteristics become almost zero, but when the a/b axis oriented particle is calculated as $\frac{1}{100}$, in the case of the superconducting wire having a width of 400 µm and a structure that reduces the AC loss by forming voids, the a/b axis oriented particles are formed with a width of 200 µm, and the characteristics are $\frac{1}{100}$, so the overall characteristics of the wire having a width of 400 µm are reduced to 50.5%. Moreover, when the width becomes shorter and becomes 200 µm, the entire surface becomes a/b axis oriented particles, so the characteristic becomes $\frac{1}{100}$.

In the example, the a/b axis oriented particle maintains the normal amount of 1.2% by not forming voids. In addition, it is expected that the a/b axis oriented particles will not be formed even if the non-superconducting region becomes narrower, and it is understood that the structure can realize a large AC loss reduction effect.

In the film formation by the TFA-MOD method, the film formation using the meniscus portion is the basis in the continuous film formation process. The key to the formation is the simultaneous film formation of the superconducting region and the non-superconducting region illustrated in FIG. 5.

In the TFA-MOD method, has been reported that the AC loss reduction structure was developed by forming only the superconducting region by the inkjet method and maintaining the insulation in the void portion. However, the superconducting wire was completed by that method to form the superconducting coil and there is no example of application as of 2020. It seems to be a difficult method considering the current situation that more than 10 years have passed since the development.

One of the difficulties is the handling of methanol solutions that are too viscous. If the droplet spreads when it is ejected by an inkjet, there is a risk that the superconducting region may connect to the adjacent region. Even if the droplets are controlled to form the portion where the gel film exists and the portion where the gel film does not exist, the firing reaction by the TEA-MOD method accelerates the growth of both end portions where the gas easily volatilizes, and then falls sideways to increase the amount of a/b axis oriented particle where the superconducting characteristics decrease, so good superconducting characteristics cannot be expected.

On the other hand, in the PSI method illustrated in FIG. 5, the finally formed superconducting film is about 1 micron, and the gel film has a thickness of only 10 µm. Simultaneous film formation may form a diffusion layer of several microns, but it is easy to see that it does not exceed 100 µm. Therefore, the PSI structure illustrated in FIGS. 1 and 2 can be realized.

It is clear from the data verification in this example that the structures illustrated in FIGS. 1 and 2 are realized, and it can be understood that the PSI structure can solve all six problems of the laser scribing method. The PSI method, which forms the non-superconducting region with the common perovskite structure, is also excellent in the mechanical strength in the wire formation. If this technology is deployed, the reduction in the AC loss will be realized, and it is easy to imagine that high-power applications of superconductivity will spread around the world.

Example 3

According to the flowchart illustrated in FIG. 3, two types of coating solutions for superconductors are synthesized and purified. Powders of each hydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

These coating solutions were dissolved in ion-exchanged water at a metal ion molar ratio of 0.00:1.00:2:3 and 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 3Mi-$Pr_{0.00}Y_{1.00}BCO$ (substance described in Example 3, 0% Pr, 100% Y Material with impurity) and 3Mi-$Pr_{0.22}Y_{0.78}BCO$ were obtained.

About 7 wt. % of water or acetic acid which is reaction by-products during solution synthesis was contained in the obtained translucent blue substances 3Mi-$Pr_{0.00}Y_{1.00}BCO$ and 3Mi-$Pr_{0.22}Y_{0.78}BCO$. 20 times by weight of anhydrous methanol was added to translucent blue substances 3Mi-$Pr_{0.00}Y_{1.00}BCO$ and 3Mi-$Pr_{0.22}Y_{0.78}BCO$ and dissolved, and the coating solutions 3CSi-$Pr_{0.00}Y_{1.00}BCO$ (coating solution described in Example 3, 0% Pr, 100% Y Material with impurity), and 3CSi-$Pr_{0.22}Y_{0.78}BCO$ were each obtained.

When the obtained coating solutions 3CSi-$Pr_{0.00}Y_{1.00}BCO$ and 3CSi-$Pr_{0.22}Y_{0.78}BCO$ were reacted and purified again under reduced pressure in a rotary evaporator for 12 hours, translucent blue substances 3M-$Pr_{0.00}Y_{1.00}BCO$ (substance described in Example 3, 0% Pr, 100% Y Material without impurity) and 3M-$Pr_{0.22}Y_{0.78}BCO$ were each obtained.

Translucent blue substance 3M-$Pr_{0.00}Y_{1.00}BCO$ and 3M-$Pr_{0.22}Y_{0.78}BCO$ were dissolved in methanol (j in FIG. 3) and diluted using a volumetric flask, and each of the coating solutions 3CS-$Pr_{0.00}Y_{1.00}BCO$ (Example 3, coating solution for 0% Pr, 100% Y perovskite structure) and 3CS-$Pr_{0.22}Y_{0.78}BCO$ of 1.50 mol/l in terms of metal ions were obtained.

To carry out the film formation with the meniscus coat, six containers of 3×4 mm and 3×5 mm without two adjacent sides in a plastic rectangular parallelepiped with a thickness of about 0.2 mm and 3×4×5 mm are prepared. On a 4×5 mm surface, three with the same surface opened are connected.

The 3×4 mm surface of the CV presses against the upright single crystal substrate of 10 mm×30 mm×0.50 mmt, so that the other (3×5 mm) open surface faces upward. The containers on both sides are filled with the coating solution 3CS-$Pr_{0.00}Y_{1.00}BCO$ from the top to about 1 mm, and the container at center is filled with the coating solution 3CS-$Pr_{0.22}Y_{0.78}BCO$ from the top to about 1 mm.

When the single crystal substrate is pulled at about 12 mm/s, a gel film 3Gel-$Pr_{0.00}Y_{1.00}BCO+Pr_{0.22}Y_{0.78}BCO$ $Pr_{0.00}Y_{1.00}BCO$ (gel film of Example 3) is formed. There may be some mixing at the boundaries of the coating solution during the gel film formation. When pulled at a rate of about 12 mm/s, a gel film with a thickness of about 1.5 µm is formed, and after calcining and firing, an oxide thin film with a thickness of 0.15 µm is formed. When the lower portion of the substrate passes under the CV, the liquid in the CV leaks out and drops. In this state, the film formation rate becomes faster, and the film thickness is proportional to the 0.5 power of the rate, so that the film thickness becomes thicker and the mixing occurs. Therefore, the lower 5 mm is also removed by phosphoric acid etching. Similarly, CV is set on a 10 mm×30 mm×0.50 mmt single crystal substrate, and all the containers are filled with the coating solution 3CS-$Pr_{0.00}Y_{1.00}BCO$ from the top to about 1 mm.

When the single crystal substrate is pulled at about 20 mm/s, a gel film 3Gel-$Pr_{0.00}Y_{1.00}BCO+Pr_{0.00}Y_{1.00}BCO+Pr_{0.00}Y_{1.00}BCO$ is formed. There may be some mixing at the boundaries of the coating solution during the gel film formation. When pulled at a rate of about 12 mm/s, a gel film with a thickness of about 2 µm is formed, and after calcining and firing, an oxide thin film with a thickness of 0.15 µm is formed.

The obtained gel film 3Gel-$Pr_{0.00}Y_{1.00}BCO+Pr_{0.22}Y_{0.78}BCO+Pr_{0.00}Y_{1.00}BCO$, and 3Gel-$Pr_{0.00}Y_{1.00}BCO+Pr_{0.00}Y_{1.00}BCO+Pr_{0.00}Y_{1.00}BCO$ were immediately installed in a furnace filled with dry gas, the calcining was performed under a humidified pure oxygen atmosphere at 400° C. or lower with the profile illustrated in FIG. 6, and translucent brown calcining films 3Cal-$Pr_{0.00}Y_{1.00}BCO+Pr_{0.22}Y_{0.78}BCO+Pr_{0.00}Y_{1.00}BCO$ (Example 3, calcined film), and 3Cal-$Pr_{0.00}Y_{1.00}BCO+Pr_{0.00}Y_{1.00}BCO+Pr_{0.00}Y_{1.00}BCO$ were each obtained.

In the profile illustrated in FIG. 7, the calcining film 3Cal-$Pr_{0.00}Y_{1.00}BCO+Pr_{0.22}Y_{0.78}BCO+Pr_{0.00}Y_{1.00}BCO$ and 3Cal-$Pr_{0.00}Y_{1.00}BCO+Pr_{0.00}Y_{1.00}BCO+Pr_{0.00}Y_{1.00}BCO$ were fired in 1000 ppm oxygen mixed argon gas at 800° C. and annealed in pure oxygen at 525° C. or lower, and the oxide thin film 3F-$Pr_{0.00}Y_{1.00}BCO+Pr_{0.22}Y_{0.78}BCO+Pr_{0.00}Y_{1.00}BCO$ (Example 3, fired oxide films) and 3F-$Pr_{0.00}Y_{1.00}BCO+Pr_{0.00}Y_{1.00}BCO+Pr_{0.00}Y_{1.00}BCO$ were each obtained.

Oxide thin film 3F-$Pr_{0.00}Y_{1.00}BCO+Pr_{0.00}Y_{0.78}BCO+Pr_{0.00}Y_{1.00}BCO$ sticks to a chemical resistant tape and is exposed to upper portion 1 mm and lower portion 5 mm, and inhomogeneous superconducting portion was removed by immersing in 0.7% phosphoric acid aqueous solution for 60 s. It is considered that the obtained oxide thin film having a width of about 9 mm and a length of 15 mm is formed with $Pr_{0.00}Y_{1.00}BCO$, $Pr_{0.22}Y_{0.78}BCO$, $Pr_{0.00}Y_{1.00}BCO$ every 3 mm in the longitudinal direction.

3 locations on each side of $Pr_{0.00}Y_{1.00}BCO$ on both sides of oxide thin film 3F-$Pr_{0.00}Y_{1.00}BCO+Pr_{0.22}Y_{0.78}BCO+Pr_{0.00}Y_{1.00}BCO$ is subjected to silver vapor deposition, and the contactability between the silver and oxide thin film by pure oxygen annealing under 180° C. was improved. Electrodes on each side, 3 locations are 3E-A1 (electrode of Example 3, A1), 3E-A2, and 3E-A3, and electrodes of 3 locations on the opposite side are 3E-B1, 3E-B2, and 3E-B3.

When the oxide thin film 3F-$Pr_{0.00}Y_{1.00}BCO+Pr_{0.22}Y_{0.78}BCO+Pr_{0.00}Y_{1.00}BCO$ was disposed in liquid nitrogen and the conduction of each electrode was measured, conduction between 3E-A1, 3E-A2, and 3E-A3 was confirmed, and conduction between 3E-B1, 3E-B2, and 3E-B3 was also confirmed. However, the conduction was not confirmed in other combinations. Therefore, it was found that $Pr_{0.22}Y_{078}BCO$ in the central portion functions as an insulating layer.

Similarly, oxide thin film 3F-$Pr_{0.00}Y_{1.00}BCO+Pr_{0.00}Y_{1.00}BCO+Pr_{0.00}Y_{1.00}BCO$ sticks to a chemical resistant tape and is exposed to upper portion 1 mm and lower portion 5 mm, and inhomogeneous superconducting portion was removed by immersing in 0.7% phosphoric acid aqueous solution for 60 s. It is considered that the obtained oxide thin film having a width of about 9 mm and a length of 15 mm is formed with $Pr_{0.00}Y_{1.00}BCO$, $Pr_{0.00}Y_{1.00}BCO$, $Pr_{0.00}Y_{1.00}BCO$ every 3 mm in the longitudinal direction.

3 locations on each side of $Pr_{0.00}Y_{1.00}BCO$ on both sides is subjected to silver vapor deposition, and the contactability between the silver and oxide thin film by the pure oxygen annealing under 180° C. was improved. Electrodes on each side, 3 locations are 3E-A1 (electrode of Example 3, A1), 3E-A2, and 3E-A3, and electrodes of 3 locations on the opposite side are 3E-B1, 3E-B2, and 3E-B3.

When the oxide thin film 3F-$Pr_{0.00}Y_{1.00}BCO+Pr_{0.00}Y_{1.00}BCO+Pr_{0.00}Y_{1.00}BCO$ was disposed in liquid nitrogen and the conduction of each electrode was measured, the conduction was confirmed in all the combinations of 3E-A1, 3E-A2, 3E-A3, 3E-B1, 3E-B2, and 3E-B3.

Since the superconducting layer formed by this method is a simple method, there is a region that is not formed at the boundary, and considering the possibility that conduction cannot be obtained, the oxide thin film 3F-$Pr_{0.00}Y_{1.00}BCO+Pr_{0.00}Y_{1.00}BCO+Pr_{0.00}Y_{1.00}BCO$ was prepared, but it was confirmed from the result of the conduction test that when the gel film is formed, some liquid spreads and the continuous perovskite structure is formed, and the superconducting current conducts at all electrodes.

On the other hand, it is clear from the measurement results that the central portion of the oxide thin film 3F-$Pr_{0.00}Y_{1.00}BCO+Pr_{0.22}Y_{0.78}BCO+Pr_{0.00}Y_{1.00}BCO$ does not conduct. This also proves that the structure without conduction was formed while forming the common perovskite structure including the results of Examples 1 and 2. This experimental result also proves to be the first successful example in which the superconductor could be divided into two locations while forming the common perovskite structure in a continuous region of 100 µm square or more, which is a wide region with a film thickness of 150 nm. The basis of AC loss reduction technology in the PSI method was confirmed.

Example 4

According to the flowchart illustrated in FIG. 3, eight types of coating solutions for superconductors are synthesized and purified. Powders of each hydrate of the coating solution of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

Each hydrate of $Pr(OCOCH_3)_3$, $Y(OCOCH_3)_3$, $Ba(OCOCH_3)_2$, and $Cu(OCOCH_3)_2$ was dissolved in the ion-exchanged water in a metal ion molar ratio of 0.18:0.82:2:3, 0.20:0.80:2:3, 0.22:0.78:2:3, 0.24:0.76:2:3, 0.27:0.73:2:3, 0.30:0.70:2:3, 0.35:0.65:2:3, and 0.40:0.60:2:3, and were mixed and stirred with a reaction equimolar amount of $CF_3COOH$, and the obtained mixed solution was put in an eggplant-shaped flask, and reacted and purified under reduced pressure in a rotary evaporator for 12 hours.

From the reaction and purification from the raw material having metal ion molar ratios 0.18:0.82:2:3, 0.20:0.80:2:3, 0.22:0.78:2:3, 0.24:0.76:2:3, 0.27:0.73:2:3, 0.30:0.70:2:3, 0.35:0.65:2:3, and 0.40:0.60:2:3, translucent blue substances 4Mi-$Pr_{0.18}Y_{0.82}BCO$ (substance described in Example 4, 18% Pr, 82% Y Material with impurity), 4Mi- $Pr_{0.20}Y_{0.80}BCO$, 4Mi-$Pr_{0.22}Y_{0.78}BCO$, 4Mi-$Pr_{0.24}Y_{0.76}BCO$, 4Mi-$Pr_{0.27}Y_{0.73}BCO$, 4Mi-$Pr_{0.30}Y_{0.70}BCO$, 4Mi-$Pr_{0.35}Y_{0.65}BCO$, and 4Mi-$Pr_{0.40}Y_{0.60}BCO$ were obtained.

About 7 wt. % of water or acetic acid, which is reaction by-products during solution synthesis was contained in the obtained translucent blue substances 4Mi-$Pr_{0.18}Y_{0.82}BCO$, 4Mi-$Pr_{0.20}Y_{0.80}BCO$, 4Mi-$Pr_{0.22}Y_{0.78}BCO$, 4Mi-$Pr_{0.24}Y_{0.76}BCO$, 4Mi-$Pr_{0.27}Y_{0.73}BCO$, 4Mi-$Pr_{0.30}Y_{0.70}BCO$, 4Mi-$Pr_{0.35}Y_{0.65}BCO$, and 4Mi-$Pr_{0.40}Y_{0.60}BCO$.

When 20 times by weight of anhydrous methanol was added to translucent blue substances 4Mi-$Pr_{0.18}Y_{0.82}BCO$, 4Mi-$Pr_{0.20}Y_{0.80}BCO$, 4Mi-$Pr_{0.22}Y_{0.78}BCO$, 4Mi-$Pr_{0.27}Y_{0.73}BCO$, 4Mi-$Pr_{0.30}Y_{0.70}BCO$, 4Mi-$Pr_{0.35}Y_{0.65}BCO$, and 4Mi-$Pr_{0.40}Y_{0.60}BCO$ and dissolved, the experiment was stopped because 4Mi-$Pr_{0.27}Y_{0.73}BCO$, 4Mi-$Pr_{0.30}Y_{0.70}BCO$, 4Mi-$Pr_{0.35}Y_{0.65}BCO$, and 4Mi-$Pr_{0.40}Y_{0.60}BCO$ had an opaque greenish white precipitate. It seems that the esterification reaction between methanol and carboxylic acid occurred.

Other solutions are purified, and the coating solutions 4CSi-$Pr_{0.18}Y_{0.82}BCO$ (coating solution described in Example 4, 18% Pr, 82% Y Material with impurity), 4CSi-$Pr_{0.20}Y_{0.80}BCO$, 4CSi-$Pr_{0.22}Y_{0.78}BCO$, and 4CSi-$Pr_{0.24}Y_{0.76}BCO$ were each obtained.

When the obtained coating solutions 4CSi-$Pr_{0.18}Y_{0.82}BCO$, 4CSi-$Pr_{0.20}Y_{0.80}BCO$, 4CSi-$Pr_{0.22}Y_{0.78}BCO$, and 4CSi-$Pr_{0.24}Y_{0.76}BCO$ were reacted and purified again under reduced pressure in a rotary evaporator for 12 hours, translucent blue substances 4M-$Pr_{0.18}Y_{0.82}BCO$ (substance described in Example 4, 18% Pr, 82% Y Material without impurity), 4M-$Pr_{0.20}Y_{0.80}BCO$, 4M-$Pr_{0.22}Y_{0.78}BCO$, and 4M-$Pr_{0.24}Y_{0.76}BCO$ were each obtained.

Translucent blue substances 4M-$Pr_{0.18}Y_{0.82}BCO$, 4M-$Pr_{0.20}Y_{0.80}BCO$, 4M-$Pr_{0.22}Y_{0.78}BCO$, and 4M-$Pr_{0.24}Y_{0.76}BCO$ were dissolved in methanol (j in FIG. 3) and diluted using a volumetric flask, and each of the coating solutions 4CS-$Pr_{0.18}Y_{0.82}BCO$ (Example 4, coating solution for 18% Pr, 82% Y perovskite structure), 4CS-$Pr_{0.20}Y_{0.80}BCO$, 4CS-$Pr_{0.22}Y_{0.78}BCO$, and 4CS-$Pr_{0.24}Y_{0.76}BCO$ of 1.50 mol/l in terms of metal ions were each obtained.

The coating solutions 4CS-$Pr_{0.18}Y_{0.82}BCO$, 4CS-$Pr_{0.20}Y_{0.80}BCO$, 4CS-$Pr_{0.22}Y_{0.78}BCO$, and 4CS-$Pr_{0.24}Y_{0.76}BCO$ were used, a film was formed on $LaAlO_3$ (100) oriented single crystal of a 10 mm×30 mm×0.50 mmt with an acceleration of 10000 rpm/s, a maximum rotation speed of 4000 rpm, and a holding time of 60 s using a spin coating method, and translucent blue gel films 4Gel-$Pr_{0.18}Y_{0.82}BCO$ (Example 4, gel film of resulting 18% Pr, 82% Y films), 4Gel-$Pr_{0.20}Y_{0.80}BCO$, 4Gel-$Pr_{0.22}Y_{0.78}BCO$, and 4Gel-$Pr_{0.24}Y_{0.76}BCO$ were each obtained.

The obtained gel films 4Gel-$Pr_{0.18}Y_{0.82}BCO$, 4Gel-$Pr_{0.20}Y_{0.80}BCO$, 4Gel-$Pr_{0.22}Y_{0.78}BCO$, and 4Gel-$Pr_{0.24}Y_{0.76}BCO$ were immediately installed in a furnace filled with dry gas, the calcining was performed under a humidified pure oxygen atmosphere at 400° C. or lower with the profile illustrated in FIG. 6, and translucent brown calcining films 4Cal-$Pr_{0.18}Y_{0.82}BCO$ (Example 4, calcined film of resulting 18% Pr, 82% Y films), 4Cal-$Pr_{0.20}Y_{0.80}BCO$, 4Cal-$Pr_{0.22}Y_{0.78}BCO$, and 4Cal-$Pr_{0.24}Y_{0.76}BCO$ were each obtained.

In the profile illustrated in FIG. 7, the calcining film 4Cal-$Pr_{0.18}Y_{0.82}BCO$, 4Cal-$Pr_{0.20}Y_{0.80}BCO$, 4Cal-$Pr_{0.22}Y_{0.78}BCO$, and 4Cal-$Pr_{0.24}Y_{0.76}BCO$ were fired in 1000 ppm oxygen mixed argon gas at 800° C. and annealed in pure oxygen at 525° C. or lower, and the oxide thin film 4F-$Pr_{0.18}Y_{0.82}BCO$ (Example 4, fired oxide films of $Pr_{0.18}Y_{0.82}BCO$), 4F-$Pr_{0.20}Y_{0.80}BCO$, 4F-$Pr_{0.22}Y_{0.78}BCO$, and 4F-$Pr_{0.24}Y_{0.76}BCO$ were each obtained.

As a result of measuring each of the centers of the oxide thin films 4F-$Pr_{0.18}Y_{0.82}BCO$ (Example 4, fired oxide films of $Pr_{0.18}Y_{0.82}BCO$), 4F-$Pr_{0.20}Y_{0.80}BCO$, 4F-$Pr_{0.22}Y_{0.78}BCO$, and 4F-$Pr_{0.24}Y_{0.76}BCO$ by a 2θ/ω method of XRD measurement, only a YBCO (00n) peak was confirmed, and CuO, $Y_2O_3$, $BaCuO_2$, or the like, which is a heterogeneous phase, was at a level where the difference from the background could not be discriminated. YBCO (006) was the strongest peak, and the peak of the heterogeneous phase was 1/1000 or less.

Superconducting characteristics of oxide thin films 4F-$Pr_{0.18}Y_{0.82}BCO$, 4F-$Pr_{0.20}Y_{0.80}BCO$, 4F-$Pr_{0.22}Y_{0.78}BCO$, and 4F-$Pr_{0.24}Y_{0.76}BCO$ were each measured by an inductive method in liquid nitrogen under a self-magnetic field. The obtained superconducting characteristics each were 0.00, 0.00, 0.00, and 0.00 $MA/cm^2$ (77 K, 0 T).

Even if the 5 times degradation phenomenon of Pr was effective, 10% of the superconducting portion should remain in the oxide thin film 4F-$Pr_{0.18}Y_{0.82}BCO$, but the measurement result was zero. The Jc value that can be discriminated by the inductive method is estimated to be 0.20 $MA/cm^2$ (77 K, 0 T), and the characteristic of 0.67 $MA/cm^2$ (77 K, 0 T) should be obtained in the calculation, and it should be detected by the inductive method, but was 0.00.

Oxide thin films 4F-$Pr_{0.18}Y_{0.82}BCO$, 4F-$Pr_{0.20}Y_{0.80}BCO$, 4F-$Pr_{0.22}Y_{0.78}BCO$, and 4F-$Pr_{0.24}Y_{0.76}BCO$ were deposited with silver having a width of 2 mm perpendicular to the 10 mm square diagonal direction of the film surface by an electron beam method and was subjected to heat treatment at 180° C. under pure oxygen, thereby improving the contactability between the deposited silver and the superconducting layer. Two terminals at both end portions are current terminals, and two terminals at a central portion are voltage terminals. The temperature of the sample was controlled by moving a metal plate directly disposed above liquid nitrogen up and down, and Tc measurement was performed with a current of 0.10 µA by a DC 4-probe method. Tc was determined on the basis of 1 µV/cm.

The obtained Tc value was 90.34 K for the oxide thin film 4F-$Pr_{0.18}Y_{0.82}BCO$. In other oxide thin films 4F-$Pr_{0.20}Y_{0.80}BCO$, 4F-$Pr_{0.22}Y_{0.78}BCO$, and 4F-$Pr_{0.24}Y_{0.76}BCO$, the superconducting transition could not be confirmed.

It was found from the results of the XRD phase identification, the inductive method, and the DC 4-probe method that the oxide thin films 4F-$Pr_{0.20}Y_{0.80}BCO$, 4F-$Pr_{0.22}Y_{0.78}BCO$, and 4F-$Pr_{0.24}Y_{0.76}BCO$ are a non-superconducting layer that has the same perovskite structure as YBCO but has zero superconducting characteristics due to the 5 times degradation phenomenon of Pr. However, although the characteristics of the oxide thin film 4F-$Pr_{0.18}Y_{0.82}BCO$ were not shown by the inductive method, the superconducting transition was confirmed in the Tc measurement. From this, it can be estimated that although it is low, a continuous conduction path exists between the measurement current terminals due to the superconducting transition, and only the Tc measurement result is obtained. Therefore, when the YBCO superconductor with 18% Pr substitution is used, it is considered that the AC loss reduction effect is reduced due to the incomplete blocking of the superconducting current.

However, depending on the application of superconductivity, there may be applications that can be used even in superconductors with 18% Pr substitution. It seems that the applicability is determined by the allowable amount of current leakage, but if a more reliable AC loss reduction effect is expected, it was found that it is desirable to use YBCO in which Y is substituted with 20% or more of Pr.

At the amounts of Pr substitution of 27%, 30%, 35%, and 40%, no decomposition reaction occurred during the reaction and the solution formation on the first day, but precipitation occurred with the methanol solution. This is thought to be due to the limitation of stabilization by the PS-SIG method, and it is thought that methanol and trifluoroacetic acid salt were reacted by the esterification reaction to decompose the coating solution. In the future, it is expected that the upper limit of the amount of Pr substitution will improve slightly as the purity of praseodymium acetate improves. This is because there is a possibility that impurities are causing the esterification reaction, which is suppressed.

However, even if the purity of Pr is improved, there seems to be a limit to the increase in the substitutable amount. Pr is originally a substance with a large ionic radius and is a substance that easily undergoes an esterification reaction in a methanol solution. Even when the SmBCO, which has a smaller ionic radius than Pr, is stabilized using the YBCO, the limit of the amount of Sm substitution for Y is about 50%, so it can be easily assumed that Pr also has the limited amount of substitution.

It was found from the experimental results that if the amount of Pr substitution is 20%, 22%, and 24%, a non-superconductor in a region of 100 μm square is formed to divide the superconducting region, and a structure expected to reduce AC loss can be obtained.

Example 5

According to the flowchart illustrated in FIG. 3, four types of coating solutions for superconductors are synthesized and purified. One of the two coating solutions to be first synthesized was a solution synthesized by a combination of each hydrate of 98% purity of $Pr(OCOCH_3)_3$, 99% purity of $Dy(OCOCH_3)_3$, 99% purity of $Ba(OCOCH_3)_2$, and 99% purity of $Cu(OCOCH_3)_2$ with metal acetate and the other of the two coating solutions was a solution synthesized by a combination of each hydrate of 98% purity of $Pr(OCOCH_3)_3$, 99% purity of $Ho(OCOCH_3)_3$, 99% purity of $Ba(OCOCH_3)_3$, and 99% purity of $Cu(OCOCH_3)_3$ with metal acetate.

These two types of combinations were dissolved in ion-exchanged water at a metal ion molar ratio of 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 5Mi-low-$Pr_{0.22}Dy_{0.78}BCO$ (substance described in Example 5, Pr with low purity, 22% Pr, 78% Dy Material with impurity) and 5Mi-low-$Pr_{0.22}Ho_{0.78}BCO$ were obtained.

About 7 wt. % of water or acetic acid which is reaction by-products during solution synthesis was contained in the obtained translucent blue substances 5Mi-low-$Pr_{0.22}Dy_{0.78}BCO$ and 5Mi-low-$Pr_{0.22}Ho_{0.78}BCO$. When 20 times by weight of anhydrous methanol was added to translucent blue substances 5Mi-low-$Pr_{0.22}Dy_{0.78}BCO$ and 5Mi-low-$Pr_{0.22}Ho_{0.78}BCO$ and dissolved, a greenish white precipitate occurred, and therefore the experiment was stopped.

According to the flowchart illustrated in FIG. 3, one of the remaining two coating solutions to be synthesized was a solution synthesized by a combination of each hydrate of 99% purity of $Pr(OCOCH_3)_3$, 99% purity of $Dy(OCOCH_3)_3$, 99% purity of $Ba(OCOCH_3)_2$, and 99% purity of $Cu(OCOCH_3)_2$ with metal acetate and the other of the two coating solutions was a solution synthesized by a combination of each hydrate of 99% purity of $Pr(OCOCH_3)_3$, 99% purity of $Ho(OCOCH_3)_3$, 99% purity of $Ba(OCOCH_3)_2$, and 99% purity of $Cu(OCOCH_3)_2$ with metal acetate.

These two types of combinations were dissolved in ion-exchanged water at a metal ion molar ratio of 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 5Mi-high-$Pr_{0.22}Dy_{0.78}BCO$ (substance described in Example 5, Pr with high purity, 22% Pr, 78% Dy Material with impurity) and 5Mi-high-$Pr_{0.22}Ho_{0.78}BCO$ were obtained.

About 7 wt. % of water or acetic acid which is reaction by-products during solution synthesis was contained in the obtained translucent blue substances 5Mi-high-$Pr_{0.22}Dy_{0.78}BCO$ and 5Mi-high-$Pr_{0.22}Ho_{0.78}BCO$.

20 times by weight of anhydrous methanol was added to translucent blue substances 5Mi-high-$Pr_{0.22}Dy_{0.78}BCO$ and 5Mi-high-$Pr_{0.22}Ho_{0.78}BCO$ and dissolved, and the coating solutions 5CSi-high-$Pr_{0.22}Dy_{0.78}BCO$ (coating solution described in Example 5, Pr with high purity, 22% Pr, 78% Dy Material with impurity), and 5CSi-high-$Pr_{0.22}Ho_{0.78}BCO$ were each obtained.

When the obtained coating solutions 5CSi-high-$Pr_{0.22}Dy_{0.78}BCO$ and 5CSi-high-$Pr_{0.22}Ho_{0.78}BCO$ were reacted and purified again under reduced pressure in a rotary evaporator for 12 hours, translucent blue substances 5M-high-$Pr_{0.22}Dy_{0.78}BCO$ (substance described in Example 5, Pr with high purity, 22% Pr, 78% Dy Material without impurity), and 5M-high-$Pr_{0.22}Ho_{0.78}BCO$ were obtained.

Translucent blue substances 5M-high-$Pr_{0.22}Dy_{0.78}BCO$ (substance described in Example 5, Pr with high purity, 22% Pr, 78% Dy Material without impurity) and 5M-high-$Pr_{0.22}Ho_{0.78}BCO$ were dissolved in methanol (j in FIG. 3) and diluted using a volumetric flask, and each of the coating solutions 5CS-high-$Pr_{0.22}Dy_{0.78}BCO$ (coating solution described in Example 5, Pr with high purity, 22% Pr, 78% Dy Material without impurity), and 5CS-high-$Pr_{0.22}Ho_{0.78}BCO$ of 1.50 mol/l in terms of metal ions were obtained.

The coating solutions 5CS-high-$Pr_{0.22}Dy_{0.78}BCO$, and 5CS-high-$Pr_{0.22}Ho_{0.78}BCO$ were used, a film was formed on $LaAlO_3$ (100) oriented single crystal of a 10 mm×10 mm×0.50 mmt with an acceleration of 10000 rpm/s, a maximum rotation speed of 4000 rpm, and a holding time of 60 s using a spin coating method, and translucent blue gel films 5Gel-high-$Pr_{0.22}Dy_{0.78}BCO$ (Example 5, Pr with high purity, gel film of resulting 22% Pr, 78% Dy films), and 5Gel-high-$Pr_{0.02}Ho_{0.78}BCO$ were each obtained.

The obtained gel films 5Gel-high-$Pr_{0.22}Dy_{0.78}BCO$ and 5Gel-high-$Pr_{0.22}Ho_{0.78}BCO$ were immediately installed in a furnace filled with dry gas, the calcining was performed under a humidified pure oxygen atmosphere at 400° C. or lower with the profile illustrated in FIG. 6, and translucent brown calcining films 5Cal-high-$Pr_{0.22}Dy_{0.78}BCO$ (Example 5, Pr with high purity, calcined film of resulting 22% Pr, 78% Dy films) and 5Cal-high-$Pr_{0.22}Ho_{0.78}BCO$ were each obtained.

In the profile illustrated in FIG. 7, the calcining films 5Cal-high-$Pr_{0.22}Dy_{0.78}BCO$ and 5Cal-high-$Pr_{0.22}Ho_{0.78}BCO$ were fired in 1000 ppm oxygen mixed argon gas at 800° C. and annealed in pure oxygen at 525° C. or lower, and the oxide thin films 5F-high-$Pr_{0.22}Dy_{0.78}BCO$ (Example 5, fired oxide films of $Pr_{0.22}Dy_{0.78}BCO$, Pr with high purity) and 5F-high-$Pr_{0.22}Ho_{0.78}BCO$ were each obtained.

As a result of measuring the oxide thin films 5F-high-$Pr_{0.22}Dy_{0.78}BCO$ and 5F-high-$Pr_{0.22}H_{0.78}BCO$ by a 2θ/ω method of XRD measurement, peaks of DyBCO (00n) and HoBCO (00n) were confirmed, and CuO, $Y_2O_3$, $BaCuO_2$, or the like, which is a heterogeneous phase, was at a level where the difference from the background could not be discriminated. DyBCO (006) and HoBCO (006) were the strongest peaks, and the peak of the heterogeneous phase was $\frac{1}{1000}$ or less. In addition, the characteristic peak intensity of the perovskite structure of the rare earth was also observed. That is, of the seven (00n) peaks, three peaks with high intensities are (001), (003), and (006). In the case of the YBCO, three peaks (003), (005), and (006) are strong peaks.

Superconducting characteristics of oxide thin films 5F-high-$Pr_{0.22}Dy_{0.78}BCO$ and 5F-high-$Pr_{0.22}Ho_{0.78}BCO$ were each measured by an inductive method in liquid nitrogen under a self-magnetic field. The obtained superconducting characteristics each were 0.00 and 0.00 $MA/cm^2$ (77 K, 0 T).

Oxide thin films 5F-high-$Pr_{0.22}Dy_{0.78}BCO$ and 5F-high-$Pr_{0.22}Ho_{0.78}BCO$ were deposited with silver having a width of 2 mm perpendicular to the 10 mm square diagonal direction of the film surface by an electron beam method and was subjected to heat treatment at 180° C. under pure oxygen, thereby improving the contactability between the deposited silver and the superconducting layer. Two terminals at both end portions are current terminals, and two terminals at a central portion are voltage terminals. The temperature of the sample was controlled by moving a metal plate directly disposed above liquid nitrogen up and down, and Tc measurement was performed with a current of 0.10 μA by a DC 4-probe method. Tc was determined on the basis of 1 μV/cm.

The superconducting transition of the oxide thin films 5F-high-$Pr_{0.22}Dy_{0.78}BCO$ and 5F-high-$Pr_{0.22}Ho_{0.78}BCO$ was not observed, and no superconductor was observed even at the Tc measurement level.

It was found from the results of the XRD phase identification, the inductive method, and the DC 4-probe method that the oxide thin films 5F-high-$Pr_{0.22}Dy_{0.78}BCO$ and 5F-high-$Pr_{0.22}Ho_{0.78}BCO$ are a non-superconducting layer that has the same perovskite structure as YBCO but has zero superconducting characteristics due to the 5 times degradation phenomenon of Pr. It was found that the 5 times degradation phenomenon of Pr is applied even if the amount of Pr exceeds 20%, and is applied to both DyBCO and HoBCO even if the superconductor of the matrix is not YBCO.

In this solution synthesis, even if the matrix element changed from Y to Dy or Ho, the precipitation occurred in the solution synthesis with 98% purity of Pr. The precipitate is considered to be a Pr compound based on its color. The condition that Pr can be substituted by 22% is considered to be the condition that Pr has high purity. Under that condition, it was found that the solution can be obtained by applying the PS-SIG method.

Example 3

According to the flowchart illustrated in FIG. 3, three types of coating solutions for superconductors are synthesized and purified. The first coating solution is a solution synthesized by a combination of each hydrate of 98% purity of $Pr(OCOCH_3)_3$, 99% purity of $Dy(OCOCH_3)_3$, 99% purity of $Ba(OCOCH_3)_2$, 99% purity of $Cu(OCOCH_3)_2$ with metal acetate, the second coating solution is a solution synthesized by a combination of each hydrate of 98% purity of $Pr(OCOCH_3)_2$, 99% purity of $Ho(OCOCH_3)_3$, 99% purity of $Ba(OCOCH_3)_2$, and 99% purity of $Cu(OCOCH_3)_2$ with metal acetate, and the third coating solution is a solution synthesized by a combination of each hydrate of 98% purity of $Pr(OCOCH_3)_3$, 99% purity of $Yb(OCOCH_3)_3$, 99% purity of Ba $(OCOCH_3)_2$, and 99% purity of $Cu(OCOCH_3)_2$ with metal acetate.

These three types of combinations were dissolved in ion-exchanged water at a metal ion molar ratio of 0.15:0.85:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 6Mi-low-$Pr_{0.15}Dy_{0.85}BCO$ (substance described in Example 6, Pr with low purity, 15% Pr, 85% Dy Material with impurity), 6Mi-low-$Pr_{0.15}Ho_{0.85}BCO$, and 6Mi-low-$Pr_{0.15}Yb_{0.85}BCO$ were obtained.

About 7 wt. % of water or acetic acid which is reaction by-products during solution synthesis was contained in the obtained translucent blue substances 6Mi-low-$Pr_{0.15}Dy_{0.85}BCO$, 6Mi-low-$Pr_{0.15}Ho_{0.85}BCO$, and 6Mi-low-$Pr_{0.15}Yb_{0.85}BCO$. When 20 times by weight of anhydrous methanol was added to translucent blue substances 6Mi-low-$Pr_{0.15}Dy_{0.85}BCO$, 6Mi-low-$Pr_{0.15}Ho_{0.85}BCO$, and 6Mi-low-$Pr_{0.15}Yb_{0.85}BCO$ and dissolved, a greenish white precipitate occurred in the entire solution, and therefore the experiment was stopped.

In a system in which the matrix elements were Dy and Ho, it was investigated whether the coating solution could be obtained without precipitation when the amount of Pr was reduced to 15%, but no results were obtained. The precipitation is likely to occur when the purity of Pr is 98%, and it was found in this experiment that it is preferable to use 99% purity or more of Pr in order to realize the AC loss reduction structure.

In addition, a system using Yb, which is a heavy rare earth element, as a matrix has been attempted, but the results were the same. It was found that the high purity of Pr is the condition for forming the non-superconductor while forming the common perovskite structure. At present, no matter what matrix element was used, no change occurred.

Example 7

According to the flowchart illustrated in FIG. 3, four types of coating solutions for superconductors are synthesized and purified. A first coating solution was a solution synthesized by a combination of each hydrate and anhydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ with metal acetate.

The coating solution was dissolved in ion-exchanged water at a metal ion molar ratio of 0.22:0.78:2:3 and were mixed and stirred with a reaction equimolar amount of $CF_3OOOH$, and the obtained mixed solution was put in an eggplant-shaped flask, and reacted and purified under reduced pressure in a rotary evaporator for 12 hours. A translucent blue substance 7Mi-$Pr_{0.22}Y_{0.78}$BCO (substance described in Example 7, 22% Pr, 78% Y Material with impurity) was obtained.

The second to fourth coating solutions using 99% purity of $Dy(OCOCH_3)_3$, 99% purity of $Ho(OCOCH_3)_3$, and 99% purity of $Yb(OCOCH_3)_3$ instead of the above-described 99% purity of $Y(OCOCH_3)_3$ were dissolved in ion-exchanged water at a metal ion molar ratio of 0.22:0.78:2:3, were mixed and stirred with a reaction equimolar amount of $CF_3COOH$, and the obtained mixed solution was put in an eggplant-shaped flask and reacted and purified under reduced pressure in a rotary evaporator for 12 hours. Translucent blue substances 7Mi-$Pr_{0.22}Dy_{0.78}$BCO, 7Mi-$Pr_{0.22}Ho_{0.78}$BCO, and 7Mi-$Pr_{0.22}Yb_{0.78}$BCO were each obtained.

About 7 wt. % of water or acetic acid which is reaction by-products during solution synthesis was contained in the obtained translucent blue substances 7Mi-$Pr_{0.22}Y_{0.78}$BCO, 7Mi-$Pr_{0.22}Dy_{0.78}$BCO, 7Mi-$Pr_{0.22}Ho_{0.78}$BCO, and 7Mi-$Pr_{0.22}Yb_{0.78}$BCO.

20 times by weight of anhydrous methanol was added to the obtained translucent blue substances 7Mi-$Pr_{0.22}Y_{0.78}$BCO, 7Mi-$Pr_{0.22}Dy_{0.78}$BCO, 7Mi-$Pr_{0.22}Ho_{0.78}$BCO, and 7Mi-$Pr_{0.22}Yb_{0.78}$BCO and dissolved, and the coating solutions 7CSi-high-$Pr_{0.22}Y_{0.78}$BCO (coating solution described in Example 7, 22% Pr, 78% Y Material with impurity), 7CSi-high-$Pr_{0.22}Dy_{0.78}$BCO, 7CSi-high-$Pr_{0.22}Ho_{0.78}$BCO, and 7CSi-high-$Pr_{0.22}Yb_{0.78}$BCO were each obtained.

When the obtained coating solutions 7CSi-high-$Pr_{0.22}Y_{0.78}$BCO, 7CSi-high-$Pr_{0.22}Dy_{0.78}$BCO, 7CSi-high-$Pr_{0.22}Ho_{0.78}$BCO, and 7CSi-high-$Pr_{0.22}YB_{0.78}$BCO were reacted and purified again under reduced pressure in a rotary evaporator for 12 hours, translucent blue substances 7M-high-$Pr_{0.22}Y_{0.78}$BCO (substance described in Example 7, 22% 78% Y Material without impurity), 7M-high-$Pr_{0.22}Dy_{0.78}$BCO, 7M-high-$Pr_{0.22}Ho_{0.78}$BCO, and 7M-high-$Pr_{0.22}Yb_{0.78}$BCO were each obtained.

Translucent blue substances 7M-high-$Pr_{0.22}Y_{0.78}$BCO, 7M-high-$Pr_{0.22}Dy_{0.78}$BCO, 7M-high-$Pr_{0.22}Ho_{0.78}$BCO, and 7M-high-$Pr_{0.22}Yb_{0.78}$BCO were dissolved in methanol (j in FIG. 3) and diluted using a volumetric flask, and each of the coating solutions 7CS-$Pr_{0.22}Y_{0.78}$BCO (coating solution described in Example 7, 22% Pr, 78% Y without impurity) 7CS-$Pr_{0.22}Dy_{0.78}$BCO, 7CS-$Pr_{0.22}Ho_{0.78}$BCO, and 7CS-$Pr_{0.22}Yb_{0.78}$BCO of 1.50 mol/l in terms of metal ions were each obtained.

Two types of coating solutions are mixed to form a new coating solution. First, 7CS-$Pr_{0.22}Y_{0.78}$BCO and 7CS-$Pr_{0.22}Dy_{0.78}$BCO were mixed at a ratio of 1:3, 2:2, and 3:1, respectively, and the coating solutions 7CS-$Pr_{0.22}Y_{0.195}Dy_{0.585}$BCO (coating solution described in Example 7, 22% Pr, 19.5% Y, 58.5% Dy without impurity), 7CS-$Pr_{0.22}Y_{0.38}Dy_{0.38}$BCO, and 7CS-$Pr_{0.22}Y_{0.585}Dy_{0.195}$BCO were each obtained.

Similarly, the coating solutions 7CS-$Pr_{0.22}Y_{0.78}$BCO and 7CS-$Pr_{0.22}Ho_{0.78}$BCO were mixed at a ratio of 1:3, 2:2, and 3:1, respectively, and the coating solutions 7CS-$Pr_{0.22}Y_{0.195}Ho_{0.585}$BCO, 7CS-$Pr_{0.22}Y_{0.38}Ho_{0.38}$BCO, and 7CS-$Pr_{0.22}Y_{0.585}Ho_{0.195}$BCO were each obtained.

Similarly, the coating solutions 7CS-$Pr_{0.22}Y_{0.78}$BCO and 7CS-$Pr_{0.22}Yb_{0.78}$BCO were mixed at a ratio of 1:3, 2:2, and 3:1, respectively, and the coating solutions 7CS-$Pr_{0.22}Y_{0.195}Yb_{0.585}$BCO, 7CS-$Pr_{0.22}Y_{0.38}Yb_{0.38}$BCO, and 7CS-$Pr_{0.22}Y_{0.585}Yb_{0.195}$BCO were each obtained.

Similarly, the coating solutions 7CS-$Pr_{0.22}Dy_{0.78}$BCO and 7CS-$Pr_{0.22}Ho_{0.78}$BCO were mixed at a ratio of 1:3, 2:2, and 3:1, respectively, and the coating solutions 7CS-$Pr_{0.22}Dy_{0.195}Ho_{0.585}$BCO, 7CS-$Pr_{0.22}Dy_{0.38}Ho_{0.38}$BCO, and 7CS-$Pr_{0.22}Dy_{0.585}Ho_{0.195}$BCO were each obtained.

Similarly, the coating solutions 7CS-$Pr_{0.22}Dy_{0.78}$BCO and 7CS-$Pr_{0.22}Yb_{0.78}$BCO were mixed at a ratio of 1:3, 2:2, and 3:1, respectively, and the coating solutions 7CS-$Pr_{0.22}Dy_{0.195}Yb_{0.585}$BCO, 7CS-$Pr_{0.22}Dy_{0.38}Yb_{0.38}$BCO, and 7CS-$Pr_{0.22}Dy_{0.585}Yb_{0.195}$BCO were each obtained.

Three types of coating solutions are mixed to create a new coating solution. 7CS-$Pr_{0.22}Y_{0.78}$BCO, 7CS-$Pr_{0.22}Dy_{0.78}$BCO, and 7CS-$Pr_{0.22}Ho_{0.78}$BCO were mixed at a ratio of 1:1:1 and a coating solution 7CS-$Pr_{0.22}Y_{0.26}Dy_{0.26}Ho_{0.26}$BCO was obtained.

Four types of coating solutions are mixed to create a new coating solution. 7CS-$Pr_{0.22}Y_{0.78}$BCO, 7CS-$Pr_{0.22}Dy_{0.78}$BCO, 7CS-$Pr_{0.22}Ho_{0.78}$BCO, and 7CS-$Pr_{0.22}Yb_{0.78}$BCO were mixed at a ratio of 1:1:1:1 and a coating solution 7CS-$Pr_{0.22}Y_{0.195}Dy_{0.195}Yb_{0.195}$BCO was obtained.

Coating solutions 7CS-$Pr_{0.22}Y_{0.195}Dy_{0.585}$BCO, 7CS-$Pr_{0.22}Y_{0.38}Dy_{0.38}$BCO, 7CS-$Pr_{0.22}Y_{0.585}Dy_{0.195}$BCO, 7CS-$Pr_{0.22}Y_{0.195}Ho_{0.585}$BCO, 7CS-$Pr_{0.22}Y_{0.38}Ho_{0.38}$BCO, 7CS-$Pr_{0.22}Y_{0.585}Ho_{0.585}$BCO, 7CS-$Pr_{0.22}Y_{0.195}Yb_{0.585}$BCO, 7CS-$Pr_{0.22}Y_{0.38}Yb_{0.38}$BCO, 7CS-$Pr_{0.22}Y_{0.585}Yb_{0.195}$BCO, 7CS-$Pr_{0.22}Dy_{0.195}Ho_{0.585}$BCO, 7CS-$Pr_{0.22}Dy_{0.38}Ho_{0.38}$BCO, 7CS-$Pr_{0.22}Dy_{0.585}Ho_{0.195}$BCO, 7CS-$Pr_{0.22}Dy_{0.195}Yb_{0.585}$BCO, 7CS-$Pr_{0.22}Dy_{0.38}Yb_{0.38}$BCO, 7CS-$Pr_{0.22}Dy_{0.585}Yb_{0.195}$BCO, 7CS-$Pr_{0.22}Y_{0.26}Dy_{0.26}Ho_{0.26}$BCO, and 7CS-$Pr_{0.22}Y_{0.195}Dy_{0.195}Ho_{0.195}Yb_{0.195}$BCO were used, a film was formed on $LaAlO_3$ (100) oriented single crystal of a 10 mm×10 mm×0.50 mmt with an acceleration of 10000 rpm/s, a maximum rotation speed of 4000 rpm, and a holding time of 60 s using a spin coating method, and translucent blue gel films 7Gel-$Pr_{0.22}Y_{0.195}Dy_{0.585}$BCO (Example 7, gel film of resulting 22% Pr, 19.5% Y, 58.5% Dy films), 7Gel-$Pr_{0.22}Y_{0.38}Dy_{0.38}$BCO, 7Gel-$Pr_{0.22}Y_{0.585}Dy_{0.195}$BCO, 7Gel-$Pr_{0.22}Y_{0.195}Ho_{0.585}$BCO, 7Gel-$Pr_{0.22}Y_{0.38}Ho_{0.38}$BCO, 7Gel-$Pr_{0.22}Y_{0.585}Ho_{0.195}$BCO, 7Gel-$Pr_{0.22}Y_{0.195}Yb_{0.585}$BCO, 7Gel-$Pr_{0.22}Y_{0.38}Yb_{0.38}$BCO, 7Gel-$Pr_{0.22}Y_{0.585}Yb_{0.195}$BCO, 7Gel-$Pr_{0.22}Dy_{0.195}Ho_{0.585}$BCO, 7Gel-$Pr_{0.22}Dy_{0.38}Ho_{0.38}$BCO, 7Gel-$Pr_{0.22}Dy_{0.585}Ho_{0.195}$BCO, 7Gel-$Pr_{0.22}Dy_{0.195}Yb_{0.585}$BCO, 7Gel-$Pr_{0.22}Dy_{0.38}Yb_{0.38}$BCO, 7Gel-$Pr_{0.22}Dy_{0.585}Yb_{0.195}$BCO, 7Gel-$Pr_{0.22}Y_{0.26}Dy_{0.26}Ho_{0.26}$BCO, and 7Gel-$Pr_{0.22}Y_{0.195}Dy_{0.195}Ho_{0.195}Yb_{0.195}$BCO were each obtained.

The obtained gel films 7Gel-$Pr_{0.22}Y_{0.195}Dy_{0.585}$BCO, 7Gel-$Pr_{0.22}Y_{0.38}Dy_{0.38}$BCO, 7Gel-$Pr_{0.22}Y_{0.585}Dy_{0.195}$BCO, 7Gel-$Pr_{0.22}Y_{0.195}Ho_{0.585}$BCO, 7Gel-$Pr_{0.22}Y_{0.38}Ho_{0.38}$BCO, 7Gel-$Pr_{0.22}Y_{0.585}Ho_{0.195}$BCO, 7Gel-$Pr_{0.22}Y_{0.195}Yb_{0.585}$BCO, 7Gel-$Pr_{0.22}Y_{0.38}Yb_{0.38}$BCO, 7Gel-$Pr_{0.22}Y_{0.585}Yb_{0.195}$BCO, 7Gel-$Pr_{0.22}Dy_{0.195}Ho_{0.585}$BCO, 7Gel-$Pr_{0.22}Dy_{0.38}Ho_{0.38}$BCO, 7Gel-$Pr_{0.22}Dy_{0.585}Ho_{0.195}$BCO, 7Gel-$Pr_{0.22}Dy_{0.195}Yb_{0.585}$BCO, 7Gel-$Pr_{0.22}Dy_{0.38}Yb_{0.38}$BCO, 7Gel-$Pr_{0.22}Dy_{0.585}Yb_{0.195}$BCO, 7Gel-$Pr_{0.22}Y_{0.26}Dy_{0.26}Ho_{0.26}$BCO, and 7Gel-$Pr_{0.22}Y_{0.195}Dy_{0.195}Ho_{0.195}Yb_{0.195}$BCO were immediately installed in a furnace filled with dry gas, the calcining was performed under a humidified pure oxygen atmosphere at 400° C. or lower with the profile illustrated in FIG. 6, and translucent brown calcining films 7Cal-$Pr_{0.22}Y_{0.195}Dy_{0.585}$BCO (Example 7, calcined film of resulting 22% Pr, 19.5% Y, 58.5% Dy films), 7Cal-$Pr_{0.22}Y_{0.38}Dy_{0.38}$BCO, 7Cal-$Pr_{0.22}Y_{0.585}Dy_{0.195}$BCO, 7Cal-$Pr_{0.22}Y_{0.195}Ho_{0.585}$BCO, 7Cal-$Pr_{0.22}Y_{0.38}Ho_{0.38}$BCO, 7Cal-$Pr_{0.22}Y_{0.585}Ho_{0.195}$BCO, 7Cal-$Pr_{0.22}Y_{0.195}Yb_{0.585}$BCO, 7Cal-$Pr_{0.22}Y_{0.38}Yb_{0.38}$BCO, 7Cal-$Pr_{0.22}Y_{0.585}Yb_{0.195}$BCO, 7Cal-$Pr_{0.22}Dy_{0.195}Ho_{0.585}$BCO, 7Cal-$Pr_{0.22}Dy_{0.38}Ho_{0.38}$BCO, 7Cal-$Pr_{0.22}Dy_{0.585}Ho_{0.195}$BCO, 7Cal-$Pr_{0.22}Dy_{0.195}Yb_{0.585}$BCO, 7Cal-$Pr_{0.22}Dy_{0.38}Yb_{0.38}$BCO, 7Cal-$Pr_{0.22}Dy_{0.585}Yb_{0.195}$BCO, 7Cal-$Pr_{0.22}Y_{0.26}Dy_{0.26}Ho_{0.26}$BCO, and 7Cal-$Pr_{0.220}Y_{0.195}Dy_{0.195}Ho_{0.195}Yb_{0.195}$BCO were each obtained.

In the profile illustrated in FIG. 7, calcining films 7Cal-$Pr_{0.22}Y_{0.195}Dy_{0.585}$BCO, 7Cal-$Pr_{0.22}Y_{0.38}Dy_{0.38}$BCO, 7Cal-$Pr_{0.22}Y_{0.585}Dy_{0.195}$BCO, 7Cal-$Pr_{0.22}Y_{0.195}Ho_{0.585}$BCO, 7Cal-$Pr_{0.22}Y_{0.38}Ho_{0.38}$BCO, 7Cal-$Pr_{0.22}Y_{0.585}Ho_{0.195}$BCO, 7Cal-$Pr_{0.22}Y_{0.195}Yb_{0.585}$BCO, 7Cal-$Pr_{0.22}Y_{0.38}Yb_{0.38}$BCO, 7Cal-$Pr_{0.22}Y_{0.585}Yb_{0.195}$BCO, 7Cal-$Pr_{0.22}Dy_{0.195}Ho_{0.585}$BCO, 7Cal-$Pr_{0.22}Dy_{0.38}Ho_{0.38}$BCO, 7Cal-$Pr_{0.22}Dy_{0.585}Ho_{0.195}$BCO, 7Cal-$Pr_{0.22}Dy_{0.195}Yb_{0.585}$BCO, 7Cal-$Pr_{0.22}Dy_{0.38}Yb_{0.38}$BCO, 7Cal-$Pr_{0.22}Dy_{0.585}Yb_{0.195}$BCO, 7Cal-$Pr_{0.22}Y_{0.26}Dy_{0.26}Ho_{0.26}$BCO, and 7Cal-$Pr_{0.22}Y_{0.195}Dy_{0.195}Ho_{0.195}Yb_{0.195}$BCO were fired in 1000 ppm oxygen mixed argon gas at 800° C. and annealed in pure oxygen of 525° C. or lower, and oxide thin films 7F-$Pr_{0.22}Y_{0.195}Dy_{0.585}$BCO (Example 7, fired oxide films of $Pr_{0.22}Y_{0.195}Dy_{0.585}$BCO), 7F-$Pr_{0.22}Y_{0.38}Dy_{0.38}$BCO, 7F-$Pr_{0.22}Y_{0.585}Dy_{0.195}$BCO, 7F-$Pr_{0.22}Y_{0.195}Ho_{0.585}$BCO, 7F-$Pr_{0.22}Y_{0.38}Ho_{0.38}$BCO, 7F-$Pr_{0.22}Y_{0.585}Ho_{0.195}$BCO, 7F-$Pr_{0.22}Y_{0.195}Yb_{0.585}$BCO, 7F-$Pr_{0.22}Y_{0.38}Yb_{0.38}$BCO, 7F-$Pr_{0.22}Y_{0.585}Yb_{0.195}$BCO, 7F-$Pr_{0.22}Dy_{0.195}Ho_{0.585}$BCO, 7F-$Pr_{0.22}Dy_{0.38}Ho_{0.38}$BCO, 7F-$Pr_{0.22}Dy_{0.585}Ho_{0.195}$BCO, 7F-$Pr_{0.22}Dy_{0.195}Yb_{0.585}$BCO, 7F-$Pr_{0.22}Dy_{0.38}Yb_{0.38}$BCO, 7F-$Pr_{0.22}Dy_{0.585}Yb_{0.195}$BCO, 7F-$Pr_{0.22}Y_{0.26}Dy_{0.26}Ho_{0.26}$BCO, and 7F-$Pr_{0.22}Y_{0.195}Dy_{0.195}Ho_{0.195}Yb_{0.195}$BCO were each obtained.

As a result of measuring each of the oxide thin films 7F-$Pr_{0.22}Y_{0.195}Dy_{0.585}$BCO, 7F-$Pr_{0.22}Y_{0.38}Dy_{0.38}$BCO, 7F-$Pr_{0.22}Y_{0.585}Dy_{0.195}$BCO, 7F-$Pr_{0.22}Y_{0.195}Ho_{0.585}$BCO, 7F-$Pr_{0.22}Y_{0.38}Ho_{0.38}$BCO, 7F-$Pr_{0.22}Y_{0.585}Ho_{0.195}$BCO, 7F-$Pr_{0.22}Y_{0.195}Yb_{0.585}$BCO, 7F-$Pr_{0.22}Y_{0.38}Yb_{0.38}$BCO, 7F-$Pr_{0.22}Y_{0.585}Yb_{0.195}$BCO, 7F-$Pr_{0.22}Dy_{0.195}Ho_{0.585}$BCO, 7F-$Pr_{0.22}Dy_{0.38}Ho_{0.38}$BCO, 7F-$Pr_{0.22}Dy_{0.585}Ho_{0.195}$BCO, 7F-$Pr_{0.22}Dy_{0.195}Yb_{0.585}$BCO, 7F-$Pr_{0.22}Dy_{0.38}Yb_{0.38}$BCO, 7F-$Pr_{0.22}Dy_{0.585}Yb_{0.195}$BCO, 7F-$Pr_{0.22}Y_{0.22}Dy_{0.26}Ho_{0.26}$BCO, and 7F-$Pr_{0.22}Y_{0.195}Dy_{0.195}Ho_{0.195}Yb_{0.195}$BCO by a 2θ/ω method of XRD measurement, peaks of YBCO (00n), DyBCO (00n), HoBCO (00n), and YbBCO (00n) were confirmed, and CuO, $Y_2O_3$, $BaCuO_2$ or the like, which is a heterogeneous phase, was at a level where the difference from the background could not be discriminated. Regarding the peak intensity, in those with a high YBCO ratio, (003), (005), and (006) peak intensities were strong, in those other than those with (001), (003), and (006) peak intensities were strong, and characteristics of ReBCO (00n) were shown. In each result, the strongest peak (006) and the heterogeneous phases peak is $1/1000$ or less, which is as follows.

Superconducting characteristics of oxide thin films 7F-$Pr_{0.22}Y_{0.195}Dy_{0.585}$BCO, 7F-$Pr_{0.22}Y_{0.38}Dy_{0.38}$BCO, 7F-$Pr_{0.22}Y_{0.585}Dy_{0.195}$BCO, 7F-$Pr_{0.22}Y_{0.195}Ho_{0.585}$BCO, 7F-$Pr_{0.22}Y_{0.38}Ho_{0.38}$BCO, 7F-$Pr_{0.22}Y_{0.585}Ho_{0.195}$BCO, 7F-$Pr_{0.22}Y_{0.195}Yb_{0.585}$BCO, 7F-$Pr_{0.22}Y_{0.38}Yb_{0.38}$BCO, 7F-$Pr_{0.22}Y_{0.585}Yb_{0.195}$BCO, 7F-$Pr_{0.22}Dy_{0.195}Ho_{0.585}$BCO, 7F-$Pr_{0.22}Dy_{0.38}Ho_{0.38}$BCO, 7F-$Pr_{0.22}Dy_{0.585}Ho_{0.195}$BCO, 7F-$Pr_{0.22}Dy_{0.195}Yb_{0.585}$BCO, 7F-$Pr_{0.22}Dy_{0.38}Yb_{0.38}$BCO, 7F-$Pr_{0.22}Dy_{0.585}Yb_{0.195}$BCO, 7F-$Pr_{0.22}Y_{0.26}Dy_{0.26}Ho_{0.26}$BCO, and 7F-$Pr_{0.22}Y_{0.195}Dy_{0.195}Ho_{0.195}Yb_{0.195}$BCO were each measured by an inductive method in liquid nitrogen under a self-magnetic field. All the obtained superconducting characteristics were 0.00 MA/cm² (77 K, 0 T).

Oxide thin films 7F-$Pr_{0.22}Y_{0.195}Dy_{0.585}$BCO, 7-$Pr_{0.22}Y_{0.38}Dy_{0.38}$BCO, 7F-$Pr_{0.22}Y_{0.585}Dy_{0.195}$BCO, 7F-$Pr_{0.22}Y_{0.195}Ho_{0.585}$BCO, 7F-$Pr_{0.22}Y_{0.38}Ho_{0.38}$BCO, 7F-$Pr_{0.22}Y_{0.585}$ $Ho_{0.195}$BCO, 7F-$Pr_{0.22}Y_{0.195}Yb_{0.585}$BCO, 7F-$Pr_{0.22}Y_{0.38}Yb_{0.38}$BCO, 7F-$Pr_{0.22}Y_{0.585}Yb_{0.195}$BCO, 7F-$Pr_{0.22}Dy_{0.195}Ho_{0.585}$BCO, 7F-$Pr_{0.22}Dy_{0.38}Ho_{0.38}$BCO, 7F-$Pr_{0.22}Dy_{0.585}Ho_{0.195}$BCO, 7F-$Pr_{0.22}Dy_{0.195}Yb_{0.585}$BCO, 7F-$Pr_{0.22}Dy_{0.38}Yb_{0.38}$BCO, 7F-$Pr_{0.22}Dy_{0.585}Yb_{0.195}$BCO, 7F-$Pr_{0.22}Y_{0.26}Dy_{0.26}Ho_{0.26}$BCO, and 7F-$Pr_{0.22}Y_{0.195}Dy_{0.195}Ho_{0.195}Yb_{0.195}$BCO were deposited with silver having a width of 2 mm perpendicular to the 10 mm square diagonal direction of the film surface by an electron beam method and was subjected to heat treatment at 180° C. under pure oxygen, thereby improving the contactability between the deposited silver and the superconducting layer. Two terminals at both end portions are current terminals, and two terminals at a central portion are voltage terminals. The temperature of the sample was controlled by moving a metal plate directly disposed above liquid nitrogen up and down, and Tc measurement was performed with a current of 0.10 µA by a DC 4-probe method. Tc was determined on the basis of 1 µV/cm.

Superconducting transition of all of the oxide thin films 7F-$Pr_{0.22}Y_{0.195}Dy_{0.585}$BCO, 7F-$Pr_{0.22}Y_{0.38}Dy_{0.38}$BCO, 7F-$Pr_{0.22}Y_{0.585}Dy_{0.195}$BCO, 7F-$Pr_{0.22}Y_{0.195}Ho_{0.585}$BCO, 7F-$Pr_{0.22}Y_{0.38}Ho_{0.38}$BCO, 7F-$Pr_{0.585}Ho_{0.195}$BCO, 7F-$Pr_{0.22}Y_{0.195}Yb_{0.585}$BCO, 7F-$Pr_{0.22}Y_{0.38}Yb_{0.38}$BCO, 7F-$Pr_{0.22}Y_{0.585}Yb_{0.195}$BCO, 7F-$Pr_{0.22}Dy_{0.195}Ho_{0.585}$BCO, 7F-$Pr_{0.22}Dy_{0.38}Ho_{0.38}$BCO, 7F-$Pr_{0.22}Dy_{0.585}Ho_{0.195}$BCO, 7F-$Pr_{0.22}Dy_{0.195}Ho_{0.585}$BCO, 7F-$Pr_{0.22}$ $Dy_{0.38}Yb_{0.38}$BCO, 7F-$Pr_{0.22}Dy_{0.585}Yb_{0.195}$BCO, 7F-$Pr_{0.22}Y_{0.26}Dy_{0.26}Ho_{0.26}$BCO, and 7F-$Pr_{0.22}Y_{0.195}Dy_{0.195}Ho_{0.195}Yb_{0.195}$BCO were not observed, and the semiconductor was not observed even in the Tc measurement level.

It was found from the results of the XRD phase identification, the inductive method, and the DC 4-probe method that the oxide thin films 7F-$Pr_{0.22}Y_{0.195}Dy_{0.585}$BCO, 7F-$Pr_{0.22}Y_{0.38}Dy_{0.38}$BCO, 7F-$Pr_{0.22}Y_{0.585}Dy_{0.195}$BCO, 7F-$Pr_{0.22}Y_{0.195}Ho_{0.585}$BCO, 7F-$Pr_{0.22}Y_{0.38}Ho_{0.38}$BCO, 7F-$Pr_{0.22}Y_{0.585}Ho_{0.195}$BCO, 7F-$Pr_{0.22}Y_{0.195}Ho_{0.585}$BCO, 7F-$Pr_{0.22}Y_{0.38}Y_{0.38}Yb_{0.38}$BCO, 7F-$Pr_{0.22}Y_{0.585}Yb_{0.195}$BCO, 7F-$Pr_{0.22}Dy_{0.195}Ho_{0.585}$BCO, 7F-$Pr_{0.22}Dy_{0.38}Ho_{0.38}$BCO, 7F-$Pr_{0.22}Dy_{0.585}Ho_{0.195}$BCO, 7F-$Pr_{0.22}Dy_{0.195}Yb_{0.585}$BCO, 7F-$Pr_{0.22}Dy_{0.38}Yb_{0.38}$BCO, 7F-$Pr_{0.22}Dy_{0.585}Yb_{0.195}$BCO, 1F-$Pr_{0.22}Y_{0.26}Dy_{0.26}Y_{0.26}Ho_{0.26}$BCO, and 7F-$Pr_{0.22}Y_{0.195}Dy_{0.195}Ho_{0.195}Yb_{0.195}$BCO is a non-superconducting layer that has the same perovskite structure as YBCO but has zero superconducting characteristics due to the 5 times degradation phenomenon of Pr. The case is investigated where solution elements that become a parent phase are Y, Dy, Ho, and Yb, but a coating solution without precipitation can be obtained by using any element except La, Nd, and Sm, which are basically easily decomposed, and it was found that a non-superconductor having a perovskite structure was formed from the solution by film formation, calcining, firing, and oxygen annealing.

In this connection, if the element, which becomes the parent phase, is Y, for example, there is a possibility that CARP is formed if the composition is 7F-$Pr_{0.22}Y_{0.585}Yb_{0.195}$BCO. This is because there are Pr, which has a large ionic radius, and Yb, which has a small ionic radius, with respect to Y, which is the parent phase. In the related application, only the experiment with a composition of up to 20% Pr has been conducted, and the present example is a first experimental example.

In this case, if the CARP is formed, Pr and Yb each form 19.5%, and a total of 38% forms the CARP. If the CARP size is sufficiently small and dispersed, adjacent cells will be non-superconducting, resulting in a non-superconducting layer with a perovskite structure.

On the other hand, if a large CARP is formed, its peripheral portion becomes non-superconducting, but the other parts remain superconducting. In that case, the Tc measurement should confirm the conduction of the superconducting current, but the experimental results do not so. Therefore, it is thought that a structure having no conduction of superconducting current as a whole is formed by forming a CARP having a sufficiently small size although the size is unknown, for example, 5 nm or less.

Example 8

According to the flowchart illustrated in FIG. 3, three types of coating solutions for superconductors are synthesized and purified. Powders of each hydrate of the coating solution of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

Each hydrate of $Pr(OCOCH_3)_3$, 99% purity of $Y(OCOCH_3)_3$, 99% purity of $Ba(OCOCH_3)_2$, and 99% purity of $Cu(OCOCH_3)_2$ were dissolved in ion-exchanged water at a metal ion molar ratio of 0.18:0.82:2:3, 0.20:0.80:2:3, and 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours.

From the reactions and purifications from the raw materials with metal ion molar ratios of 0.18:0.82:2:3, 0.20:0.80:2:3, and 0.22:0.78:2:3, translucent blue substances 8Mi-$Pr_{0.18}Y_{0.82}$BCO (substance described in Example 8, 18% Pr, 82% Y Material with impurity), 8Mi-$Pr_{0.20}Y_{0.80}$BCO, and 8Mi-$Pr_{0.22}Y_{0.78}$BCO were obtained.

About 7 wt. % of water or acetic acid which is reaction by-products during solution synthesis was contained in the obtained translucent blue substances 8Mi-$Pr_{0.18}Y_{0.82}$BCO, 8Mi-$Pr_{0.20}Y_{0.80}$BCO, and 8Mi-$Pr_{0.22}Y_{0.78}$BCO. 20 times by weight of anhydrous methanol was added to translucent blue substances 8Mi-$Pr_{0.18}Y_{0.82}$BCO, 8Mi-$Pr_{0.20}Y_{0.80}$BCO, and 8Mi-$Pr_{0.22}Y_{0.78}$BCO, and the coating solutions 8CSi-$Pr_{0.18}Y_{0.82}$BCO (coating solution described in Example 8, 18% Pr, 82% Y Material with impurity), 8CS-$Pr_{0.20}Y_{0.80}$BCO, and 8CSi-$Pr_{0.22}Y_{0.78}$BCO were each obtained.

When the obtained coating solutions 8CSi-$Pr_{0.18}Y_{0.82}$BCO, 8CSi-$Pr_{0.20}Y_{0.80}$BCO, and 8CSi-$Pr_{0.22}Y_{0.78}$BCO were reacted and purified again under reduced pressure in a rotary evaporator for 12 hours, translucent blue substances 8M-$Pr_{0.18}Y_{0.82}$BCO (substance described in Example 8, 18% Pr, 82% Y Material without impurity), 8M-$Pr_{0.20}Y_{0.80}$BCO, and 8M-$Pr_{0.22}Y_{0.78}$BCO were each obtained.

Translucent blue substance 8M-$Pr_{0.18}Y_{0.82}$BCO, 8M-$Pr_{0.20}Y_{0.80}$BCO, and 8M-$Pr_{0.22}Y_{0.78}$BCO were dissolved in methanol (j in FIG. 3) and diluted using a volumetric flask, and each of the coating solutions 8CS-$Pr_{0.18}Y_{0.82}$BCO (Example 8, coating Solution for 18% Pr, 82% perovskite structure), 8CS-$Pr_{0.20}Y_{0.80}$BCO, and 8CS-$Pr_{0.22}Y_{0.78}$BCO of 1.50 mol/l in terms of metal ions were each obtained.

The coating solutions 8CS-$Pr_{0.18}Y_{0.82}$BCO and 8CS-$Pr_{0.20}Y_{0.80}$BCO were mixed at 1:1, thereby obtaining the coating solution 8CS-$Pr_{0.19}Y_{0.81}$BCO. The concentration is 1.50 mol/l in terms of metal ions.

Similarly, the coating solutions 8CS-$Pr_{0.20}Y_{0.80}$BCO and 8CS-$Pr_{0.22}Y_{0.82}$BCO were mixed at 1:1, thereby obtaining the coating solution 8CS-$Pr_{0.21}Y_{0.079}$BCO. The concentration is 1.50 mol/l in terms of metal ions.

In addition, the coating solutions 8CS-$Pr_{0.18}Y_{0.82}$BCO and 8CS-$Pr_{0.22}Y_{0.78}$BCO were mixed at 1:1, thereby obtaining the coating solution 8CS-mixed-$Pr_{0.20}Y_{0.80}$BCO. The concentration is 1.50 mol/l in terms of metal ions.

The coating solutions 8CS-$Pr_{0.19}Y_{0.81}$BCO, 8CS-mixed-$Pr_{0.20}Y_{0.80}$BCO, and 8CS-$Pr_{0.21}Y_{0.29}$BCO were used, a film was formed on $LaAlO_3$ (100) oriented single crystal or a 10 mm×30 mm×0.50 mmt with an acceleration of 10000 rpm/s, a maximum rotation speed of 4000 rpm, and a holding time of 60 s using a spin coating method, and translucent blue gel films 8Gel-$Pr_{0.19}Y_{0.82}$BCO (Example 8, gel film of resulting 19% Pr, 81% Y films), 8Gel-mixed-$Pr_{0.20}Y_{0.80}$BCO, and 8Gel-$Pr_{0.21}Y_{0.79}$BCO were each obtained.

The obtained gel films 8Gel-$Pr_{0.19}Y_{0.81}$BCO, 8Gel-mixed-$Pr_{0.20}Y_{0.80}$BCO, and 8Gel-$Pr_{0.21}Y_{0.79}$BCO were immediately installed in a furnace filled with dry gas, the calcining was performed under a humidified pure oxygen atmosphere at 400° C. or lower with the profile illustrated in FIG. 6, and translucent brown calcining films 8Cal-$Pr_{0.19}Y_{0.81}$BCO (Example 8, calcined film of resulting 19% Pr, 81% Y films), 8Cal-mixed-$Pr_{0.20}Y_{0.80}$BCO, and 8Cal-$Pr_{0.21}Y_{0.79}$BCO were each obtained.

In the profile illustrated in FIG. 7, the calcining films 8Cal-$Pr_{0.19}Y_{0.81}$BCO, 8Cal-mixed-$Pr_{0.20}Y_{0.80}$BCO, and 8Cal-$Pr_{0.21}Y_{0.79}$BCO were fired in 1000 ppm, oxygen mixed argon gas at 800° C. and annealed in pure oxygen at 525° C. or lower, and the oxide thin films 8F-$Pr_{0.19}Y_{0.81}$BCO (Example 8, fired oxide films of $Pr_{0.19}Y_{0.81}$BCO), 8F-mixed-$Pr_{0.20}Y_{0.80}$BCO, and 8F-$Pr_{0.21}Y_{0.79}$BCO were each obtained.

As a result of measuring each of the oxide thin films 8F-$Pr_{0.19}Y_{0.81}$BCO, 8F-mixed-$Pr_{0.20}Y_{0.80}$BCO, and 8F-$Pr_{0.21}Y_{0.79}$BCO by a 2θ/ω method of XRD measurement, only a YBCO (00n) peak was confirmed, and CuO, $Y_2O_3$, $BaCuO_2$ or the like, which is a heterogeneous phase, was at a level where the difference from the background could not be discriminated. YBCO (006) was the strongest peak, and the peak of the heterogeneous phase was 1/1000 or less. Superconducting characteristics of oxide thin films 8F-$Pr_{0.19}Y_{0.79}$BCO, 8F-mixed-$Pr_{0.20}Y_{0.80}$BCO, and 8F-$Pr_{0.21}Y_{0.79}$BCO were each measured by an inductive method in liquid nitrogen under a self-magnetic field. The obtained superconducting characteristics each were 0.00, 0.00, and 0.00 $MA/cm^2$ (77 K, 0 T).

Even if the 5 times degradation phenomenon of Pr was effective, 5% of the superconducting portion should remain in the oxide thin film 8F-$Pr_{0.19}Y_{0.81}$BCO, but the measurement result was zero. The Jc value that can be discriminated by the inductive method is estimated to be 0.20 $MA/cm^2$ (77 K, 0 T), and the characteristic of 0.33 $MA/cm^2$ (77 K, 0 T) should be obtained in the calculation. Since there is a possibility that the superconducting current flow path is not thickly connected as in Example 4, the conduction by the Tc measurement was investigated.

Oxide thin films 8F-$Pr_{0.19}Y_{0.81}BCO$, 8F-mixed-$Pr_{0.20}Y_{0.80}BCO$, and 8F-$Pr_{0.21}Y_{0.79}BCO$ were deposited with silver having a width of 2 mm perpendicular to the 10 mm square diagonal direction of the film surface by an electron beam method and was subjected to heat treatment at 180° C. under pure oxygen, thereby improving the contactability between the deposited silver and the superconducting layer. Two terminals at both end portions are current terminals, and two terminals at a central portion are voltage terminals. The temperature of the sample was controlled by moving a metal plate directly disposed above liquid nitrogen up and down, and Tc measurement was performed with a current of 0.10 µA by a DC 4-probe method. Tc was determined on the basis of 1 µV/cm.

The obtained Tc value was 90.43 K for the oxide thin film 8F-$Pr_{0.19}Y_{0.81}BCO$. In other oxide thin films 8F-mixed-$Pr_{0.20}Y_{0.80}BCO$, and 8F-$Pr_{0.21}Y_{0.79}BCO$, the superconducting transition could not be confirmed.

It was found from the results of the XRD phase identification, the inductive method, and the DC 4-probe method that the oxide thin films 8F-mixed-$Pr_{0.20}Y_{0.80}BCO$ and 8F-$Pr_{0.21}Y_{0.79}BCO$ are a non-superconducting layer that has the same perovskite structure as YBCO but has zero superconducting characteristics due to the 5 times degradation phenomenon of Pr. However, although the characteristics of the oxide thin film 8F-$Pr_{0.19}Y_{0.81}BCO$ were not shown by the inductive method, the superconducting transition was confirmed in the Tc measurement. From this, it can be estimated that although it is low, a continuous conduction path exists between the measurement current terminals due to the superconducting transition, and only the Tc measurement result is obtained. Therefore, when the YBCO superconductor with 19% Pr substitution is used, it is considered that the AC loss reduction effect is reduced due to the incomplete blocking of the superconducting current. However, as described in Example 4, depending on the application of superconductivity, there may be applications that can be used even in superconductors with 19% Pr substitution. It seems that the applicability is determined by the allowable amount of current leakage, but if a more reliable AC loss reduction effect is expected, it was found that it is desirable to use YBCO in which Y is substituted with 20% or more of Pr.

Example 9

According to the flowchart illustrated in FIG. 3, coating solutions are synthesized and purified. Powders of each hydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used. $Pr(OCOCH_3)_3$, $Y(OCOCH_3)_3$, $Ba(OCOCH_3)_2$, and $Cu(OCOCH_3)2$ were dissolved in ion-exchanged water at a metal ion molar ratio of 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 9Mi-$Pr_{0.22}Y_{0.78}BCO$ (substance described in Example 9, 22% Pr, 78% Y Material with impurity) were obtained.

A coating solution different from the above coating solution is synthesized and purified. Powders of each hydrate of 99% purity of $Pr(OCOCH_3)_3$, 99% purity of $Sm(OCOCH_3)_3$, 99% purity of $Y(OCOCH_3)_3$, 99% purity of $Tm(OCOCH_3)_3$, 99% purity of $Ba(OCOCH_3)_2$, 99% purity of $Cu(OCOCH_3)_2$ in metal acetate were used. $Pr(OCOCH_3)_3$, $Sm(OCOCH_3)_3$, $Y(OCOCH_3)_3$, $Tm(OCOCH_3)_3$, $Ba(OCOCH_3)_2$, and $Cu(OCOCH_3)_2$ were dissolved in ion-exchanged water at a metal ion molar ratio of 0.02:0.02:0.92:0.04:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 9Mi-$Pr_{0.02}Sm_{0.02}Y_{0.92}Tm_{0.04}BCO$ (substance described in Example 9, 2% Pr, 2% Sm, 92% Y, 4% Tm Material with impurity) were obtained.

About 7 wt. % of water or acetic acid which is reaction by-products during solution synthesis was contained in the obtained translucent blue substances 9Mi-$Pr_{0.22}Y_{0.78}BCO$, and 9Mi-$Pr_{0.02}Sm_{0.02}Y_{0.92}Tm_{0.04}BCO$. 20 times by weight of anhydrous methanol was added to translucent blue substances 9Mi-$Pr_{0.22}Y_{0.78}BCO$, and 9Mi-$Pr_{0.02}Sm_{0.02}Y_{0.92}Tm_{0.04}BCO$ and dissolved, and the coating solutions 9CSi-$Pr_{0.22}Y_{0.78}BCO$ (coating solution described in Example 9, 22% Pr, 78% Y Material with impurity) and 9CSi-$Pr_{0.02}Sm_{0.02}Y_{0.92}Tm_{0.04}BCO$ were each obtained.

When the obtained coating solutions 9CSi-$Pr_{0.02}Y_{0.78}BCO$ and 9CSi-$Pr_{0.02}Sm_{0.02}Y_{0.92}Tm_{0.04}BCO$ were reacted and purified again under reduced pressure in a rotary evaporator for 12 hours, translucent blue substances 9M-$Pr_{0.22}Y_{0.78}BCO$ (substance described in Example 9, 22% Pr, 78% Y Material without impurity), and 9M-$Pr_{0.02}Sm_{0.02}Y_{0.92}Tm_{0.04}BCO$ were each obtained.

Translucent blue substances 9M-$Pr_{0.22}Y_{0.78}BCO$ and 9M-$Pr_{0.02}Sm_{0.02}Y_{0.92}Tm_{0.04}BCO$ were dissolved in methanol (j in FIG. 3) and diluted using a volumetric flask, and each of the coating solutions 9CS-$Pr_{0.22}Y_{0.78}BCO$ (Example 9, coating solution for 22% Pr, 78% Y perovskite structure) and 9CS-$Pr_{0.02}Sm_{0.02}Y_{0.92}Tm_{0.04}BCO$ of 1.50 mol/l in terms of metal ions were obtained.

The coating solutions 9CS-$Pr_{0.22}Y_{0.78}BCO$ and 9CS-$Pr_{0.02}Sm_{0.02}Y_{0.92}Tm_{0.04}BCO$ were used, two films were formed on $LaAlO_3$ (100) oriented single crystal of a 10 mm×10 mm×0.50 mint with an acceleration of 10000 rpm/s, a maximum rotation speed of 4000 rpm, and a holding time of 60 s using a spin coating method, and translucent blue gel films 9Gel-$Pr_{0.22}Y_{0.78}BCO$ (Example 9, gel film, of resulting 22% Pr, 78% Y films) and 9Gel-$Pr_{0.02}Sm_{0.02}Y_{0.92}Tm_{0.04}BCO$ were each obtained. This gel film is a film formation condition in which the film thickness becomes 150 nm after firing.

Coating solutions 9CS-$Pr_{0.22}Y_{0.78}BCO$ and 9CS-$Pr_{0.02}Sm_{0.02}Y_{0.92}Tm_{0.04}BCO$ were used, a coating solution 9CS-$Pr_{0.22}Y_{0.78}BCO$ dropped onto one side from a center and a coating solution 9CS-$Pr_{0.02}Sm_{0.02}Y_{0.92}Tm_{0.04}BCO$ dropped on the other side during film formation by the spin coating method, the spin coating was started at the moment when the center was mixed, and a translucent blue gel film 9Gel-$Pr_{0.22}Y_{0.78}BCO+Pr_{0.02}Sm_{0.02}Y_{0.92}Tm_{0.04}BCO$-C (Example 9, gel film of resulting 22% Pr, 78% Y films and 2% Pr, 2% Sm, 92% Y, 4% Tm films, chimera) was obtained. The film formation conditions were an acceleration of 10000 rpm/s, a maximum rotation speed of 4000 rpm, and a holding time of 60 s, and the single crystal substrate used was a $LaAlO_3$ (100) oriented single crystal substrate of 10 mm×30 mm×0.50 mmt.

The boundary at the center of the spin coat of translucent blue gel film 9Gel-$Pr_{0.22}Y_{0.78}BCO$ $Pr_{0.02}Sm_{0.02}Y_{0.92}Tm_{0.04}BCO$-C cannot be visually discriminated.

The obtained gel films 9Gel-$Pr_{0.22}Y_{0.78}BCO$, 9Gel-$Pr_{0.02}Sm_{0.02}Y_{0.92}Tm_{0.04}BCO$, and 9Gel-$Pr_{0.22}Y_{0.78}BCO+$ $Pr_{0.02}Sm_{0.02}Y_{0.92}Tm_{0.04}BCO$-C were immediately installed in a furnace filled with dry gas, the calcining was performed under a humidified pure oxygen atmosphere at 400° C. or lower with the profile illustrated in FIG. 6, and translucent brown calcining films 9Cal-$Pr_{0.22}Y_{0.78}BCO$ (Example 9, calcined film of resulting 22% Pr, 78% Y films), 9Cal-$Pr_{0.02}Sm_{0.02}Y_{0.92}Tm_{0.04}BCO$, and 9Cal-$Pr_{0.22}Y_{0.78}BCO$+$Pr_{0.02}Sm_{0.02}Y_{0.92}Tm_{0.04}BCO$-C were each obtained.

In the profile illustrated in FIG. 7, the calcining films 9Cal-$Pr_{0.22}Y_{0.78}BCO$, 9Cal-$Pr_{0.02}Sm_{0.02}Y_{0.92}Tm_{0.04}BCO$, and 9Cal-$Pr_{0.22}Y_{0.78}BCO$+$Pr_{0.02}Sm_{0.02}Y_{0.92}Tm_{0.04}BCO$-C were fired in 1000 ppm oxygen mixed argon gas at 800° C. and annealed in pure oxygen at 525° C. or lower, and the oxide thin films 9F-$Pr_{0.22}Y_{0.78}BCO$ (Example 9, fired oxide films of $Pr_{0.22}Y_{0.78}BCO$), 9F-$Pr_{0.02}Sm_{0.02}Y_{0.92}Tm_{0.04}BCO$, and 9F-$Pr_{0.22}Y_{0.78}BCO$ $Pr_{0.02}Sm_{0.02}Y_{0.92}Tm_{0.04}BCO$-C were each obtained.

As a result of measuring each of the oxide thin films 9F-$Pr_{0.22}Y_{0.78}BCO$, 9F-$Pr_{0.02}Sm_{0.02}Y_{0.92}Tm_{0.04}BCO$, and 9F-$Pr_{0.22}Y_{0.78}BCO$+$Pr_{0.02}Sm_{0.02}Y_{0.92}Tm_{0.04}BCO$-C by a $2\theta/\omega$ method of XRD measurement, only a YBCO (00n) peak was confirmed, and CuO, $Y_2O_3$, $BaCuO_2$, or the like, which is a heterogeneous phase, was at a level where the difference from the background could not be discriminated. YBCO (006) was the strongest peak, and the peak of the heterogeneous phase was $\frac{1}{1000}$ or less. There was no difference in the XRD phase identification results depending on the purity of the raw material Pr.

An oxide thin film 9F-$Pr_{0.22}Y_{0.78}BCO$+$Pr_{0.22}Sm_{0.02}Y_{0.92}Tm_{0.04}BCO$-C was measured by a $2\theta/\omega$ method of XRD measurement, around 2 points other than the center, positions moving from the center in the longitudinal direction on both sides to a 10 mm $Pr_{0.22}Y_{0.78}BCO$ side and a 10 mm $Pr_{0.02}Sm_{0.02}Y_{0.92}Tm_{0.04}BCO$ side. As a result, only the YBCO (00n) peak was confirmed, and CuO, $Y_2O_3$, $BaCuO_2$ or the like, which is a heterogeneous phase, was at a level where the difference from the background cannot be discriminated. YBCO (006) was the strongest peak, and the peak of the heterogeneous phase was $\frac{1}{1000}$ or less. There was no difference in the XRD phase identification results depending on the purity of the raw material Pr.

Superconducting characteristics of oxide thin films 9F-$Pr_{0.22}Y_{0.78}BCO$ and 9F-$Pr_{0.02}Sm_{0.02}Y_{0.92}Tm_{0.04}BCO$ were each measured by an inductive method in liquid nitrogen under a self-magnetic field. The obtained results were 0.00 MA/cm$^2$ (77 K, 0 T) and 6.24 MA/cm$^2$ (77 K, 0 T), respectively. From this, it was found that 9F-$Pr_{0.22}Y_{0.78}BCO$ is an oxide thin film with a non-superconducting perovskite structure, and 9F-$Pr_{0.02}Sm_{0.02}Y_{0.92}Tm_{0.04}BCO$ is a superconducting thin film with a perovskite structure.

The oxide thin film 9F-$Pr_{0.02}Sm_{0.02}Y_{0.92}Tm_{0.04}BCO$ is read as 4% Tm-CARP, which is a YBCO superconducting film in which CARP, which is a clustered atomically substituted artificial pin, is formed inside. This structure has high characteristics because the CARP captures a quantum magnetic flux in a magnetic field, but in a zero magnetic field, the characteristics tend to decrease by the amount of current that cannot be earned in the non-superconducting portion, and it seems that the result was a slightly low superconducting characteristic.

In an appearance of an oxide thin film 9F-$Pr_{0.22}Y_{0.78}BCO$+$Pr_{0.02}Sm_{0.02}Y_{0.92}Tm_{0.04}BCO$-C, the location where 22% Pr is present was a slightly whitish color, and the 4% Tm-CARP portion was a glossy black color. This is because as described in Example 2, the optimum oxygen partial pressure at firing of the location where 22% Pr is present is not 1000 ppm. If the optimum oxygen partial pressure is 1000 ppm for the YBCO and 1 ppm for the PrBCO, it will be 218 ppm if it is proportional on an anti-axis. Note that it is known that the TEA-MOD method forms a superconductor even if the oxygen partial pressure deviates to this extent. However, due to the deviation of the optimum force, the heterogeneous phases and the like may be formed on the surface and the surface may appear white.

On the other hand, the optimum oxygen partial pressure at firing of the oxide thin film $Pr_{0.02}Sm_{0.02}Y_{0.92}Tm_{0.04}BCO$ at 800° C. is considered to be almost 1,000 ppm. This is because the oxide thin film $Pr_{0.02}Sm_{0.02}Y_{0.92}Tm_{0.04}BCO$-C contains Tm that increases the optimum oxygen partial pressure at the same ratio as Pr and Sm that decrease the optimum oxygen partial pressure, and is offset to some extent. Therefore, it is considered that a black glossy structure that can be seen when the conditions are close to the optimum conditions under the firing condition of 800° C. and 1,000 ppm was obtained.

The XRD measurement results centered on the center of the oxide thin film 9F-$Pr_{0.22}Y_{0.78}BCO$+$Pr_{0.02}Sm_{0.02}Y_{0.92}Tm_{0.04}BCO$-C and the position moved to both sides by 10 mm are almost the same as the results of Example 2, and it seems to be the result of YBCO's replacement with $Pr_{0.02}Sm_{0.02}Y_{0.92}Tm_{0.04}BCO$. In particular, at the (006) peak where the intensity is unlikely to change between YBCO and ReBCO, the results were almost the same as in Example 2. Since the difference in the lattice constant is small, it seems that the common perovskite structure is formed.

Pr is an oxide thin film in which the Y site of 22% YBCO is substituted, but it seems that the common perovskite structure with the YBCO is not only formed, but the common perovskite structure is also formed even in the 4% Tm-CARP in which the Y site of the YBCO is substituted by a total of 8% of Pr, Sm, and Tm.

Although it is a 4% Tm-CARP portion, it is highly possible that it is a structure that can form the Tm-CARP and improve the magnetic field characteristics. Although no measurements were made in this experiment, the film thickness of the superconductor formed is only 150 nm. Even during the calcining, the film thickness is only about 5 times that of 750 nm, and even if a quasi-liquid phase is formed during the firing, the thickness or depth of the liquid phase is expected to be about 300 nm. Even if the density is the same as that of the calcining film, it is only 750 nm.

The TEA-MOD method performs the growth only from lattice-matched sites, so the firing temperature during the firing is relatively low, and the fluidity of the quasi-liquid phase is low. In addition, there are many metallic elements along with fluorine and oxygen in the substance, and the Coulomb force acts strongly due to the difference in electronegativity, making it difficult for the elements to move. Therefore, the horizontal movement distance or the diffusion distance at the interface of substances with different compositions is limited, and it seems that even 1 μm cannot move.

If 4% Tm-CARP is formed with a width of 100 μm, even if 22% Pr-YBCO diffuses to 1 μm at both end portions, the width of 98 μm remains. The remaining 98 μm width portion is 4% Tm-CARP, and the CARP is formed by performing the firing under the conditions of 800° C. and 1000 ppm. This is because the firing condition matches the condition of the substance that does not contain 22% Pr.

As a result, it is estimated from various experimental results that the structure obtained by dividing 4% Tm-CARP with the non-superconducting material having the common perovskite structure was obtained.

Example 10

According to the flowchart illustrated in FIG. 3, three types of coating solutions are synthesized and purified. Powders of each hydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

$Pr(OCOCH_3)_3$, $Y(OCOCH_3)_3$, $Ba(OCOCH_3)_2$, and $Cu(OCOCH_3)_2$ were dissolved in ion-exchanged water at a metal ion molar ratio of 0.10:0.90:2:3, 0.15:0.85:2:3, and 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 10Mi-$Pr_{0.10}Y_{0.90}BCO$ (substance described in Example 10, 10% Pr, 90% Y Material with impurity), 10Mi-$Pr_{0.15}Y_{0.85}BCO$, and 10Mi-$Pr_{0.22}Y_{0.78}BCO$ were obtained.

About 7 wt. % of water or acetic acid which is reaction by-products during solution synthesis was contained in the obtained translucent blue substances 10Mi-$Pr_{0.10}Y_{0.90}BCO$, 10Mi-$Pr_{0.15}Y_{0.85}BCO$, and 10Mi-$Pr_{0.22}Y_{0.78}BCO$. 20 times by weight of anhydrous methanol was added to translucent blue substances 10Mi-$Pr_{0.10}Y_{0.90}BCO$, 10Mi-$Pr_{0.15}Y_{0.85}BCO$, and 10Mi-$Pr_{0.22}Y_{0.78}BCO$ and dissolved, and the coating solutions 10CSi-$Pr_{0.10}Y_{0.90}BCO$ (coating solution described in Example 10, 10% Pr, 90% Y Material with impurity), 10CSi-$Pr_{0.15}Y_{0.85}BCO$, and 10CSi-$Pr_{0.22}Y_{0.78}BCO$ were each obtained.

When the obtained coating solutions 10CSi-$Pr_{0.10}Y_{0.90}BCO$, 10CSi-$Pr_{0.15}Y_{0.85}BCO$, and 10CSi-$Pr_{0.22}Y_{0.78}BCO$ were reacted and purified again under reduced pressure in a rotary evaporator for 12 hours, translucent blue substances 10M-$Pr_{0.10}Y_{0.90}BCO$ (substance described in Example 10, 10% Pr, 90% Y Material without impurity), 10M-$Pr_{0.15}Y_{0.85}BCO$ and 10M-$Pr_{0.22}Y_{0.78}BCO$ were each obtained.

Translucent blue substances 10M-$Pr_{0.10}Y_{0.90}BCO$, 10M-$Pr_{0.15}Y_{0.85}BCO$, and 10M-$Pr_{0.22}Y_{0.78}BCO$ were dissolved in methanol (j in FIG. 3) and diluted using a volumetric flask, and each of the coating solutions 10CS-$Pr_{0.10}Y_{0.90}BCO$ (Example 10, coating Solution for 10% Pr, 90% Y perovskite structure), 10CS-$Pr_{0.15}Y_{0.85}BCO$, and 1CS-$Pr_{0.22}Y_{0.78}BCO$ of 1.50 mol/l in terms of metal ions were obtained.

The coating solutions 10CS-$Pr_{0.10}Y_{0.90}BCO$, 10CS-$Pr_{0.15}Y_{0.85}BCO$, and 10CS-$Pr_{0.22}Y_{0.78}BCO$ were used, two films were formed on $LaAlO_3$ (100) oriented single crystal of a 10 mm×10 mm×0.50 mmt with an acceleration of 10000 rpm/s, a maximum rotation speed of 4000 rpm, and a holding time of 60 s using a spin coating method, and translucent blue gel films 10Gel-$Pr_{0.10}Y_{0.90}BCO$ (Example 10, gel film of resulting 10% Pr, 90% Y films), 10Gel-$Pr_{0.15}Y_{0.85}BCO$, and 1Gel-$Pr_{0.22}Y_{0.78}BCO$ were each obtained. This gel film is a film formation condition in which the film thickness becomes 150 nm after firing.

The coating solutions 10CS-$Pr_{0.10}Y_{0.90}BCO$ and 10CS-$Pr_{0.22}Y_{0.78}BCO$ were used, the solution dropped onto half of a $LaAlO_3$ (100) oriented single crystal substrate of 10 mm×30 mm×0.50 mmt, and a translucent blue gel film 10Gel-$Pr_{0.10}Y_{0.90}BCO$+$Pr_{0.22}Y_{0.78}BCO$-C (Example 10, gel film of resulting 10% Pr, 90% Y and 22% Pr, 78% Y films, chimera) was obtained by film formation conditions of an acceleration of 10000 rpm/s, a maximum rotation speed of 4000 rpm, and a holding time of 60 s by a spin coating method when each solution reaches the center.

Similarly, the coating solutions 10CS-$Pr_{0.15}Y_{0.85}BCO$ and 10CS-$Pr_{0.22}Y_{0.78}BCO$ were used, the solution dropped onto half of a $LaAlO_3$ (100) oriented single crystal substrate of 10 mm×30 mm×0.50 mmt, and a translucent blue gel film 10Gel-$Pr_{0.15}Y_{0.85}BCO$+$Pr_{0.22}Y_{0.78}BCO$-C was obtained by film formation conditions of an acceleration of 10000 rpm/s, a maximum rotation speed of 4000 rpm, and a holding time of 60 s by a spin coating method when each solution reaches the center.

The boundary at the center of the spin coated translucent blue gel films 10Gel-$Pr_{0.10}Y_{0.90}BCO$+$Pr_{0.22}Y_{0.78}BCO$-C and 10Gel-$Pr_{0.15}Y_{0.85}BCO$+$Pr_{0.22}Y_{0.78}BCO$-C cannot be visually discriminated.

The obtained gel films 10Gel-$Pr_{0.10}Y_{0.90}BCO$+$Pr_{0.22}Y_{0.78}BCO$-C and 10Gel-$Pr_{0.15}Y_{0.85}BCO$+$Pr_{0.22}Y_{0.78}BCO$-C were immediately installed in a furnace filled with dry gas, the calcining was performed under a humidified pure oxygen atmosphere at 400° C. or lower with the profile illustrated in FIG. 6, and translucent brown calcining films 10Cal-$Pr_{0.10}Y_{0.90}BCO$+$Pr_{0.22}Y_{0.78}BCO$-C (Example 10, calcined film of resulting 10% Pr, 90% Y and 22% Pr, 78% Y films, Chimera), and 10Cal-$Pr_{0.15}Y_{0.85}BCO$+$Pr_{0.22}Y_{0.78}BCO$-C were each obtained.

In the profile illustrated in FIG. 7, the calcining films 10Cal-$Pr_{0.10}Y_{0.90}BCO$+$Pr_{0.22}Y_{0.78}BCO$-C and 10Cal-$Pr_{0.15}Y_{0.85}BCO$+$Pr_{0.22}Y_{0.78}BCO$-C were fired in 1000 ppm oxygen mixed argon gas at 800° C. and annealed in pure oxygen at 525° C. or lower, and the oxide thin films 10F-$Pr_{0.10}Y_{0.90}BCO$+$Pr_{0.22}Y_{0.78}BCO$-C (Example 10, fired oxide of 10% Pr, 90% Y and 22% Pr, 78% Y films, Chimera) and 10F-$Pr_{0.15}Y_{0.85}BCO$+$Pr_{0.22}Y_{0.78}BCO$-C were each obtained.

As a result of measuring the region centered on the center of the oxide thin film 10F-$Pr_{0.10}Y_{0.90}BCO$+$Pr_{0.22}Y_{0.78}BCO$-C, 10% Pr part, and 22% Pr part by a 2θ/ω method of XRD measurement, 10XRD-$Pr_{0.10}Y_{0.90}BCO$+$Pr_{0.22}Y_{0.78}BCO$-C-Center, 10XRD-$Pr_{0.10}Y_{0.90}BCO$+$Pr_{0.22}Y_{0.78}BCO$-C-10% Pr, and 10XRD-$Pr_{0.10}Y_{0.90}BCO$+$Pr_{0.22}Y_{0.78}BCO$-C-22% Pr were each obtained.

In addition, as a result of measuring the region centered on the center of the oxide thin film 10F-$Pr_{0.15}Y_{0.85}BCO$+$Pr_{0.22}Y_{0.78}BCO$-C, 15% Pr part, and 22% Pr part by a 2θ/ω method of XRD measurement, 10XRD-$Pr_{0.15}Y_{0.85}BCO$+$Pr_{0.22}Y_{0.78}BCO$-C-Center, 10XRD-$Pr_{0.15}Y_{0.85}BCO$+$Pr_{0.22}Y_{0.78}BCO$-C-10% Pr, and 10XRD-$Pr_{0.15}Y_{0.85}BCO$+$Pr_{0.22}Y_{0.78}BCO$-C-22% Pr were each obtained.

As a result of the XRD measurement, in 10XRD-$Pr_{0.10}Y_{0.90}BCO$+$Pr_{0.22}Y_{0.78}BCO$-C-Center, 10XRD-$Pr_{0.10}Y_{0.90}BCO$+$Pr_{0.22}Y_{0.78}BCO$-C-10% Pr, 10XRD-$Pr_{0.10}Y_{0.90}BCO$+$Pr_{0.22}Y_{0.78}BCO$-C-22% Pr, 10XRD-$Pr_{0.15}Y_{0.85}BCO$+$Pr_{0.22}Y_{0.78}BCO$-C-Center, 10XRD-$Pr_{0.15}Y_{0.85}BCO$+$Pr_{0.22}Y_{0.78}BCO$-C-10% Pr, and 10XRD-$Pr_{0.15}Y_{0.85}BCO$+$Pr_{0.22}Y_{0.78}BCO$-C-22% Pr, only YBCO (00n) peak was confirmed, and CuO, $Y_2O_3$, $BaCuO_2$ or the like, which is a heterogeneous phase, was at a level where the difference from the background could not be discriminated. YBCO (006) was the strongest peak, and the peak of the heterogeneous phase was 1/1000 or less. There was no difference in the XRD phase identification results depending on the purity of the raw material Pr.

Superconducting characteristics of oxide thin films 10F-$Pr_{0.10}Y_{0.90}BCO$+$Pr_{0.22}Y_{0.78}BCO$-C and 10F-

$Pr_{0.15}Y_{0.85}BCO+Pr_{0.22}Y_{0.78}BCO-C$ were each measured by an inductive method in liquid nitrogen under a self-magnetic field.

The highest characteristics of $10F-Pr_{0.10}Y_{0.90}BCO+Pr_{0.22}Y_{0.78}BCO-C$ in 10% Pr part and 22% Pr part each were 3.32 MA/cm$^2$ (77 K, 0 T) and 0.00 MA/cm$^2$ (77 K, 0 T). The highest characteristics of $10F-Pr_{0.15}Y_{0.85}BCO+Pr_{0.22}Y_{0.78}BCO-C$ in 15% Pr part and 22% Pr part each were 1.41 MA/cm$^2$ (77 K, 0 T) and 0.00 MA/cm$^2$ (77 K, 0 T).

The measurement results of the superconducting characteristics that were close to the 5 times degradation phenomenon in which the characteristics 5 times the amount of Pr deteriorated was obtained. In addition, the 22% Pr part had the superconducting characteristics which were zero, and it was found that the structure has the superconducting characteristics which were zero while the perovskite structure is formed in addition, the YBCO (006) peak in the XRD measurement results was observed near 2θ=46.68 degrees, which is almost the same angle, and it was found that the common perovskite structure is formed because the c-axis lengths are almost the same.

From these results, it was found that as the perovskite structure shared by the YBCO with 22% Pr substitution, the perovskite structure common to the YBCO superconductor with 10% Pr or 15% Pr substitution is formed.

While certain embodiments have been described, these embodiments have been presented by way of example only, and are not intended to limit the scope of the inventions indeed, an oxide superconductor and a manufacturing method thereof described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An oxide superconductor, comprising:
an oxide superconducting layer including
at least one superconducting region containing barium (Ba), copper (Cu), and at least one first rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), the at least one superconducting region having a continuous perovskite structure, and the at least one superconducting region having a size of 100 nm×100 nm×100 nm or more, and
a non-superconducting region in contact with the at least one superconducting region, the non-superconducting region containing praseodymium (Pr), barium (Ba), copper (Cu), and at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), a ratio of a number of atoms of the praseodymium (Pr) to a sum of a number of atoms of the at least one second rare earth element and the number of atoms of the praseodymium (Pr) in the non-superconducting region being equal to or more than 20%, the non-superconducting region having a continuous perovskite structure continuous with the continuous perovskite structure of the at least one superconducting region, and the non-superconducting region having a size of 100 nm×100 nm×100 nm or more.

2. The oxide superconductor according to claim 1, wherein the at least one superconducting region includes a first superconducting region and a second superconducting region, and the non-superconducting region is disposed between the first superconducting region and the second superconducting region.

3. The oxide superconductor according to claim 1, further comprising:
a substrate,
wherein the oxide superconducting layer is disposed on the substrate, and
an area of the oxide superconducting layer facing the substrate is equal to or more than 90% of a surface area of the substrate.

4. The oxide superconductor according to claim 1, further comprising:
a substrate; and
an intermediate layer disposed between the substrate and the oxide superconducting layer,
wherein the non-superconducting region is lattice-matched with the intermediate layer.

5. The oxide superconductor according to claim 1, wherein the oxide superconducting layer contains fluorine (F) of equal to or more than $2.0 \times 10^{15}$ atoms/cm$^3$ and equal to or less than $5.0 \times 10^{19}$ atoms/cm$^3$, and carbon (C) of equal to or more than $1.0 \times 10^{17}$ atoms/cm$^3$ and equal to or less than $5.0 \times 10^{20}$ atoms/cm$^3$.

6. The oxide superconductor according to claim 1, wherein the at least one first rare earth element and the at least one second rare earth element are the same.

7. The oxide superconductor according to claim 1, wherein the superconducting region contains praseodymium (Pr), and a ratio of a number of atoms of the praseodymium (Pr) to a sum of a number of atoms of the at least one first rare earth element and the number of atoms of the praseodymium (Pr) is equal to or less than 15%.

8. The oxide superconductor according to claim 1, wherein the at least one first rare earth element is two kinds or more.

9. The oxide superconductor according to claim 1, wherein the superconducting region further includes a clustered atomically substituted artificial pin.

* * * * *